(12) United States Patent
Sato et al.

(10) Patent No.: US 12,185,013 B2
(45) Date of Patent: Dec. 31, 2024

(54) IMAGING ELEMENT, STACKED-TYPE IMAGING ELEMENT, AND SOLID-STATE IMAGING APPARATUS

(71) Applicant: SONY SEMICONDUCTOR SOLUTIONS CORPORATION, Kanagawa (JP)

(72) Inventors: Yusuke Sato, Kanagawa (JP); Fumihiko Koga, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 18/357,060

(22) Filed: Jul. 21, 2023

(65) Prior Publication Data

US 2023/0388681 A1 Nov. 30, 2023

Related U.S. Application Data

(60) Division of application No. 17/900,222, filed on Aug. 31, 2022, now Pat. No. 11,750,952, which is a
(Continued)

(30) Foreign Application Priority Data

Aug. 25, 2017 (JP) ................. 2017-162541

(51) Int. Cl.
*H04N 25/79* (2023.01)
*H01L 27/146* (2006.01)
*H04N 23/10* (2023.01)

(52) U.S. Cl.
CPC ....... *H04N 25/79* (2023.01); *H01L 27/14612* (2013.01); *H01L 27/14627* (2013.01);
(Continued)

(58) Field of Classification Search
CPC ........ H04N 25/79; H04N 23/10; H04N 25/77; H01L 27/14612; H01L 27/14627;
(Continued)

(56) References Cited

U.S. PATENT DOCUMENTS 11,490,044 B2  11/2022  Sato et al.
2016/0037098 A1  2/2016  Lee et al.
(Continued)

FOREIGN PATENT DOCUMENTS

CN  106847844 A  6/2017
CN  107146850 A  9/2017
(Continued)

OTHER PUBLICATIONS

International Search Report and Written Opinion of PCT Application No. PCT/JP2018/020743, issued on Aug. 14, 2018, 09 pages of English Translation and 09 pages of ISRWO.
(Continued)

*Primary Examiner* — Albert H Cutler
(74) *Attorney, Agent, or Firm* — CHIP LAW GROUP

(57) ABSTRACT

There is provided an imaging element includes a photoelectric conversion unit that includes a first electrode, a photoelectric conversion layer, and a second electrode, in which the photoelectric conversion unit further includes a charge storage electrode that has an opposite region opposite to the first electrode via an insulating layer, and a transfer control electrode that is opposite to the first electrode and the charge storage electrode via the insulating layer, and the photoelectric conversion layer is disposed above at least the charge storage electrode via the insulating layer.

11 Claims, 66 Drawing Sheets

Related U.S. Application Data continuation of application No. 16/639,269, filed as application No. PCT/JP2018/020743 on May 30, 2018, now Pat. No. 11,490,044.

(52) U.S. Cl.
CPC .. H01L 27/14636 (2013.01); H01L 27/14643 (2013.01); H01L 27/14665 (2013.01); H04N 23/10 (2023.01)

(58) Field of Classification Search
CPC ......... H01L 27/14636; H01L 27/14643; H01L 27/14665; H01L 27/14603; H01L 27/14641; H01L 27/14647; H01L 27/14667; Y02E 10/549
See application file for complete search history.

(56) References Cited

U.S. PATENT DOCUMENTS

| | | | |
|---|---|---|---|
| 2016/0119562 A1 | 4/2016 | Takase et al. | |
| 2016/0133865 A1 | 5/2016 | Yamaguchi | |
| 2016/0360134 A1* | 12/2016 | Miyake | H01L 27/14636 |
| 2017/0162616 A1* | 6/2017 | Tashiro | H01L 27/14636 |
| 2017/0162617 A1 | 6/2017 | Takahashi et al. | |
| 2017/0257587 A1 | 9/2017 | Hatano et al. | |
| 2018/0076252 A1 | 3/2018 | Togashi et al. | |
| 2019/0051681 A1* | 2/2019 | Kallioinen | G01J 1/44 |

FOREIGN PATENT DOCUMENTS

| | | |
|---|---|---|
| CN | 206992154 U | 2/2018 |
| DE | 102016122658 A1 | 6/2017 |
| GB | 2545101 A | 6/2017 |
| JP | 2011-138927 A | 7/2011 |
| JP | 2016-058559 A | 4/2016 |
| JP | 2017-055085 A | 3/2017 |
| JP | 2017-108101 A | 6/2017 |
| JP | 2017-157816 A | 9/2017 |
| JP | 2018-060910 A | 4/2018 |
| KR | 10-2016-0017168 A | 2/2016 |
| TW | 201801297 A | 1/2018 |
| WO | 2016/039152 A1 | 3/2016 |
| WO | 2017/150540 A1 | 9/2017 |
| WO | 2018/066256 A1 | 4/2018 |

OTHER PUBLICATIONS

International Preliminary Report on Patentability of PCT Application No. PCT/JP2018/020743, issued on Mar. 5, 2020, 09 pages of English Translation and 06 pages of IPRP.
Non-Final Office Action for U.S. Appl. No. 16/639,269, issued on Dec. 9, 2021, 14 pages.
Final Office Action for U.S. Appl. No. 16/639,269, issued on Apr. 13, 2022, 15 pages.
Notice of Allowance for U.S. Appl. No. 16/639,269, issued on Jun. 17, 2022, 07 pages.
Notice of Allowance for U.S. Appl. No. 17/900,222, issued on Apr. 19, 2023, 07 pages.
Non-Final Office Action for U.S. Appl. No. 17/900,222, issued on Jan. 18, 2023, 20 pages.

* cited by examiner

CHARGE STORAGE ELECTRODE SIDE

IMAGING ELEMENT, STACKED-TYPE IMAGING ELEMENT, AND SOLID-STATE IMAGING APPARATUS

CROSS REFERENCE TO RELATED APPLICATIONS

The present application is a divisional application of U.S. patent application Ser. No. 17/900,222, filed Aug. 31, 2022, which is a continuation application of U.S. patent application Ser. No. 16/639,269 filed on Feb. 14, 2020, now U.S. Pat. No. 11,490,044, which is a U.S. National Phase of International Patent Application No. PCT/JP2018/020743 filed on May 30, 2018, and which claims priority benefit of Japanese Patent Application No. JP 2017-162541 filed in the Japan Patent Office on Aug. 25, 2017. Each of the above-referenced applications is hereby incorporated herein by reference in its entirety.

TECHNICAL FIELD

The present disclosure relates to an imaging element, a stacked-type imaging element, and a solid-state imaging apparatus.

BACKGROUND ART

An imaging element using an organic semiconductor material for a photoelectric conversion layer can photoelectrically convert a specific color (wavelength band). Further, due to having this characteristic, in a case where it is used as an imaging element in a solid-state imaging apparatus, a structure of stacking subpixels (stacked-type imaging element) in which subpixels include a combination of an on-chip color filter (OCCF) layer and an imaging element, and are two-dimensionally arranged, which is not possible in a conventional solid-state imaging apparatus, can be obtained (e.g., see Japanese Patent Application Laid-Open No. 2011-138927). Furthermore, since a demosaicing process is not necessary, there is an advantage in that false colors do not occur. In the following description, an imaging element including a photoelectric conversion unit provided on or above a semiconductor substrate will be referred to as a "first-type imaging element" for the sake of convenience, a photoelectric conversion unit forming the first-type imaging element will be referred to as a "first-type photoelectric conversion unit" for the sake of convenience, an imaging element provided in the semiconductor substrate will be referred to as a "second-type imaging element" for the sake of convenience, and the photoelectric conversion unit forming the second-type imaging element will be referred to as a "second-type photoelectric conversion unit" for the sake of convenience.

FIG. 66 shows a configuration example of a conventional stacked-type imaging element (stacked-type solid-state imaging apparatus). In the example shown in FIG. 66, in a semiconductor substrate 370, a third imaging element 343 which is a second-type imaging element, a third photoelectric conversion unit 343A which is a second-type photoelectric conversion unit forming a second imaging element 341, and a second photoelectric conversion unit 341A are stacked and formed. Furthermore, a first photoelectric conversion unit 310A which is a first-type photoelectric conversion unit is disposed above the semiconductor substrate 370 (specifically, above the second imaging element 341). Here, the first photoelectric conversion unit 310A includes a first electrode 321, a photoelectric conversion layer 323 including an organic material, and a second electrode 322, and forms a first imaging element 310 which is a first-type imaging element. For example, blue and red light are photoelectrically converted respectively in the second photoelectric conversion unit 341A and the third photoelectric conversion unit 343A due to a difference in absorption coefficient. Furthermore, for example, green light is photoelectrically converted in the first photoelectric conversion unit 310A.

Charges generated by photoelectric conversion in the second photoelectric conversion unit 341A and the third photoelectric conversion unit 343A are temporarily stored in the second photoelectric conversion unit 341A and the third photoelectric conversion unit 343A, and then are transferred to a second floating diffusion layer $FD_2$ and a third floating diffusion layer $FD_3$ by a vertical transistor (gate section 345 is shown) and a transfer transistor (gate section 346 is shown), respectively, and further output to an external readout circuit (not shown). These transistors and floating diffusion layers $FD_2$ and $FD_3$ are also formed in the semiconductor substrate 370.

Charges generated by photoelectric conversion in the first photoelectric conversion unit 310A are stored in the first floating diffusion layer $FD_1$ formed in the semiconductor substrate 370 via a contact hole portion 361 and a wiring layer 362. Furthermore, the first photoelectric conversion unit 310A is also connected to a gate section 352 of an amplification transistor that converts the charge amount into a voltage via the contact hole portion 361 and the wiring layer 362. Further, the first floating diffusion layer $FD_1$ forms a part of a reset transistor (gate section 351 is shown). Reference number 371 is an element separation region, reference number 372 is an oxide film formed on a surface of the semiconductor substrate 370, reference numbers 376 and 381 are interlayer insulating layers, reference number 383 is an insulating layer, and reference number 314 is an on-chip microlens.

CITATION LIST

Patent Document

Patent Document 1: Japanese Patent Application Laid-Open No. 2011-138927

SUMMARY OF THE INVENTION

Problems to be Solved by the Invention

Charges generated by the photoelectric conversion in the second photoelectric conversion unit 341A and the third photoelectric conversion unit 343A are temporarily stored in the second photoelectric conversion unit 341A and the third photoelectric conversion unit 343A, and then transferred to the second floating diffusion layer $FD_2$ and the third floating diffusion layer $FD_3$. Therefore, the second photoelectric conversion unit 341A and the third photoelectric conversion unit 343A can be completely depleted. However, charges generated by photoelectric conversion in the first photoelectric conversion unit 310A are directly stored in the first floating diffusion layer $FD_1$. Thus, it is difficult for the first photoelectric conversion unit 310A to be completely depleted. Further, as a result of the above, there is a possibility that kTC noise increases, random noise worsens, and the image quality of the captured image deteriorates.

Accordingly, an object of the present disclosure is to provide an imaging element in which a photoelectric conversion unit is disposed on or above a semiconductor substrate and has a configuration and a structure that can suppress degradation of image quality, a stacked-type imaging element including the imaging element, and a solid-state imaging apparatus having the imaging element or the stacked-type imaging element.

Solutions to Problems

In order to achieve the above issues, the present disclosure provides an imaging element including:
a photoelectric conversion unit formed by stacking a first electrode, a photoelectric conversion layer, and a second electrode,
in which the photoelectric conversion unit further includes
a charge storage electrode that has an opposite region opposite to the first electrode via an insulating layer, and
a transfer control electrode (a charge transfer electrode) that is opposite to the first electrode and the charge storage electrode via the insulating layer, and
the photoelectric conversion layer is disposed above at least the charge storage electrode via the insulating layer.

In order to achieve the above issues, the present disclosure provides a stacked-type imaging element including: at least one imaging element according to the present disclosure described above.

To attain the foregoing object, a solid-state imaging apparatus according to a first aspect of the present disclosure includes a plurality of imaging elements according to the present disclosure and a plurality of stacked-type imaging elements including at least one imaging element according to the present disclosure.

To attain the foregoing object, a solid-state imaging apparatus according to a second aspect of the present disclosure includes a plurality of imaging element blocks formed by a plurality of imaging elements according to the present disclosure. A first electrode is shared by a plurality of the imaging elements forming the imaging element block. Alternatively, the solid-state imaging apparatus includes a plurality of imaging element blocks formed by a plurality of stacked-type imaging elements. Each stacked-type imaging element includes at least one imaging element according to the present disclosure and the first electrode is shared by the plurality of imaging elements forming the imaging element block.

Effects of the Invention

In the imaging element according to the present disclosure, the imaging element according to the present disclosure included in the stacked-type imaging element according to the present disclosure, and the imaging element according to the present disclosure included in the solid-state imaging apparatus according to the first and second aspects of the present disclosure (hereinafter the imaging element is generally referred to as an "imaging element or the like according to the present disclosure" in some cases), a charge storage electrode is included. Therefore, when light is emitted to the photoelectric conversion unit and is photoelectrically converted in the photoelectric conversion unit, charges can be stored in the photoelectric conversion layer. Therefore, at the start of exposure, it becomes possible to completely deplete the charge storage portion and remove charges. As a result, it is possible to suppress occurrence of a phenomenon in which kTC noise increases, random noise worsens, and degradation of the image quality is caused. In addition, the transfer control electrode disposed adjacent to the charge storage electrode and the first electrode through the insulating layer and disposed opposite to the photoelectric conversion layer through an insulating layer is further included. Therefore, when charges stored in the photoelectric conversion layer are transferred to the first electrode, high controllability can be attained. Since an area of the charge storage electrode does not decrease due to the disposition of the transfer control electrode, it is possible to suppress occurrence of a problem of an amount of saturated charges in the photoelectric conversion layer decreasing or sensitivity degrading. Further, the effects described in this specification are not limiting but are merely examples, and additional effects may be provided.

MODE FOR CARRYING OUT THE INVENTION

Figure 1:
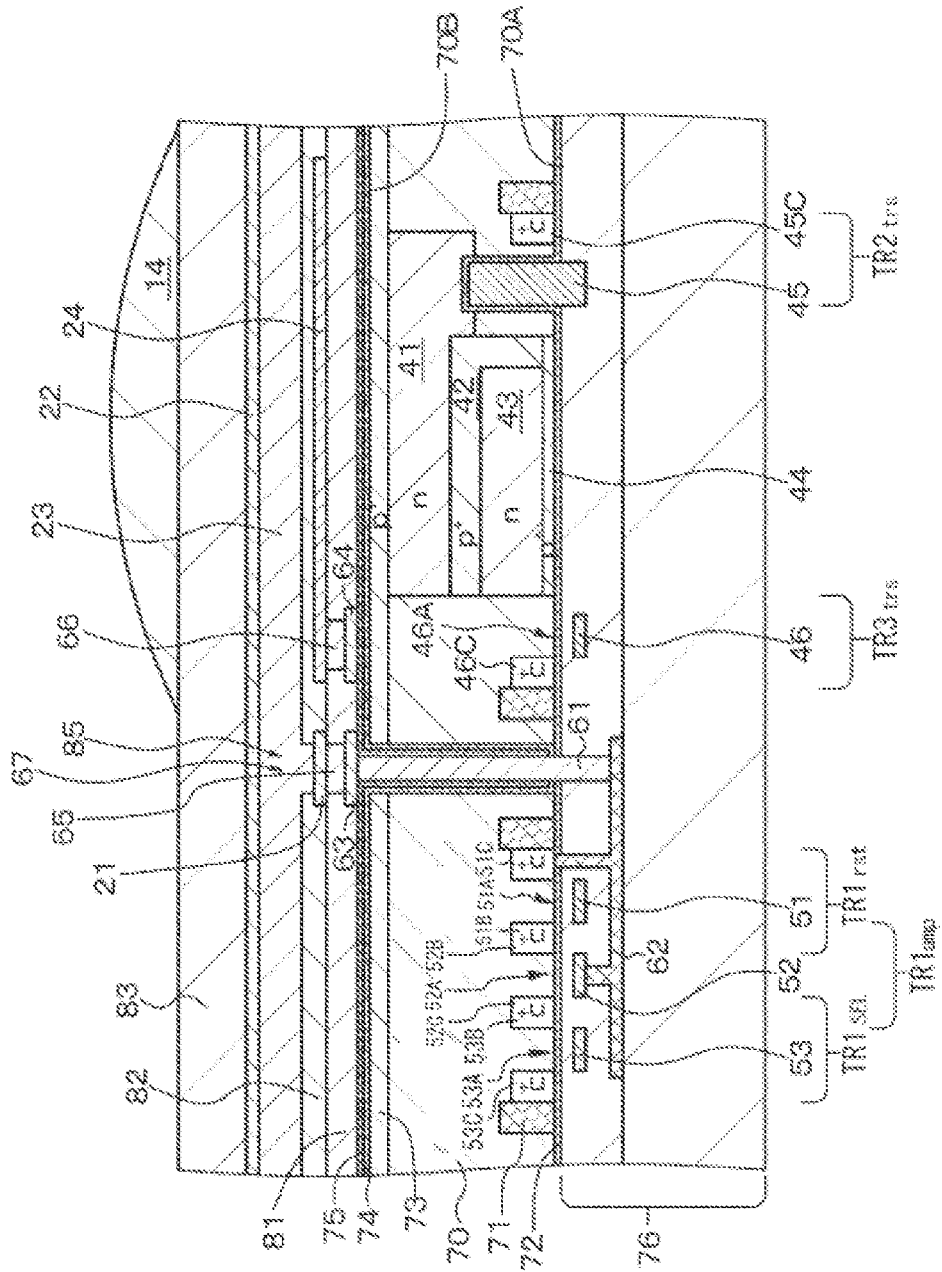
FIG. 1 is a schematic partial sectional view of an imaging element and a stacked-type imaging element of Embodiment 1 along the arrow A-A of FIG. 3 of FIG. 3.

Hereinafter, the present disclosure will be described on the basis of embodiments with reference to the drawings, but the present disclosure is not limited to the embodiments, and various numerical values and materials in the embodiments are illustrative only. Further, the description will be given in the following order.
1. Overall description of imaging element according to the present disclosure, stacked-type imaging element according to the present disclosure, and solid-state imaging apparatuses according to the first and second aspects of the present disclosure.
2. Embodiment 1 (imaging element according to the present disclosure, stacked-type imaging element according to the present disclosure, and solid-state imaging apparatus according to the first aspect of the present disclosure)
3. Embodiment 2 (modification of Embodiments 1)
4. Embodiment 3 (another modification of Embodiment 1)
5. Embodiment 4 (solid-state imaging apparatus according to second aspect of the present disclosure)
6. Embodiment 5 (modification of Embodiment 4)
7. Embodiment 6 (modifications of Embodiments 1 to 4)
8. Embodiment 7 (modifications of Embodiments 1 to 6)
9. Embodiment 8 (modifications of Embodiments 1 to 7, imaging element including charge discharge electrode)
10. Embodiment 9 (modifications of Embodiments 1 to 8, imaging element including plurality of charge storage electrode segments)
11. Embodiment 10 (imaging elements of first and sixth configurations)
12. Embodiment 11 (imaging elements of second and sixth configurations of the present disclosure)
13. Embodiment 12 (imaging element of third configuration)
14. Embodiment 13 (imaging element of fourth configuration)
15. Embodiment 14 (imaging element of fifth configuration)
16. Embodiment 15 (imaging element of sixth configuration)
17. Others <Imaging Element of the Present Disclosure, Stacked-Type Imaging Element of the Present Disclosure, and Solid-State Imaging Apparatus According to First and Second Aspects of the Present Disclosure>

In a solid-state imaging apparatus according to a second aspect of the present disclosure, a plurality of imaging elements is arranged in a 2-dimensional matrix form and an imaging element block can be formed by 2×2 imaging elements. Alternatively, the plurality of imaging elements is arranged in a 2-dimensional matrix form and the imaging element block can be formed by two imaging elements adjacent in a diagonal direction. Alternatively, the plurality of imaging elements is arranged in a 2-dimensional matrix form and the imaging element block can be formed by two imaging elements adjacent in an imaging horizontal direction. Moreover, in the solid-state imaging apparatus according to the second aspect of the present disclosure including such a preferred embodiment or the solid-state imaging apparatus according to the first aspect of the present disclosure, a transfer control electrode surrounds a charge storage electrode in a frame form in each imaging element, and the transfer control electrode can be shared by the adjacent imaging elements.

In addition, in the imaging element or the like of the present disclosure, a photoelectric conversion layer can be disposed above at least the charge storage electrode and the transfer control electrode via an insulating layer.

Further, in the imaging element or the like of the present disclosure including the preferred embodiment, a planar shape of the charge storage electrode is a rectangle that has four corners including a first corner, a second corner, a third corner, and a fourth corner. The first corner can be configured to correspond to an opposite region. In this case, the first corner can be configured to have roundness. Alternatively, the first corner can be configured to be chamfered (the first corner is notched). Further, the second corner, the third corner, and the fourth corner can be configured to similarly have roundness. Alternatively, these corners can be configured to be chamfered (these corners are configured to be notched and the chamfered portions include the configuration of the round portions). Further, in this case, the transfer control electrode includes two transfer control electrode segments, and two sides of the charge storage electrodes and the two transfer control electrode segments located on both sides of the opposite region can be disposed adjacent to each other through an insulating layer. Moreover, when two sides of the charge storage electrodes located on both sides of the opposite region are set as a first side and a second side, a length of the first side is $L_1$, and a length of a second side is $L_2$, a distance $LL_1$ between the first electrode and an end of the transfer control electrode segment along the first side can be in the range of $0.02 \times L_1$ to $0.5 \times L_1$ and a distance $LL_2$ between the first electrode and an end of the transfer control electrode segment along the second side can be in the range of $0.02 \times L_2$ to $0.5 \times L_2$.

Alternatively, in the imaging element or the like of the present disclosure including the foregoing preferred embodiment, the transfer control electrode can be configured to surround the charge storage electrode in a frame form. Note that also in this case, when the two sides of the charge storage electrodes located on both sides of the opposite region are set as a first side and a second side, a length of the first side is $L_1$, and a length of the second side is $L_2$, a distance $LL_1'$ between the first electrode and an end of a portion of the transfer control electrode along the first side can be in the range of $0.02 \times L_1$ to $0.5 \times L_1$ and a distance $LL_2'$ between the first electrode and an end of a portion of the transfer control electrode along the second side can be in the range of $0.02 \times L_2$ to $0.5 \times L_2$.

Alternatively, in the imaging element or the like of the present disclosure including the foregoing preferred embodiment, a planar shape of the charge storage electrode can be a rectangle,
the opposite region can be located to border along one side of the charge storage electrode,
the transfer control electrode can be formed by two transfer control electrode segments,
a first transfer control electrode segment can be adjacent to the opposite region and be opposite to the first electrode and a first region of the charge storage electrode bordering along one side of the charge storage electrode via the insulating layer, and
a second transfer control electrode segment can be adjacent to the opposite region and be opposite to the first electrode and a second region of the charge storage electrode bordering along one side of the charge storage electrode via the insulating layer.

Moreover, in the imaging element or the like of the present disclosure including the various preferred embodiments and configurations described above, a control unit provided on a semiconductor substrate and including a drive circuit is further included,
the first electrode, the charge storage electrode, and the transfer control electrode are connected to the drive circuit, during a charge storage period, a potential $V_{11}$ is applied from the drive circuit to the first electrode, a potential $V_{12}$ is applied from the drive circuit to the charge storage electrode,
a potential $V_{13}$ is applied from the drive circuit to the transfer control electrode, and a charge is stored in the photoelectric conversion layer, and
during a charge transfer period, a potential $V_{21}$ is applied from the drive circuit to the first electrode, a potential $V_{22}$ is applied from the drive circuit to the charge storage electrode, a potential $V_{23}$ or the potential $V_{13}$ is applied from the drive circuit to the transfer control electrode, and the charge stored in the photoelectric conversion layer is read to the control unit via the first electrode. Here, in a case where a potential of the first electrode is higher than a potential of the second electrode, $V_{12} > V_{13}$ and $V_{22} \leq V_{23} \leq V_{21}$ (preferably $V_{22} < V_{23} < V_{21}$), or $V_{12} > V_{13}$ and $V_{22} \leq V_{13} \leq V_{21}$ (preferably $V_{22} < V_{13} < V_{21}$), and in a case where the potential of the first electrode is lower than the potential of the second electrode, $V_{12} < V_{13}$ and $V_{22} \geq V_{23} \geq V_{21}$ (preferably $V_{22} > V_{23} > V_{21}$), or $V_{12} < V_{13}$ and $V_{22} \geq V_{13} \geq V_{21}$ (preferably $V_{22} > V_{13} > V_{21}$).

Further, in a case where the potential of the first electrode is higher than the potential of the second electrode, it is desirable that $V_{12} \geq V_{11}$ (preferably $V_{12} = V_{11}$). In a case where the potential of the second electrode is higher than the potential of the first electrode, it is desirable that $V_{11} \geq V_{12}$ (preferably $V_{11} = V_{12}$).

Moreover, in the imaging element or the like of the present disclosure including the various preferred embodiments and configurations described above, a semiconductor substrate is further included, and
the photoelectric conversion unit can be disposed above the semiconductor substrate. Further, the first electrode, the charge storage electrode, the transfer control electrode, and the second electrode are connected to a drive circuit to be described below.

The second electrode positioned on the light incident side may be shared by a plurality of imaging elements. That is, the second electrode may be a so-called solid electrode. The photoelectric conversion layer may be shared by a plurality of imaging elements, that is, one layer of the photoelectric conversion layer may be formed in a plurality of imaging elements, or the photoelectric conversion layer may be provided for each imaging element.

Moreover, in the imaging element or the like according to the present disclosure including various preferred embodiments and configurations described above, the first electrode may extend in an opening provided in the insulating layer and may be connected to the photoelectric conversion layer. Alternatively, the photoelectric conversion layer may extend in the opening provided in the insulating layer and may be connected to the first electrode, and in this case, the edge of the top surface of the first electrode is covered with an insulating layer, the first electrode is exposed on the bottom surface of the opening, when the surface of the insulating layer in contact with the top surface of the first electrode is defined as the first surface and the surface of the insulating layer in contact with a part of the photoelectric conversion layer opposite to the charge storage electrode is defined as the second surface, the side surface of the opening may have an inclination extending from the first surface toward the second surface, and moreover, the side surface of the opening having an inclination extending from the first surface toward the second surface may be positioned on the charge storage electrode side. Further, an embodiment in which another layer is formed between the photoelectric conversion layer and the first electrode (for example, an embodiment in which a material layer suitable for charge storage is formed between the photoelectric conversion layer and the first electrode) is included.

Moreover, in the imaging element or the like according to the present disclosure including the various preferred embodiments and configurations described above, a charge discharge electrode which is connected to the photoelectric conversion layer and disposed to be spaced apart from the first electrode, the charge storage electrode, and the transfer control electrode may be further included. Further, for convenience, the imaging element or the like of the present disclosure according to such an embodiment will be referred to as an "imaging element or the like according to the present disclosure provided with a charge discharge electrode". Further, in the imaging element or the like according to the present disclosure provided with a charge discharge electrode, the charge discharge electrode may be disposed to surround the first electrode, the charge storage electrode, and the transfer control electrode (that is, in a frame form). The charge discharge electrode may be shared by (commonized in) a plurality of the imaging elements. And in these cases, the photoelectric conversion layer may extend in the second opening provided in the insulating layer and may be connected to the charge discharge electrode,
the edge of the top surface of the charge discharge electrode may be covered with the insulating layer, and
the charge discharge electrode may be exposed on the bottom surface of the second opening.

When the surface of the insulating layer in contact with the top surface of the charge discharge electrode is defined as a third surface and the surface of the insulating layer in contact with a part of the photoelectric conversion layer opposite to the charge storage electrode is defined as a second surface, the side surface of the second opening may have an inclination that expands from the third surface toward the second surface.

Moreover, in the imaging element or the like of the present disclosure including a charge discharge electrode,
a control unit is provided on a semiconductor substrate and including a drive circuit, the first electrode, the charge storage electrode, the transfer control electrode, and the charge discharge electrode are connected to the drive circuit,
during a charge storage period, a potential $V_{11}$ is applied from the drive circuit to the first electrode, a potential $V_{12}$ is applied from the drive circuit to the charge storage electrode,
a potential $V_{14}$ is applied from the drive circuit to the charge discharge electrode, and a charge is stored in the photoelectric conversion layer, and during a charge transfer period, a potential $V_{21}$ is applied from the drive circuit to the first electrode, a potential $V_{22}$ is applied from the drive circuit to the charge storage electrode, a potential $V_{24}$ is applied from the drive circuit to the charge discharge electrode, and the charge stored in the photoelectric conversion layer is read to the control unit via the first electrode. Here, in a case where a potential of the first electrode is higher than a potential of the second electrode,
$V_{14} > V_{11}$ and $V_{24} < V_{21}$, and
in a case where the potential of the first electrode is lower than the potential of the second electrode,
$V_{14} < V_{11}$ and $V_{24} > V_{21}$.

Moreover, in the various preferred embodiments and configurations described above in the imaging element or the like of the present disclosure, the charge storage electrode can include a plurality of charge storage electrode segments. For convenience, the imaging element or the like of the present disclosure according to such an embodiment is referred to as "an imaging element or the like of the present disclosure including the plurality of charge storage electrode segments". Moreover, the number of charge storage electrode segments may be 2 or more. Further, in the imaging element or the like of the present disclosure including the plurality of charge storage electrode segments, in a case where a different potential is applied to each of N charge storage electrode segments, in a case where the potential of the first electrode is higher than the potential of the second electrode, in the charge transfer period, the potential applied to the charge storage electrode segment (the first photoelectric conversion unit segment) positioned closest to the first electrode may be higher than the potential applied to the charge storage electrode segment (the $N^{th}$ photoelectric conversion unit segment) positioned farthest from the first electrode, and
in a case where the potential of the first electrode is lower than the potential of the second electrode, in the charge transfer period, the potential applied to the charge storage electrode segment (the first photoelectric conversion unit segment) positioned closest to the first electrode may be lower than the potential applied to the charge storage electrode segment (the $N^{th}$ photoelectric conversion unit segment) positioned farthest from the first electrode.

In the imaging element or the like according to the present disclosure including the various preferred embodiments and configurations described above,
at least a floating diffusion layer and an amplification transistor forming a control unit may be provided on a semiconductor substrate.

The first electrode may be connected to a gate section of the floating diffusion layer and the amplification transistor. Further, in this case,
a reset transistor and a select transistor forming the control unit may be further provided on the semiconductor substrate.

The floating diffusion layer may be connected to a source/drain region of one side of the reset transistors.

The source/drain region of one side of the amplification transistor may be connected to the source/drain region of one side of the select transistor, and the source/drain region of another side of the select transistor may be connected to a signal line.

Moreover, in the imaging element or the like according to the present disclosure including the various preferred embodiments and configurations described above, the size of the charge storage electrode may be larger than that of the first electrode. When the area of the charge storage electrode is defined as $S_1'$, and the area of the first electrode is defined as $S_1$,
it is preferable to satisfy $4 \leq S_1'/S_1$,
but the present disclosure is not limited thereto.

Alternatively, modified examples of the imaging element or the like of the present disclosure including the various preferred embodiments described above include imaging elements of first to sixth configurations to be described below. That is, in the imaging elements of the first to sixth configurations in the imaging element or the like of the present disclosure including the various preferred embodiments described above,
the photoelectric conversion unit includes N (where $N \geq 2$) photoelectric conversion unit segments,
the photoelectric conversion layer includes N photoelectric conversion layer segments, an insulating layer includes N insulating layer segments,
in the imaging elements of the first to third configurations, the charge storage electrode includes N charge storage electrode segments,
in the imaging elements of the fourth and fifth configurations, the charge storage electrode includes N charge storage electrode segments disposed to be separate from each other, an $n^{th}$ (where n=1, 2, 3, . . . , N) photoelectric conversion unit segment includes an $n^{th}$ charge storage electrode segment, an $n^{th}$ insulating layer segment, and an $n^{th}$ photoelectric conversion layer segment, and
the photoelectric conversion unit segment of a larger value of n is located away from the first electrode.

Further, in the imaging element of the first configuration, the thickness of an insulating layer segment gradually changes from the first photoelectric conversion unit segment to the $N^{th}$ photoelectric conversion unit segment. Furthermore, in the imaging element of the second configuration, the thickness of the photoelectric conversion layer segment gradually changes from the first photoelectric conversion unit segment to the $N^{th}$ photoelectric conversion unit segment. Further, in the photoelectric conversion layer segment, the thickness of a part of the photoelectric conversion layer may be changed and the thickness of the part of the insulating layer may be set to be constant to change the thickness of the photoelectric conversion layer segment, the thickness of the part of the photoelectric conversion layer may be set to be constant and the thickness of a part of the insulating layer may be changed to change the thickness of the photoelectric conversion layer segment, or the thickness of the part of the photoelectric conversion layer may be changed and the thickness of the part of the insulating layer may be changed to change the thickness of the photoelectric conversion layer segment. Further, in the imaging element of the third configuration, materials of the insulating layer segments are different in the adjacent photoelectric conversion unit segments. Furthermore, in the imaging element of the fourth configuration, materials of the charge storage electrode segments are different in the adjacent photoelectric conversion unit segments. Further, in the imaging element of the fifth configuration, an area of the charge storage electrode segment gradually decreases from the first photoelectric conversion unit segment to the $N^{th}$ photoelectric conversion unit segment. The area may continuously decrease or may decrease in a stepwise manner.

Alternatively, in the imaging element according to the sixth configuration of the imaging element or the like of the present disclosure including the various preferred embodiments described above, in a case in which a stacking direction of the charge storage electrode, the insulating layer, and the photoelectric conversion layer is defined as a Z direction and a direction away from the first electrode is defined as an X direction, a cross-sectional area of a stacked portion when the stacked portion in which the charge storage electrode, the insulating layer, and the photoelectric conversion layer are stacked is cut in a YZ virtual plane varies depending on a distance from the first electrode. The cross sectional area may vary continuously or in stepwise manner.

In the imaging elements according to the first and second configurations, N photoelectric conversion layer segments are provided in series, N insulating layer segments are also provided in series, and N charge storage electrode segments are also provided in series. In the imaging elements according to the third to fifth configurations, N photoelectric conversion layer segments are provided in series. Furthermore, in the imaging elements according to the fourth and fifth configurations, N insulating layer segments are provided in series, while N insulating layer segments are provided to correspond to each of the photoelectric conversion unit segments in the imaging element according to the third configuration. Moreover, in the imaging element according to the fourth and fifth configurations, in some cases, in the imaging element according to the third configuration, N charge storage electrode segments are provided to correspond to each of the photoelectric conversion unit segments. Further, in the imaging elements according to the first to sixth configurations, the same potential is applied to all of the charge storage electrode segments. Alternatively, in the imaging elements according to the fourth and fifth configurations, in some cases, in the imaging element according to the third configuration, a different potential may be applied to each of the N charge storage electrode segments.

In the imaging element or the like of the present disclosure including the imaging elements of the first to sixth configurations, the thickness of the insulating layer segment is defined, the thickness of the photoelectric conversion layer segment is defined, the material of the insulating layer segment is different, the material of the charge storage electrode segment is different, the area of the charge storage electrode segment is defined, or the cross-sectional area of the stacked portion is defined. Therefore, a type of charge transfer gradient is formed, and charges generated through photoelectric conversion can be transferred more easily and reliably to the first electrode. Further, as a result, it is possible to prevent occurrence of afterimages and transfer residues.

In the imaging elements according to the first to fifth configurations, a photoelectric conversion unit segment having a larger value of n is located farther from the first electrode, but whether or not it is located away from the first electrode is determined on the basis of an X direction. Furthermore, in the imaging element according to the sixth configuration, a direction away from the first electrode is defined as the X direction, and the "X direction" is defined as follows. That is, a pixel region in which a plurality of imaging elements or stacked-type imaging elements is arrayed includes a plurality of pixels regularly arranged in a two-dimensional array, that is, in the X direction and a Y direction. In a case where the planar shape of the pixel is a rectangle, a direction in which the side closest to the first electrode extends is defined as the Y direction and the direction orthogonal to the Y direction is defined as the X direction. Alternatively, in a case where the planar shape of the pixel is an arbitrary shape, the overall direction in which the line segment or curve closest to the first electrode is included is defined as the Y direction and the direction orthogonal to the Y direction is defined as the X direction.

Hereinafter, a case in which the potential of the first electrode is higher than the potential of the second electrode in the imaging elements of the first to sixth configurations will be described.

In the imaging element of the first configuration, the thickness of the insulating layer segment gradually changes from the first photoelectric conversion unit segment to the $N^{th}$ photoelectric conversion unit segment. However, it is preferable that the thickness of the insulating layer segment be gradually thicker. As a result, a type of charge transfer gradient is formed. Then, in the state of $|V_{12}| \geq |V_{11}|$ in the charge storage period, the $n^{th}$ photoelectric conversion unit segment can store a larger amount of charge than the $(n+1)^{th}$ photoelectric conversion unit segment, and a strong electric field may be applied thereto, thereby reliably preventing the charge flow from the first photoelectric conversion unit segment to the first electrode. Further, in the state of $|V_{22}| < |V_{21}|$ in the charge transfer period, the charge flow from the first photoelectric conversion unit segment to the first electrode, and the charge flow from the $(n+1)^{th}$ photoelectric conversion unit segment to the $n^{th}$ photoelectric conversion unit segment can be reliably secured.

In the imaging element of the second configuration, the thickness of the photoelectric conversion layer segment gradually changes from the first photoelectric conversion unit segment to the $N^{th}$ photoelectric conversion unit segment, but it is preferable that the thickness of the photoelectric conversion layer segment be gradually thicker. As a result, a type of charge transfer gradient is formed. Further, in a state where $V_{12} \geq V_{11}$ in the charge storage period, a stronger electric field is applied to the $n^{th}$ photoelectric conversion unit segment than to the $(n+1)^{th}$ photoelectric conversion unit segment, thereby reliably preventing the charge flow from the first photoelectric conversion unit segment to the first electrode. In addition, when $V_{22} < V_{21}$ in the charge transfer period, the charge flow from the first photoelectric conversion unit segment to the first electrode, the charge flow from the $(n+1)^{th}$ photoelectric conversion unit segment to the $n^{th}$ photoelectric conversion unit segment can be reliably secured.

In the imaging element according to the third configuration, the material forming the insulating layer segment is different in adjacent photoelectric conversion unit segments, thereby forming a type of charge transfer gradient, but it is preferable that the value of the relative dielectric constant of the material forming the insulating layer segment gradually decrease from the first photoelectric conversion unit segment to the $N^{th}$ photoelectric conversion unit segment. Further, when such a configuration is adopted, in the state of $V_{12} \geq V_{11}$ during the charge storage period, the $n^{th}$ photoelectric conversion unit segment can store a larger amount of charge than the $(n+1)^{th}$ photoelectric conversion unit segment. In addition, when $V_{22} < V_{21}$ in the charge transfer period, the charge flow from the first photoelectric conversion unit segment to the first electrode, the charge flow from the $(n+1)^{th}$ photoelectric conversion unit segment to the $n^{th}$ photoelectric conversion unit segment can be reliably secured.

In the imaging element according to the fourth configuration, materials forming the charge storage electrode segment are different in adjacent photoelectric conversion unit segments, thereby forming a type of charge transfer gradient, but it is preferable that the value of the work function of the material forming the insulating layer segment gradually increase from the first photoelectric conversion unit segment to the $N^{th}$ photoelectric conversion unit segment. Further, when such a configuration is adopted, a potential gradient advantageous to signal charge transfer can be formed without depending on a positive/negative polarity of a voltage.

In the imaging element according to the fifth configuration, an area of the charge storage electrode segment gradually decreases from the first photoelectric conversion unit segment to the $N^{th}$ photoelectric conversion unit segment. As a result, a type of charge transfer gradient is formed, and thus, when $V_{12} \geq V_{11}$ in the charge storage period, the $n^{th}$ photoelectric conversion unit segment can store a larger amount of charge than the $(n+1)^{th}$ photoelectric conversion unit segment. In addition, when $V_{22} < V_{21}$ in the charge transfer period, the charge flow from the first photoelectric conversion unit segment to the first electrode, the charge flow from the $(n+1)^{th}$ photoelectric conversion unit segment to the $n^{th}$ photoelectric conversion unit segment can be reliably secured.

In the imaging element according to the sixth configuration, a cross-sectional area of the stacked portion varies depending on the distance from the first electrode, thereby forming a type of charge transfer gradient. Specifically, when a configuration in which the thickness of the cross section of the stacked portion is constant and the width of the cross section of the stacked portion decreases as being away from the first electrode is adopted, as explained in the imaging element according to the fifth configuration, when $V_{12} \geq V_{11}$ in the charge storage period, a larger amount of charge can be stored in the region close to the first electrode than in the region far from the first electrode. Accordingly, when $V_{22} < V_{21}$ in the charge transfer period, the charge flow from the region close to the first electrode to the first electrode, and the charge flow from the region far from the first electrode to the region close to the first electrode can be reliably ensured. On the other hand, when a configuration in which the width of the cross section of the stacked portion is constant and the thickness of the cross section of the stacked portion, specifically, the thickness of the insulating layer segment gradually increases is adopted, as explained in the imaging element according to the first configuration, when $V_{12} \geq V_{11}$ in the charge storage period, the region close to the first electrode can store a larger amount of charge than the region far from the first electrode, and a strong electric field can be applied thereto, and thus the charge flow from the region close to the first electrode to the first electrode can be reliably prevented. Further, when $V_{22} < V_{21}$ in the charge transfer period, the charge flow from the region close to the first electrode to the first electrode and the charge flow from the region far from the first electrode to the region close to the first electrode can be reliably ensured. Furthermore, when a configuration in which the thickness of the photoelectric conversion layer segment gradually increases, as explained in the imaging element according to the second configuration, when $V_{12} \geq V_{11}$ in the charge storage period, the region close to the first electrode is applied with a stronger electric field than the region far from the first electrode, and thus the charge flow from the region close to the first electrode to the first electrode can be reliably prevented. Further, when $V_{22} < V_{21}$ in the charge transfer period, the charge flow from the region close to the first electrode to the first electrode and the charge flow from the region far from the first electrode to the region close to the first electrode can be reliably ensured.

Two or more types of the imaging elements of the first to sixth configurations described above can be appropriately combined in accordance with a desire.

As a modified example of the solid-state imaging apparatus according to the second aspect of the present disclosure, the plurality of imaging elements of the first to sixth configurations is included.

An imaging element block includes the plurality of imaging elements.

In the solid-state imaging apparatus, the first electrode can be shared by the plurality of imaging elements included in the imaging element block. For convenience, the solid-state imaging apparatus that has such a configuration is referred to as "a solid-state imaging apparatus of the first configuration". Alternatively, as a modified example of the solid-state imaging apparatus according to the second aspect of the present disclosure, there is provided a solid-state imaging apparatus that includes the imaging elements of the first to sixth configurations or a plurality of stacked-type imaging elements including at least one of the imaging elements of the first to sixth configurations, in which the plurality of imaging elements or stacked-type imaging elements forms the imaging element block, and in which the first electrode is shared by the plurality of imaging elements or stacked-type imaging elements forming the imaging element block. For convenience, the solid-state imaging apparatus that has such a configuration is referred to as "a solid-state imaging apparatus of the second configuration". Further, since the first electrode is shared by the plurality of imaging elements forming the imaging element block in this way, the configuration or structure in the pixel region in which the plurality of imaging elements are arrayed can be simplified or miniaturized.

In the solid-state imaging apparatus according to the second aspect of the present disclosure, one floating diffusion layer is provided for a plurality of imaging elements (one imaging element block). Here, a plurality of the imaging elements provided for one floating diffusion layer may include a plurality of first-type imaging elements to be described below, or may include at least one first-type imaging element and one or two or more second-type imaging elements to be described below. Further, the plurality of imaging elements may share one floating diffusion layer by suitably controlling the timing of the charge transfer period. The plurality of imaging elements is operated in association with each other and is connected to a drive circuit to be described below as an imaging element block. That is, a plurality of imaging elements forming an imaging element block is connected to one drive circuit. However, control of the charge storage electrode is performed for each imaging element. Furthermore, the plurality of imaging elements may share one contact hole portion. An arrangement relationship between the first electrode shared by the plurality of imaging elements and the charge storage electrode of each imaging element is that the first electrode is disposed adjacent to the opposite region of the charge storage electrode of each imaging element.

Moreover, in the imaging element or the like of the present disclosure including the various preferred embodiments and configurations described above, light can be incident from the second electrode side and a light shielding layer can be formed on the light incident side of the second electrode. Alternatively, light can be incident from the second electrode side and no light can be incident on the first electrode (the first electrode and the transfer control electrode in some cases). Further, in this case, a light shielding layer can be formed on a light incident side from the second electrode and above the first electrode (the first electrode and the transfer control electrode in some cases) or an on-chip microlens can be provided above the charge storage electrode and the second electrode, and thus light incident on the on-chip microlens can be condensed on the charge storage electrode. Here, the light shielding layer may be disposed above the surface on the light incident side of the second electrode or may be disposed on the light incident side surface of the second electrode. In some cases, the light shielding layer may be formed on the second electrode. Examples of materials of the light shielding layer include chromium (Cr), copper (Cu), aluminum (Al), tungsten (W), and a light proof resin (e.g., polyimide resin).

Specific examples of the imaging element or the like according to the present disclosure include an imaging element (for convenience, referred to as a "first-type blue imaging element") having a photoelectric conversion layer or a photoelectric conversion unit which absorbs blue light (light of 425 nm to 495 nm) (for convenience, referred to as a "first-type blue photoelectric conversion layer" or a "first-type blue photoelectric conversion unit") and having sensitivity to blue light, an imaging element (for convenience, referred to as a "first-type green imaging element") having a photoelectric conversion layer or a photoelectric conversion unit which absorbs green light (light of 495 nm to 570 nm) (for convenience, referred to as a "first-type green photoelectric conversion layer" or a "first-type green photoelectric conversion unit") and having sensitivity to green light, and an imaging element (for convenience, referred to as a "first-type red imaging element") having a photoelectric conversion layer or a photoelectric conversion unit which absorbs red light (light of 620 nm to 750 nm) (for convenience, referred to as a "first-type red photoelectric conversion layer" or a "first-type red photoelectric conversion unit") and having sensitivity to red light. Further, the conventional imaging element without the charge storage electrode and sensitive to blue light is, for convenience, referred to as a "second-type blue imaging element", an imaging element sensitive to green light is, for convenience, referred to as a "second-type green imaging element", an imaging element sensitive to red light is, for convenience, referred to as a "second-type red imaging element", a photoelectric conversion layer or a photoelectric conversion unit forming the second-type blue imaging element is, for convenience, referred to as a "second-type blue photoelectric conversion layer" or a "second-type blue photoelectric conversion unit", a photoelectric conversion layer or a photoelectric conversion unit forming the second-type green imaging element is, for convenience, referred to as a "second-type green photoelectric conversion layer" or a "second-type green photoelectric conversion unit", and a photoelectric conversion layer or a photoelectric conversion unit forming the second-type red imaging element is, for convenience, referred to as a "second-type red photoelectric conversion layer" or a "second-type red photoelectric conversion unit".

The stacked-type imaging element according to the present disclosure includes at least one imaging element (photoelectric conversion element) according to the present disclosure, and specific examples thereof include:

[A] the configuration and structure in which the first-type blue photoelectric conversion unit, the first-type green photoelectric conversion unit, and the first-type red photoelectric conversion unit are stacked in the vertical direction, and each of the control units of the first-type blue imaging element, the first-type green imaging element, and the first-type red imaging element is provided on the semiconductor substrate;

[B] the configuration and structure in which the first-type blue photoelectric conversion unit and the first-type green photoelectric conversion unit are stacked in the vertical direction, the second-type red photoelectric conversion unit is disposed below these two layers of the first-type photoelectric conversion units, and each of the control units of the first-type blue imaging element, the first-type green imaging element, and the second-type red imaging element is provided on the semiconductor substrate;

[C] the configuration and structure in which the second-type blue photoelectric conversion unit and the second-type red photoelectric conversion unit are disposed below the first-type green photoelectric conversion unit, and each of the control units of the first-type green imaging element, the second-type blue imaging element, and the second-type red imaging element is provided on the semiconductor substrate; and

[D] the configuration and structure in which the second-type green photoelectric conversion unit and the second-type red photoelectric conversion unit are disposed below the first-type blue photoelectric conversion unit, and each of the control units of the first-type blue imaging element, the second-type green imaging element, and the second-type red imaging element is provided on the semiconductor substrate. Further, the arrangement order of the photoelectric conversion units of these imaging elements in the vertical direction is preferably an order of the blue photoelectric conversion unit, the green photoelectric conversion unit, and the red photoelectric conversion unit from the light incidence direction, or an order of the green photoelectric conversion unit, the blue photoelectric conversion unit, and the red photoelectric conversion unit from the light incidence direction. This is because shorter wavelength light is more efficiently absorbed on the incident surface side. Since red is the longest wavelength among the three colors, it is preferable to locate the red photoelectric conversion unit at the lowermost layer as viewed from the light incident surface. One pixel is formed by the stacked structure of these imaging elements. Furthermore, the first-type near infrared photoelectric conversion unit (or infrared photoelectric conversion unit) may be provided. Here, it is preferable that the photoelectric conversion layer of the first-type infrared photoelectric conversion unit include, for example, an organic material, and be the lowermost layer of the stacked structure of the first-type imaging element, and be disposed above the second-type imaging element. Alternatively, the second-type near infrared photoelectric conversion unit (or infrared photoelectric conversion unit) may be provided below the first-type photoelectric conversion unit.

In the first-type imaging element, for example, the first electrode is formed on the interlayer insulating layer provided on the semiconductor substrate. The imaging element formed on the semiconductor substrate may be of a back surface illuminated type or of a front surface illuminated type.

In a case where the photoelectric conversion layer includes organic materials, one of the following four embodiments may be used:

The photoelectric conversion layer includes (1) a p-type organic semiconductor.

The photoelectric conversion layer includes (2) an n-type organic semiconductor.

The photoelectric conversion layer includes (3) a stacked structure of a p-type organic semiconductor layer/an n-type organic semiconductor layer. The photoelectric conversion layer includes a stacked structure of a p-type organic semiconductor layer/a mixed layer (bulk hetero structure) of a p-type organic semiconductor and an n-type organic semiconductor/an n-type organic semiconductor layer. The photoelectric conversion layer includes a stacked structure of a p-type organic semiconductor layer/a mixed layer (bulk hetero structure) of a p-type organic semiconductor and an n-type organic semiconductor. The photoelectric conversion layer includes a stacked structure of an n-type organic semiconductor layer/a mixed layer (bulk hetero structure) of a p-type organic semiconductor and an n-type organic semiconductor.

The photoelectric conversion layer includes (4) a mixture (bulk hetero structure) of a p-type organic semiconductor and an n-type organic semiconductor. However, the stacking order may be arbitrarily exchanged.

Examples of the p-type organic semiconductor include a naphthalene derivative, an anthracene derivative, a phenanthrene derivative, a pyrene derivative, a perylene derivative, a tetracene derivative, a pentacene derivative, a quinacridone derivative, a thiophene derivative, a thienothiophene derivative, a benzothiophene derivative, a benzothienobenzothiophene derivative, a triallylamine derivative, a carbazole derivative, a perylene derivative, a picene derivative, a chrysene derivative, a fluoranthene derivative, a phthalocyanine derivative, a subphthalocyanine derivative, a subporphyrazine derivative, a metal complex having a heterocyclic compound as a ligand, a polythiophene derivative, a polybenzothiadiazole derivative, a polyfluorene derivative, etc. Examples of the n-type organic semiconductor include fullerenes and fullerene derivatives (e.g., fullerenes (higher fullerene) such as C60, C70, C74 fullerenes or the like, endohedral fullerene or the like), or fullerene derivatives (e.g., fullerene fluoride, PCBM fullerene compound, fullerene polymer, etc.)), organic semiconductors with larger (deeper) HOMO and LUMO than those of p-type organic semiconductors, and transparent inorganic metal oxides. Specific examples of the n-type organic semiconductor include a heterocyclic compound containing a nitrogen atom, an oxygen atom, and a sulfur atom, for example, organic molecules and organometallic complexes having pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, benzimidazole derivatives, benzotriazole derivatives, benzoxazole derivatives, benzoxazole derivatives, carbazole derivatives, benzofuran derivatives, dibenzofuran derivatives, subporphyrazine derivative, polyphenylene vinylene derivatives, polybenzothiadiazole derivatives, polyfluorene derivatives, and the like as a part of the molecular skeleton, and subphthalocyanine derivatives. Examples of a functional group or the like included in fullerene derivatives include a halogen atom; a linear, branched or cyclic alkyl group or phenyl group; a functional group having a linear or condensed aromatic compound; a functional group having a halide; a partial fluoroalkyl group; a perfluoroalkyl group; a silylalkyl group; a silylalkoxy group; an arylsilyl group; an arylsulfanyl group; an alkylsulfanyl group; an arylsulfonyl group; an alkylsulfonyl group; an arylsulfide group; an alkylsulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a functional group having a chalcogenide; a phosphine group; a phosphonic group; and derivatives thereof. The thickness of the photoelectric conversion layer (may be referred to as "organic photoelectric conversion layer") including an organic material may be, without being limited to, for example, $1 \times 10^{-8}$ m to $5 \times 10^{-7}$ m, preferably $2.5 \times 10^{-8}$ m to $3 \times 10^{-7}$ m, more preferably $2.5 \times 10^{-8}$ m to $2 \times 10^{-7}$ m, and still more preferably $1 \times 10^{-7}$ m to $1.8 \times 10^{-7}$ m. Further, an organic semiconductor is often classified as p-type or n-type, but p-type indicates that holes can be easily transported, and n-type indicates that electrons can be easily transported, and an organic semiconductor is not limited to the interpretation that it has holes or electrons as majority carriers of thermal excitation as in inorganic semiconductors.

Alternatively, examples of the material forming an organic photoelectric conversion layer that photoelectrically converts green light include rhodamine-based pigment, melacyanine-based pigment, quinacridone derivative, subphthalocyanine-based pigment (subphthalocyanine derivative), etc. Examples of the material forming an organic photoelectric conversion layer that photoelectrically converts blue light include coumarinic acid pigment, tris-8-hydricoxyquinoline aluminum (Alq3), melacyanin-based pigment, etc. Examples of the material forming an organic photoelectric conversion layer that photoelectrically converts red light include phthalocyanine-based pigment and subphthalocyanine-based pigment (subphthalocyanine derivative).

Alternatively, examples of the inorganic material forming the photoelectric conversion layer include crystalline silicon, amorphous silicon, microcrystalline silicon, crystalline selenium, amorphous selenium, chalcopyrite compounds such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, AgInSe$_2$, or group III-V compounds such as GaAs, InP, AlGaAs, InGaP, AlGaInP, InGaAsP, and compound semiconductors such as CdSe, CdS, In$_2$Se$_3$, In$_2$S$_3$, Bi$_2$Se$_3$, Bi$_2$S$_3$, ZnSe, ZnS, PbSe, PbS, etc. In addition, quantum dots including these materials may be used in the photoelectric conversion layer.

Alternatively, the photoelectric conversion layer may have a stacked structure of a lower semiconductor layer and an upper photoelectric conversion layer. When the lower semiconductor layer is provided as described above, the recombination during charge storage can be prevented, the efficiency of transfer of charge stored in the photoelectric conversion layer to the first electrode can be increased, and the generation of dark current can be suppressed. The material forming the upper photoelectric conversion layer may be suitably selected from various materials forming the photoelectric conversion layer. On the other hand, it is preferable to use a material having a large band gap value (e.g., a band gap value of 3.0 eV or more) and having a higher mobility than a material forming the photoelectric conversion layer as a material forming the lower semiconductor layer. Specifically, oxide semiconductor materials such as IGZO, indium-tungsten oxide (IWO) which is a material in which tungsten (W) is added to indium oxide, indium-tungsten-zinc oxide (IWZO) which is a material in which tungsten (W) and zinc (Zn) are added to indium oxide, indium-tin-zinc oxide (ITZO) which is a material in which tin (Sn) and zinc (Zn) are added to indium oxide, or zinc-tin oxide (ZTO); transition metal dichalcogenide; silicon carbide; diamond; graphene; carbon nanotube; condensed polycyclic hydrocarbon compounds, condensed heterocyclic compounds, etc. Alternatively, in a case where the charge to be stored is an electron, an example of the material forming the lower semiconductor layer may be a material having the ionization potential larger than the ionization potential of the material forming the photoelectric conversion layer. In a case where the charge to be stored is a hole, an example of the material forming the lower layer semiconductor layer may be a material having the electron affinity smaller than the electron affinity of the material forming the photoelectric conversion layer. Alternatively, the impurity concentration in the material forming the lower layer semiconductor layer is preferably $1 \times 10^{18}$ cm$^{-3}$ or less. The lower semiconductor layer may have a single layer configuration or a multilayer configuration. Furthermore, a material forming the lower semiconductor layer located above the charge storage electrode and a material forming the lower semiconductor layer located above the first electrode may be different from each other.

With the solid-state imaging apparatus according to the first and second aspects of the present disclosure, a single-plate type color solid-state imaging apparatus may be formed.

In the solid-state imaging apparatus according to the first and second aspects of the present disclosure including the stacked-type imaging element, unlike the solid-state imaging apparatus including the Bayer-array imaging element (i.e., spectroscopy for blue, green, and red is not performed using a color filter layer), imaging elements having sensitivity to light of plural types of wavelengths are stacked in the light incidence direction in the same pixel to form one pixel, and thus improvement of sensitivity and pixel density per unit volume can be achieved. Furthermore, since an organic material has a high absorption coefficient, a film thickness of a photoelectric conversion layer can be thinner as compared to a conventional Si-based photoelectric conversion layer, and light leakage from adjacent pixels and restriction on the light incidence angle can be alleviated. Moreover, since the conventional Si-based imaging element produces color signals by performing interpolation processing among three-color pixels, false color is generated, but false color can be suppressed in the solid-state imaging apparatus according to the second aspect of the present disclosure including the stacked-type imaging element. Further, since the organic photoelectric conversion layer itself functions as a color filter layer, color separation can be performed without disposing a color filter layer.

On the other hand, in the solid-state imaging apparatus according to the first and second aspects of the present disclosure, due to using a color filter layer, the request for spectral characteristics of blue, green, and red can be alleviated, and moreover, mass productivity is high. Examples of the arrangement of the imaging element in such a solid-state imaging apparatus include an interline arrangement, a G stripe-RB checkered array, a G stripe-RB full-checkered array, a checkered complementary color array, a stripe array, a diagonal stripe array, a primary color difference array, a field color difference sequential array, a flame color difference sequential array, an MOS-type array, a modified MOS-type array, a flame interleave array, and a field interleave array in addition to a Bayer array. Here, one pixel (or subpixel) is formed by one imaging element.

An example of a color filter layer (wavelength selection means) includes a filter layer that transmits not only red, green, and blue but also a specific wavelength of cyan, magenta, or yellow in some cases. The color filter layer can include not only an organic-material-based color filter layer in which an organic compound such as a dye or a pigment is used but also a thin film including an inorganic material such as amorphous silicon or a wavelength selection element in which photonic crystal or Plasmon is applied (a color filter layer that has a conductive grid structure in which a grid-shaped hole structure is provided in a conductive thin film: for example, see Japanese Patent Application Laid-Open No. 2008-177191).

A pixel region in which a plurality of the imaging elements or the like according to the present disclosure is arrayed includes a plurality of pixels regularly arranged in a two-dimensional array. Generally, the pixel region includes an effective pixel region which actually receives light, amplifies the signal charges generated by photoelectric conversion and reads it out to the drive circuit, and a black reference pixel region (also refer to an optical black pixel area (OPB)) for outputting optical black serving as a reference of a black level. The black reference pixel region is generally disposed at the outer peripheral portion of the effective pixel region.

In the imaging element or the like according to the present disclosure including the various preferred embodiments and configurations described above, light is radiated, photoelectric conversion is generated on the photoelectric conversion layer, carriers including holes and electrons are separated. Further, an electrode from which holes are extracted is referred to as an anode, and an electrode from which electrons are extracted is defined as a cathode. The first electrode may form an anode, and the second electrode may form a cathode, or reversely, the first electrode may form a cathode, and the second electrode may form an anode.

In the case of forming a stacked-type imaging element, the first electrode, the charge storage electrode, the transfer control electrode, the charge discharge electrode, and the second electrode can include a transparent conductive material. Further, the first electrode, the charge storage electrode, the transfer control electrode, and the charge discharge electrode may be collectively referred to as a "first electrode or the like". Alternatively, in a case where the image imaging element or the like according to the present disclosure is arranged on a plane, for example, as in a Bayer array, the second electrode may include a transparent conductive material and the first electrode or the like may include a metal material. In this case, specifically, the second electrode located on the light incident side may include a transparent conductive material and the first electrode or the like may include, for example, Al—Nd (alloy of aluminum and neodymium) or ASC (alloy of aluminum, samarium, and copper). Further, an electrode including a transparent conductive material may be referred to as a "transparent electrode". Here, the band gap energy of the transparent conductive material is 2.5 eV or more, and preferably, 3.1 eV or more. Examples of a transparent conductive material forming a transparent electrode include conductive metal oxides, and specific examples thereof include indium oxide, indium-tin oxide (ITO including Sn-doped $In_2O_3$, crystalline ITO and amorphous ITO), indium-zinc oxide (IZO) in which indium is added to zinc oxide as a dopant, indium-gallium oxide (IGO) in which indium is added to gallium oxide as a dopant, indium-gallium-zinc oxide (IGZO, In—$GaZnO_4$) in which indium and gallium are added to zinc oxide as a dopant, indium-tin-zinc oxide (ITZO) in which indium and tin are added to zinc oxide as a dopant, IFO (F-doped $In_2O_3$), tin oxide ($SnO_2$), ATO (Sb-doped $SnO_2$), FTO (F-doped $SnO_2$), zinc oxide (including ZnO doped with other elements), aluminum-zinc oxide (AZO) in which aluminum is added to zinc oxide as a dopant, gallium-zinc oxide (GZO) in which gallium is added to zinc oxide as a dopant, titanium oxide ($TiO_2$), niobium-titanium oxide (TNO) in which niobium is added to titanium oxide as a dopant, antimony oxide, spinel type oxide, and an oxide having a $YbFe_2O_4$ structure. Alternatively, a transparent electrode having a base layer of gallium oxide, titanium oxide, niobium oxide, nickel oxide, or the like may be given as an example. The thickness of the transparent electrode may be $2\times10^{-8}$ m to $2\times10^{-7}$ m, preferably $3\times10^{-8}$ m to $1\times10^{-7}$ m. In a case where transparency is necessary for the first electrode, it is preferable that the charge discharge electrode also include a transparent conductive material from the viewpoint of simplification of the manufacturing process.

Alternatively, in a case where transparency is unnecessary, a conductive material forming an anode having a function as an electrode for extracting holes is preferably a conductive material having a high work function (e.g., $\varphi=4.5$ eV to 5.5 eV), and specific examples thereof include gold (Au), silver (Ag), chromium (Cr), nickel (Ni), palladium (Pd), platinum (Pt), iron (Fe), iridium (Ir), germanium (Ge), osmium (Os), rhenium (Re), and tellurium (Te). On the other hand, a conductive material forming a cathode having a function as an electrode for extracting electrons is preferably a conductive material having a low work function (e.g., $\varphi=3.5$ eV to 4.5 eV), and specific examples thereof include alkali metals (e.g., Li, Na, K, etc.) and the fluorides or oxides thereof, alkaline earth metals (e.g., Mg, Ca, etc.) and the fluorides or oxides thereof, aluminum (Al), zinc (Zn), tin (Sn), thallium (Tl), a sodium-potassium alloy, an aluminum-lithium alloy, a magnesium-silver alloy, indium, and rare earth metals such as ytterbium, or alloys thereof. Alternatively, examples of the material forming an anode or cathode include metals such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), molybdenum (Mo), or the like, or alloys including these metal elements, conductive particles including these metals, conductive particles of alloys containing these metals, polysilicon containing impurities, carbon-based materials, oxide semiconductor materials, conductive materials such as carbon nanotubes, graphene, and the like, and a laminated structure of layers containing these elements. Furthermore, examples of the material forming an anode or cathode include organic materials (conductive polymers) such as poly(3,4-ethylenedioxythiophene)/polystyrenesulfonic acid [PEDOT/PSS]. Further, a paste or ink prepared by mixing these conductive materials into a binder (polymer) may be cured to be used as an electrode.

A dry method or wet method may be used as a film-forming method of the first electrode or the like (anode) and the second electrode (cathode). Examples of the dry method include a physical vapor deposition method (PVD method) and a chemical vapor deposition method (CVD method) method. Examples of the film-forming method using the principle of PVD method include a vacuum deposition method using resistance heating or high frequency heating, an electron beam (EB) deposition method, various sputtering methods (magnetron sputtering method, RF-DC coupled bias sputtering method, ECR sputtering method, facing-target sputtering method, and high frequency sputtering method), an ion plating method, a laser ablation method, a molecular beam epitaxy method, and a laser transfer method. Furthermore, examples of the CVD method include a plasma CVD method, a thermal CVD method, an organic metal (MO) CVD method, and a photo CVD method. On the other hand, examples of the wet method include an electrolytic plating method and an electroless plating method, a spin coating method, an ink jet method, a spray coating method, a stamping method, a micro contact printing method, a flexographic printing method, an offset printing method, a gravure printing method, a dipping method, etc. As for patterning, chemical etching such as shadow mask, laser transfer, photolithography, and the like, physical etching by ultraviolet light, laser, and the like may be used. Examples of a planarization technique for the first electrode and second electrode include a laser planarization method, a reflow method, a chemical mechanical polishing (CMP) method, etc.

Examples of materials forming the insulating layer include inorganic insulating materials exemplified by silicon oxide-based materials; silicon nitride ($SiN_Y$); a metal oxide high-dielectric constant insulating material such as aluminum oxide ($Al_2O_3$) or the like as well as organic insulating materials (organic polymers) exemplified by polymethyl methacrylate (PMMA); polyvinyl phenol (PVP); polyvinyl alcohol (PVA); polyimide, polycarbonate (PC); polyethylene terephthalate (PET); polystyrene; silanol derivatives (silane coupling agents) such as N-2(aminoethyl)3-aminopropyltrimethoxysilane (AEAPTMS), 3-mercaptopropyltrimethoxysilane (MPTMS), octadecyltrichlorosilane (OTS), or the like; novolak-type phenolic resins; fluorine-based resins, straight-chain hydrocarbons having a functional group capable of bonding to the control electrode at one end such as octadecanethiol, dodecyl isocyanate, and the like, and combinations thereof. Examples of the silicon oxide-based materials include silicon oxide (SiOx), BPSG, PSG, BSG, AsSG, PbSG, silicon oxynitride (SiON), spin-on-glass (SOG), and low dielectric constant insulating materials (e.g., polyaryl ether, cycloperfluorocarbon polymers and benzocyclobutene, cyclic fluoro resins, polytetrafluoroethylene, fluoroaryl ether, fluorinated polyimide, amorphous carbon, and organic SOG). The insulating layer can have a single layer configuration or a configuration in which a plurality of layers is stacked (for example, a stacked structure of two layers). In the latter case, an insulating lower layer may be formed in a region above at least the charge storage electrode and between the charge storage electrode, the transfer control electrode, and the first electrode, the insulating lower layer may remain in the region between at least the charge storage electrode, the first electrode, and the transfer control electrode by performing a flattening treatment on the insulating lower layer, and an insulating upper layer may be formed on the remaining insulating lower layer, the charge storage electrode, and the transfer control electrode. As a result, the flattening of the insulating layer can be reliably attained. Materials forming various interlayer insulating layers and insulating material films may be suitably selected from these materials.

The configuration and structure of the floating diffusion layer, amplification transistor, reset transistor, and select transistor forming the control unit may be similar to those of the conventional floating diffusion layer, amplification transistor, reset transistor, and select transistor. Also, the drive circuit may have well-known configuration and structure.

The first electrode is connected to the floating diffusion layer and the gate section of the amplification transistor, and a contact hole portion may be formed to connect the first electrode to the floating diffusion layer and the gate section of the amplification transistor. Examples of a material forming the contact hole portion include a high melting point metal such as tungsten, Ti, Pt, Pd, Cu, TiW, TiN, TiNW, $WSi_2$, $MoSi_2$, or the like, metal silicide, or a stacked structure of layers including these materials (e.g., Ti/TiN/W).

A first carrier blocking layer may be provided between the organic photoelectric conversion layer and the first electrode, or a second carrier blocking layer may be provided between the organic photoelectric conversion layer and the second electrode. Furthermore, a first charge injection layer may be provided between the first carrier blocking layer and the first electrode, or a second charge injection layer may be provided between the second carrier blocking layer and the second electrode. Examples of a material forming the charge injection layer include alkali metals such as lithium (Li), sodium (Na), and potassium (K), fluorides and oxides thereof, alkaline earth metals such as magnesium (Mg) and calcium (Ca), and fluorides and oxides thereof.

A dry film formation method and a wet film formation method may be given as examples of a film-forming method for various organic layers. Examples of the dry film formation method include a vacuum deposition method using resistance heating, high frequency heating, or electron beam heating, a flash deposition method, a plasma deposition method, an EB deposition method, various sputtering method (bipolar sputtering method, direct current sputtering method, DC magnetron sputtering method, RF-DC coupled bias sputtering method, ECR sputtering method, facing-target sputtering method, high frequency sputtering method, and ion beam sputtering method), a direct current (DC) method, an RF method, a multi-cathode method, an activation reaction method, an electric field vapor deposition method, various ion plating methods such as a high-frequency ion plating method and a reactive ion plating method, a laser ablation method, a molecular beam epitaxy method, a laser transfer method, and a molecular beam epitaxy (MBE) method. Furthermore, examples of a chemical vapor deposition method include a plasma CVD method, a thermal CVD method, an MOCVD method, and a photo CVD method. On the other hand, as a wet method, a spin coating method; a dipping method; a casting method; a micro contact printing method; a drop casting method; various printing methods such as a screen printing method, an ink jet printing method, an offset printing method, a gravure printing method, and a flexographic printing method; a stamping method; a spray coating method; various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method. Further, examples of a solvent in the coating method include a nonpolar or low polar organic solvents such as toluene, chloroform, hexane, and ethanol. As for patterning, chemical etching such as shadow mask, laser transfer, photolithography, and the like, physical etching by ultraviolet light, laser, and the like may be used. Examples of a planarization technique for various organic layers include a laser planarization method, a reflow method, etc.

In the imaging element or the solid-state imaging apparatus, as described above, as necessary, an on-chip microlens or a light shielding layer may be provided, or a drive circuit and wiring for driving the imaging element are provided. A shutter for controlling the incidence of light to the imaging element may be provided as necessary, or an optical cut filter may be provided according to the purpose of the solid-state imaging apparatus.

Furthermore, in the solid-state imaging apparatus according to the first and second aspects of the present disclosure, one on-chip microlens can be disposed above one imaging element or the like, or the imaging element block can be formed by two imaging elements or the like and one on-chip microlens can be disposed above the imaging element block.

For example, in a case where the solid-state imaging apparatus is stacked with a readout integrated circuit (ROIC), the stacking may be performed by overlaying a drive substrate on which a readout integrated circuit and a connection portion including copper (Cu) are formed and an imaging element on which a connection portion is formed such that the connection portions are in contact with each other, and joining the connection portions, and it is also possible to join the connection portions using a solder bump or the like.

Furthermore, in a driving method of driving the solid-state imaging apparatus according to the first and second aspects of the present disclosure,
it is possible to realize a method of driving the solid-state imaging apparatus by repeating the steps of:
discharging charges in the first electrode out of the system while charges are stored simultaneously in the photoelectric conversion layer in all the imaging elements; and transferring the charges stored in the photoelectric conversion layers to the first electrode simultaneously in all the imaging elements and sequentially reading the charges transferred to the first electrode in each imaging element after completion of the transferring.

In such a driving method of a solid-state imaging apparatus, each imaging element has a structure in which light incident from the second electrode side does not enter the first electrode (in some cases, the first electrode and the transfer control electrode), and in all the imaging elements, charges in the first electrode is simultaneously discharged to the outside of the system while charges are stored in the photoelectric conversion layer, and thus the reset of the first electrode can be reliably performed simultaneously in all the imaging elements. Further, thereafter, in all the imaging elements, the charges stored in the photoelectric conversion layer are simultaneously transferred to the first electrode, and after completion of the transfer, the charges transferred to the first electrode in each imaging element are sequentially read out. Therefore, a so-called global shutter function can be easily realized.

Examples of the imaging element of the present disclosure include signal amplification type image sensors of a CCD element, a CMOS image sensor, a contact image sensor (CIS), and a charge modulation device (CMD). For example, a digital still camera, a video camera, a camcorder, a surveillance camera, a vehicle-mounted camera, a smartphone camera, a game user interface camera, and a biometric authentication camera can be configured from the solid-state imaging apparatus according to the first and second aspects of the present disclosure or the solid-state imaging apparatus of the first and second configurations.

Embodiment 1

Embodiment 1 relates to an imaging element according to the present disclosure and a stacked-type imaging element according to the present disclosure, and a solid-state imaging apparatus according to the first aspect of the present disclosure.

Figure 2:
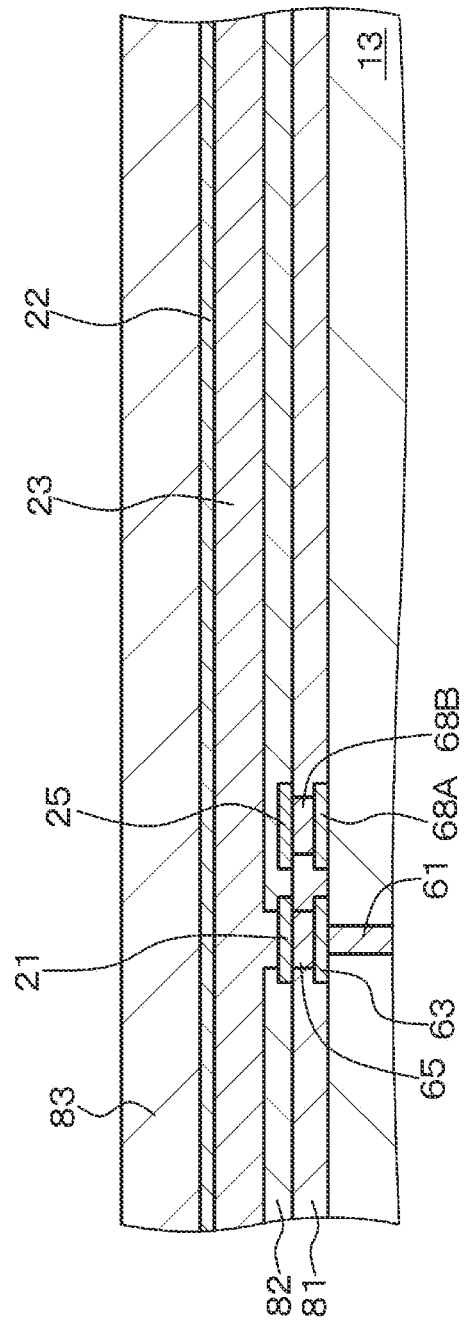
FIG. 2 is a schematic partial sectional view of an imaging element and a stacked-type imaging element of Embodiment 1 along the arrow B-B of FIG. 3 of FIG. 3.
Figure 3:
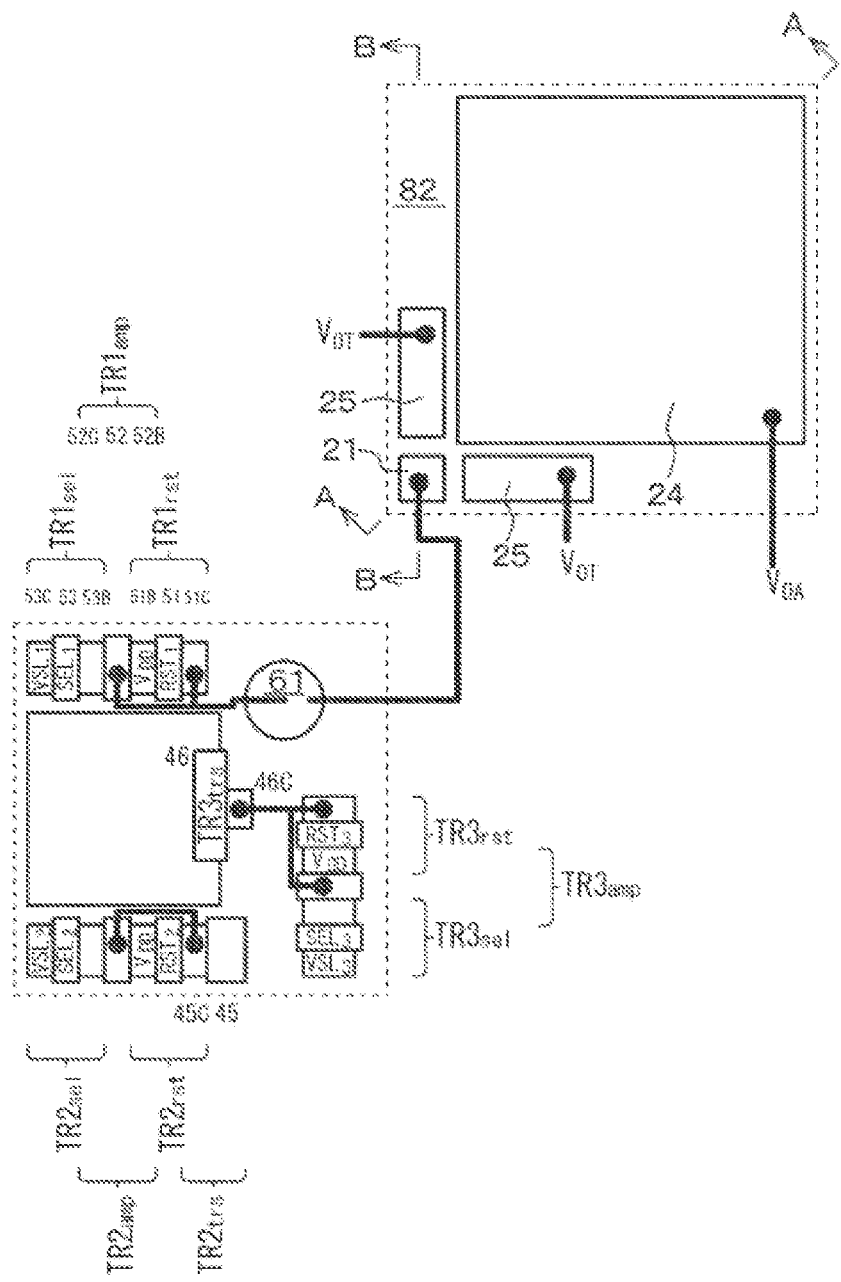
FIG. 3 is a schematic arrangement view of a first electrode, a charge storage electrode, and a transfer control electrode forming the imaging element of Embodiment 1 and a transistor forming a control unit.
Figure 4:
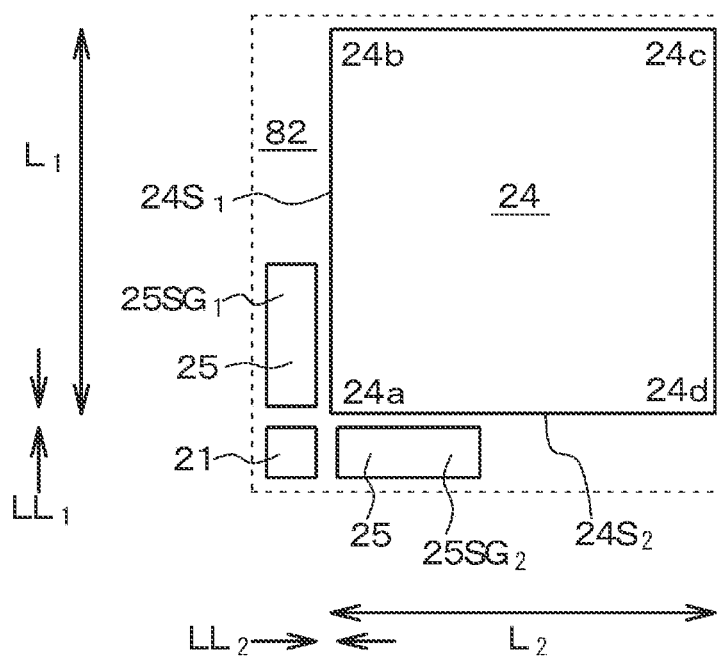
FIG. 4 is a schematic arrangement view of a first electrode, a charge storage electrode, and a transfer control electrode forming the imaging element of Embodiment 1.
Figure 5A:
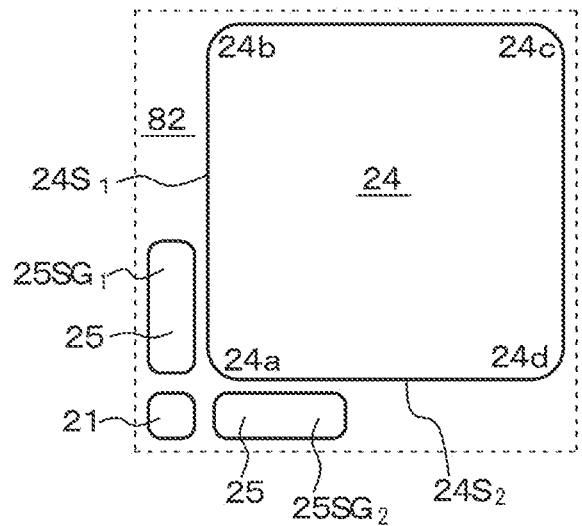
FIGS. 5A, 5B, and 5C are schematic arrangement views of a modified example of the first electrode, the charge storage electrode, and the transfer control electrode forming a modified example of the imaging element of Embodiment 1.
Figure 5B:
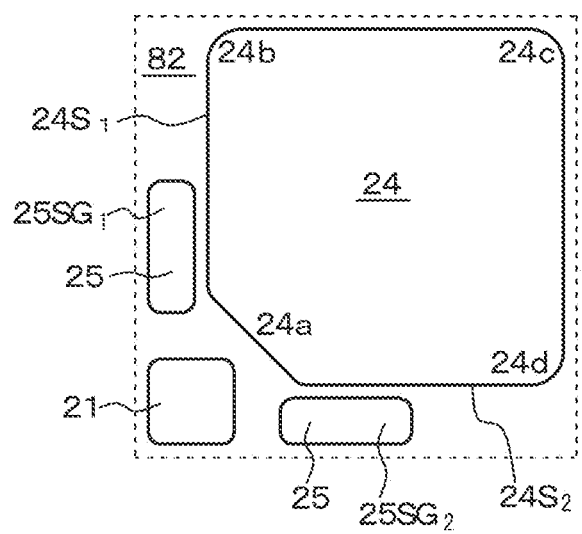
Figure 5C:
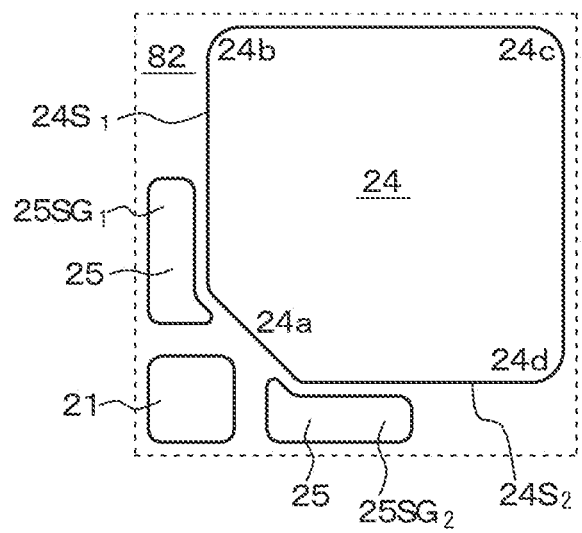
Figure 6A:
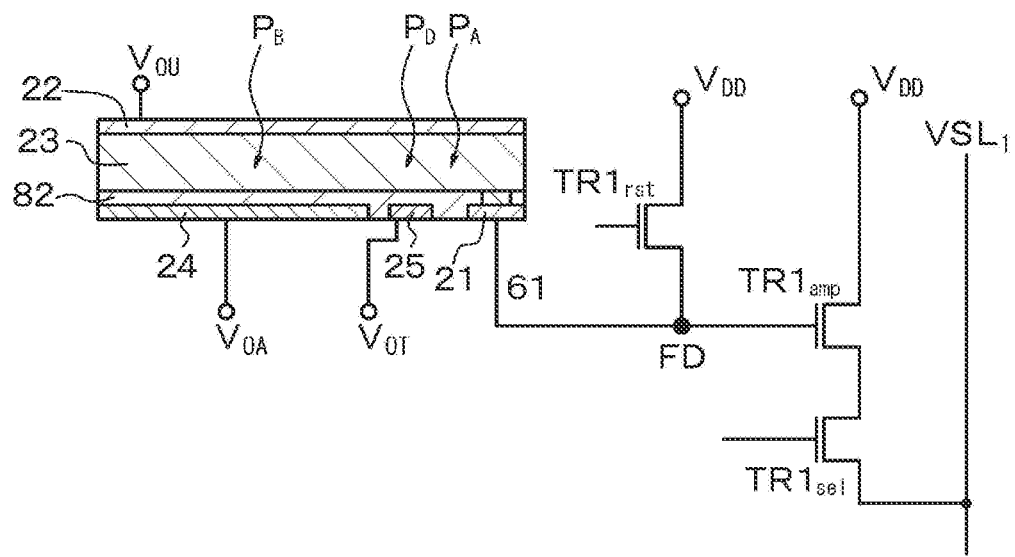
FIGS. 6A and 6B are equivalent circuit diagrams of the imaging element of Embodiments 1 and 9 to describe each portion in FIGS. 9, 10, 11 (Embodiment 1), 35, and 36 (Embodiment 9).
Figure 7:
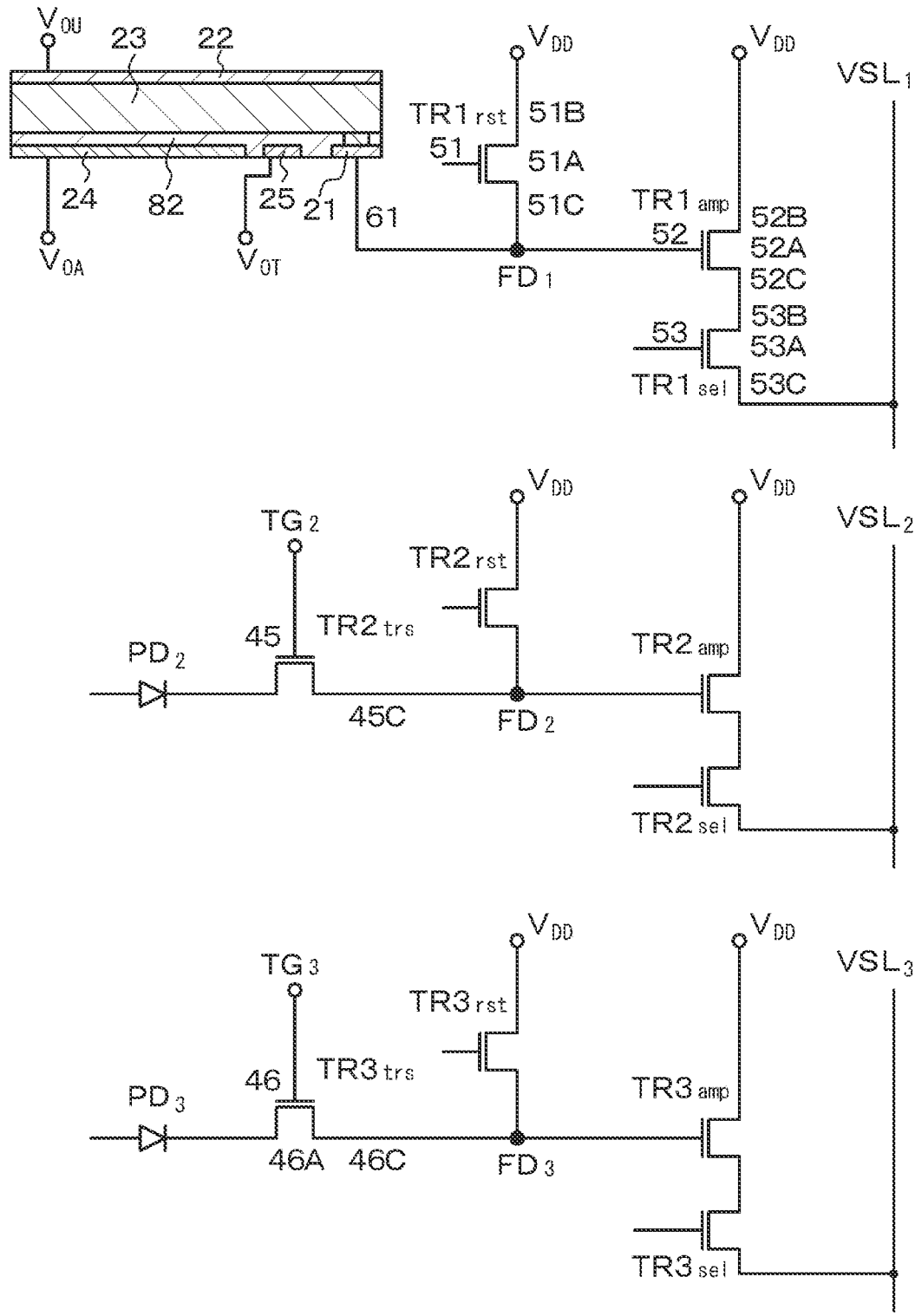
FIG. 7 is an equivalent circuit diagram of the imaging element of Embodiment 1.
Figure 8:
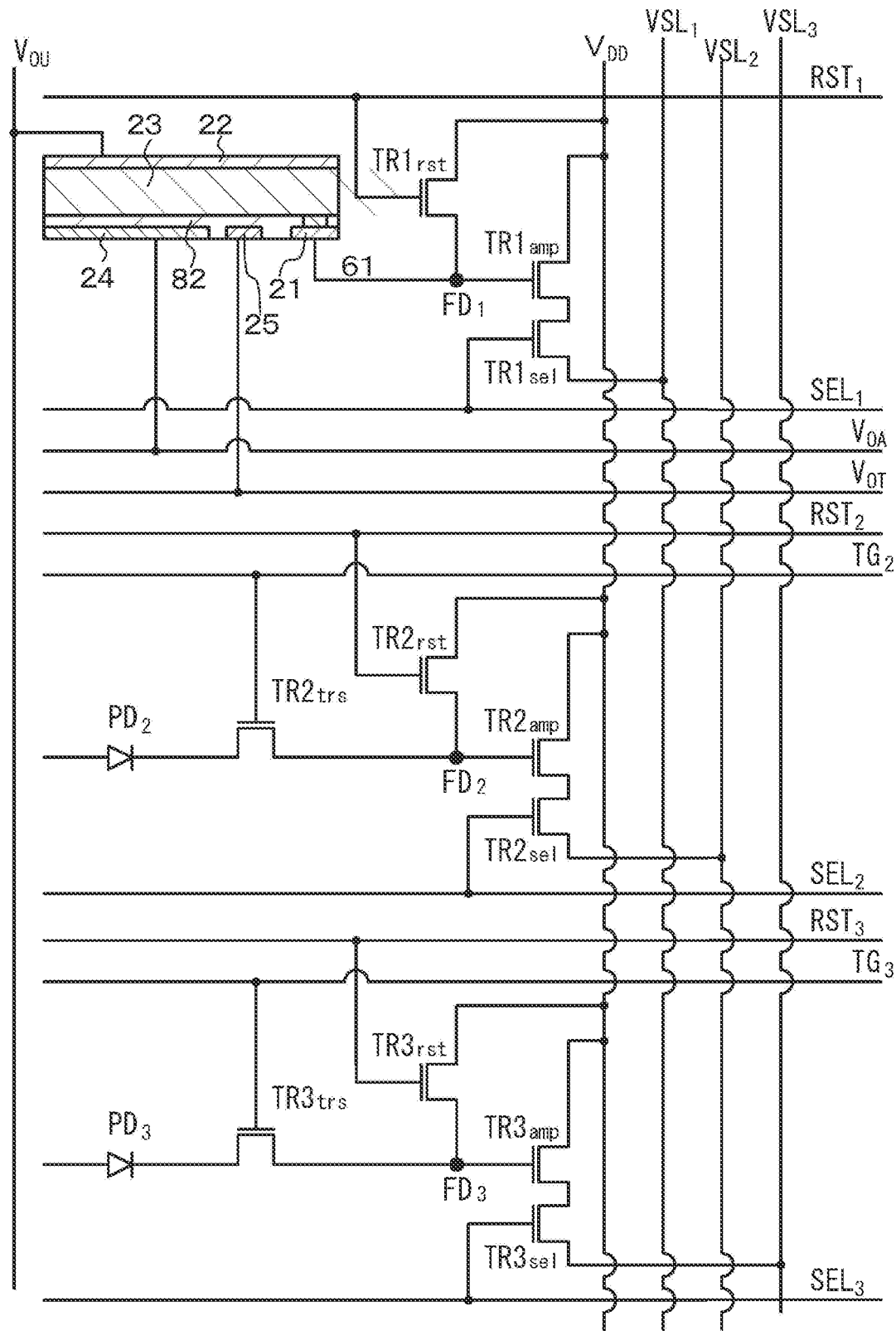
FIG. 8 is an equivalent circuit diagram of the imaging element of Embodiment 1.
Figure 9:
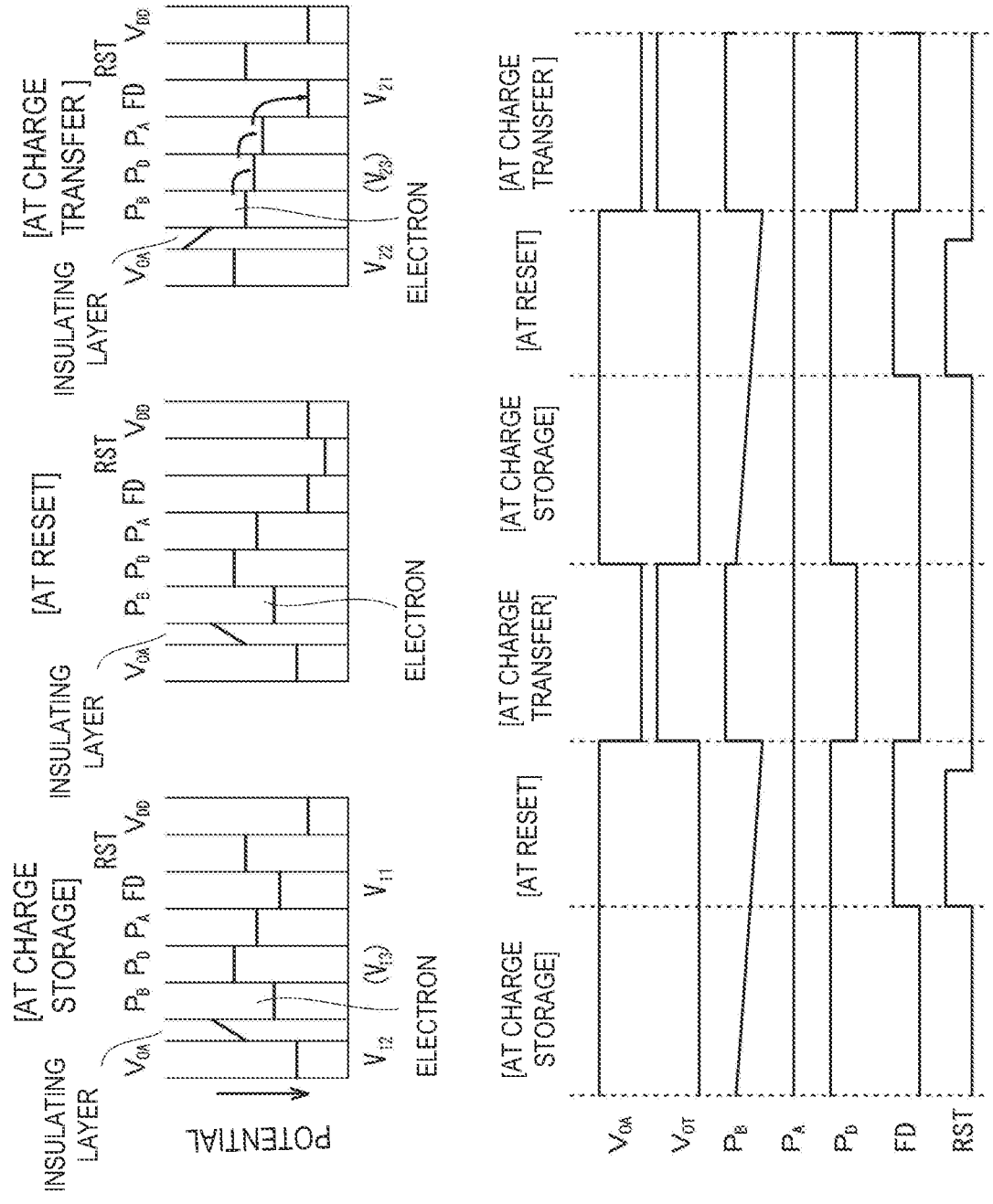
FIG. 9 is a view schematically showing a potential state in each portion during an operation of the imaging element of Embodiment 1.
Figure 10:
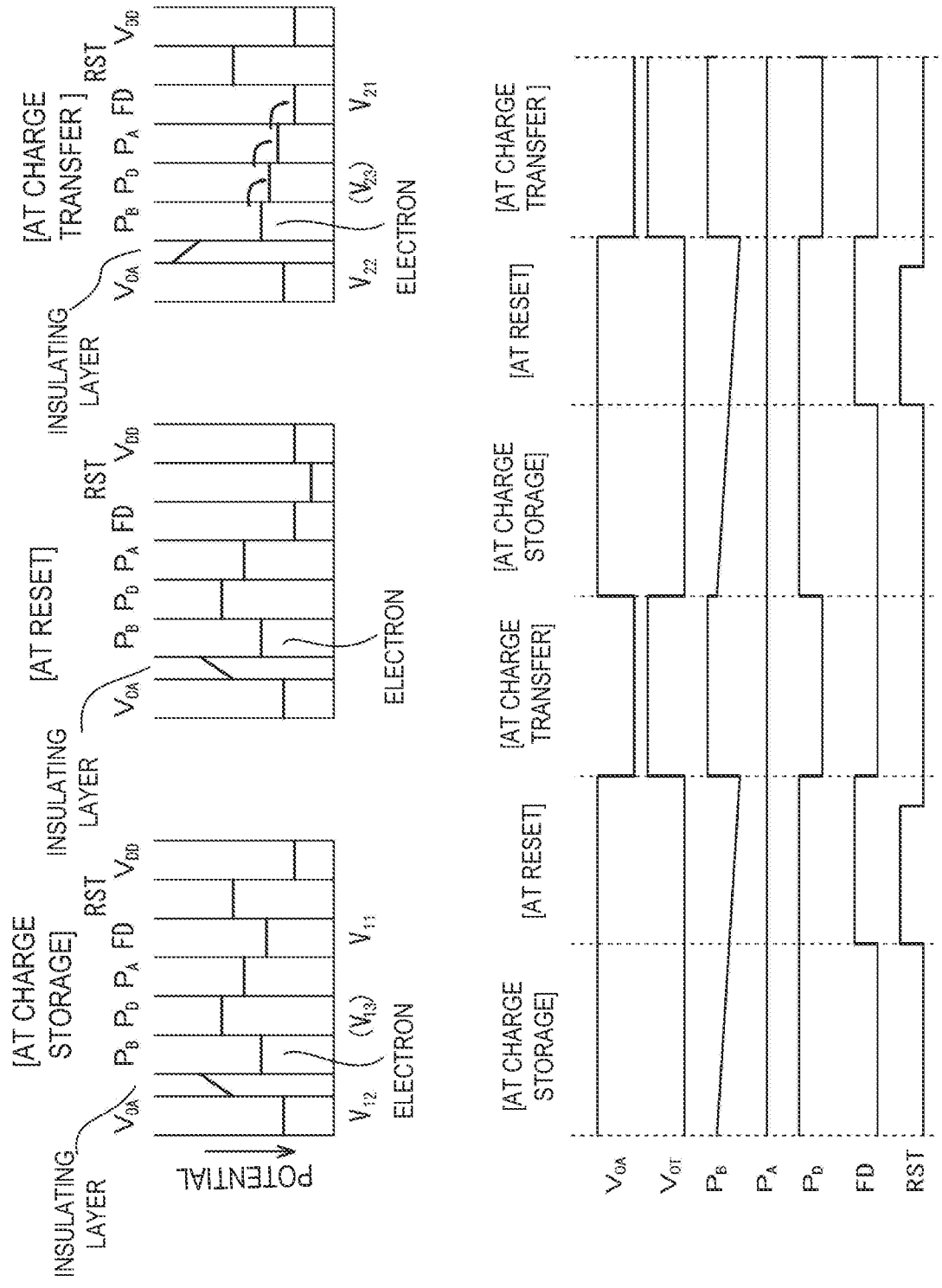
FIG. 10 is a diagram schematically showing a potential state in each portion during another operation of the imaging element of Embodiment 1.
Figure 11:
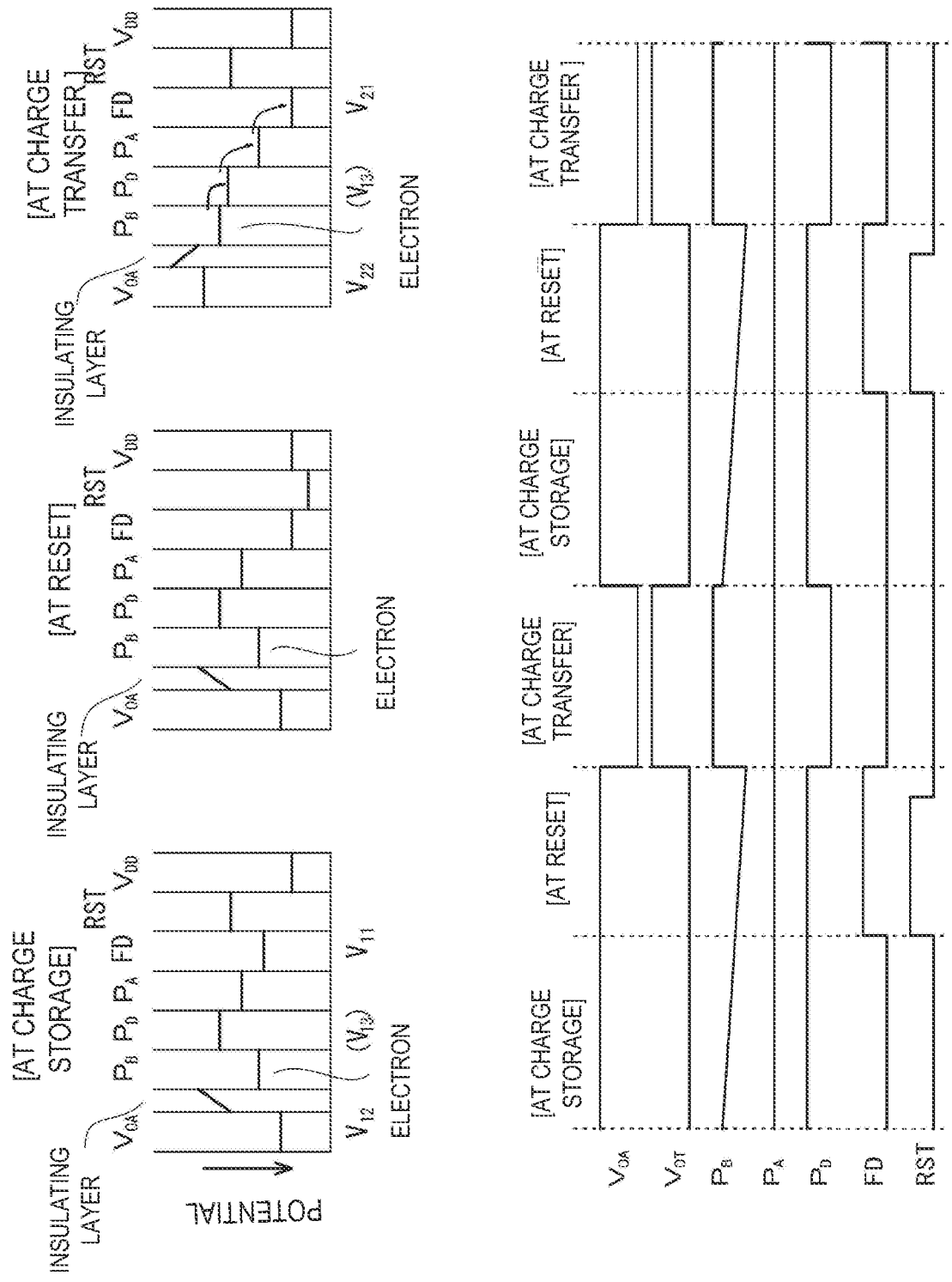
FIG. 11 is a diagram schematically showing a potential state in each portion during still another operation of the imaging element of Embodiment 1.
Figure 64:
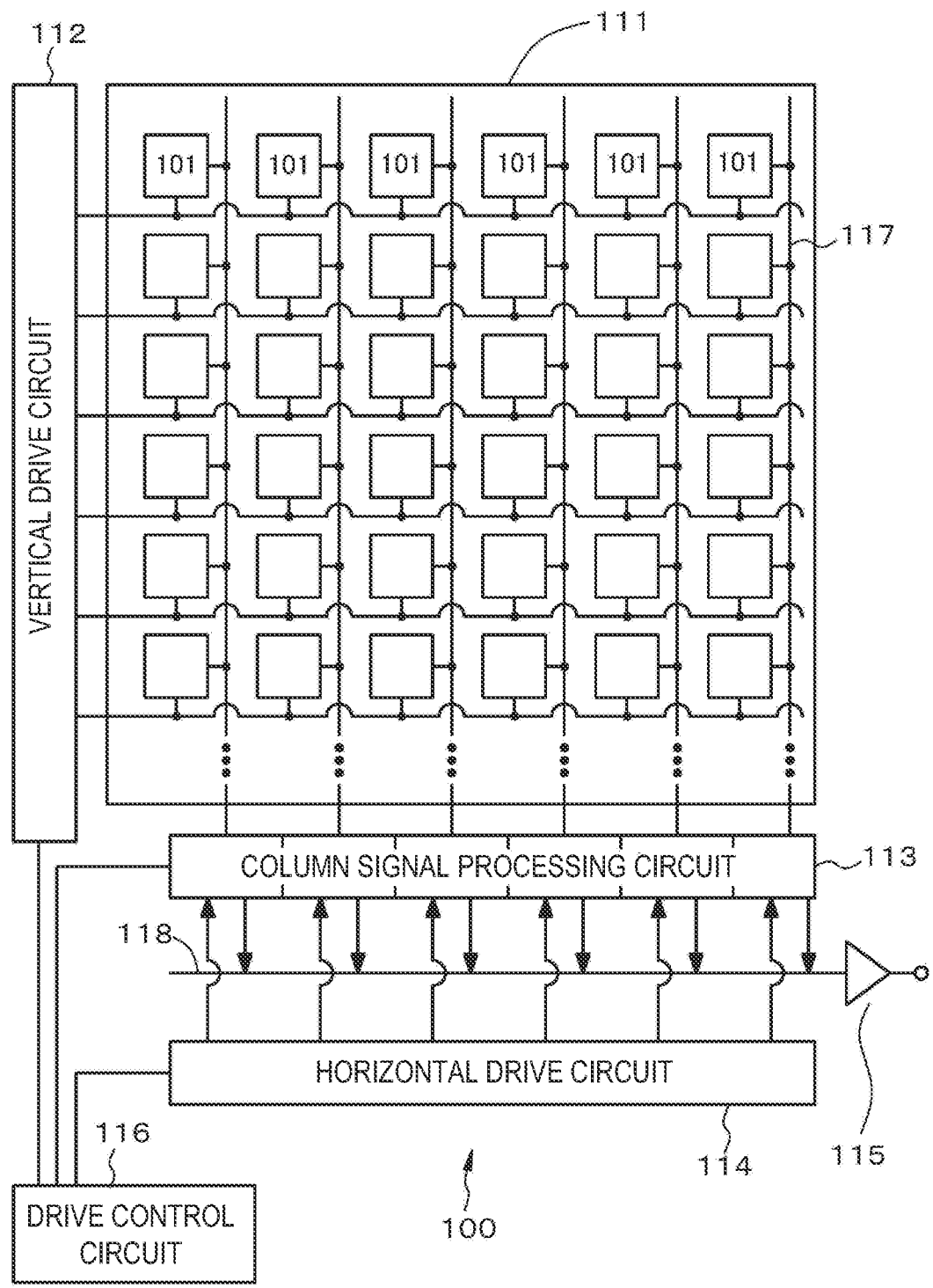
FIG. 64 is a conceptual diagram of a solid-state imaging apparatus of Embodiment 1.

Schematic partial sectional views of the imaging element and the stacked-type imaging element (hereinafter simply referred to as an "imaging element" in some cases) of Embodiment 1 are shown in FIGS. 1 and 2. A schematic arrangement view of a transistor included in a first electrode, a charge storage electrode, a transfer control electrode, and a control unit is shown in FIG. 3. A schematic arrangement view of a first electrode, a charge storage electrode, and a transfer control electrode is shown in FIG. 4. Further, FIG. 1 is a schematic partial sectional view along the arrow A-A of FIG. 3 and FIG. 2 is a schematic partial section view along the arrow B-B of FIG. 3. Here, FIG. 2 and FIGS. 30, 31, 53, 57, and 59 to be described below are simplified for convenience by denoting various imaging element constituent elements located below an interlayer insulating layer 81 indicated collectively by reference number 13. Furthermore, schematic plan views of the first electrode, the charge storage electrode, the transfer control electrode, and the like according to a modified example of the imaging element of Embodiment 1 are shown in FIGS. 5A, 5B, and 5C. Equivalent circuit diagrams of the imaging element of Embodiment 1 are shown in FIGS. 7 and 8. A potential state of each portion during an operation of the imaging element of Embodiment 1 is schematically shown in FIGS. 9, 10, and 11. Furthermore, to describe each portion of FIGS. 9, 10, and 11, an equivalent circuit diagram of the imaging element of Embodiment 1 is shown in FIG. 6A and a conceptual diagram of the solid-state imaging apparatus of Embodiment 1 is shown in FIG. 64.

The imaging element of Embodiment 1 includes a photoelectric conversion unit formed by stacking a first electrode 21, a photoelectric conversion layer 23, and a second electrode 22, the photoelectric conversion unit further includes
a charge storage electrode 24 that has an opposite region opposite to the first electrode 21 via an insulating layer 82 and
a transfer control electrode (charge transfer electrode) 25 opposite to the first electrode 21 and the charge storage electrode 24 via the insulating layer 82, and
the photoelectric conversion layer 23 is disposed above at least the charge storage electrode 24 (specifically, above at least the charge storage electrode 24 and the transfer control electrode 25) via the insulating layer 82. Further, light is incident from the second electrode side.

The stacked-type imaging element of Embodiment 1 includes at least one imaging element of Embodiment 1. Furthermore, the solid-state imaging apparatus of Embodiment 1 includes the plurality of imaging elements of Embodiment 1 or the plurality of stacked-type imaging elements including at least one imaging element of Embodiment 1. Further, for example, a digital still camera, a video camera, a camcorder, a surveillance camera, a vehicle-mounted camera (in-vehicle camera), a smartphone camera, a game user interface camera, a biometric authentication camera, and the like can be configured from the solid-state imaging apparatus according to Embodiment 1.

A planar shape of the charge storage electrode 24 is a rectangle that has four corners including a first corner 24a, a second corner 24b, a third corner 24c, and a fourth corner 24d. The first corner 24a corresponds to an opposite region. In the example shown in FIGS. 3 and 4, two sides of the charge storage electrode 24 on both sides of each corner are orthogonal to each other. On the other hand, in examples shown in FIGS. 5A, 5B, and 5C, the first corner 24a has roundness or the first corner 24a is chamfered (the first corner 24a is notched). Furthermore, in a chamfered portion of the first corner 24a, corners of the first electrode 21 and the transfer control electrode 25 also have roundness. The planar shape of the first electrode 21 can also be circular. Further, in FIG. 5C, a part of the transfer control electrode 25 opposite to the charge storage electrode 24 protrudes more than in FIG. 5B. In FIGS. 4, 5A, 5B, and 5C, the first electrode 21, the charge storage electrode 24, and the transfer control electrode 25 in FIG. 3 are extracted and redrawn.

Further, the transfer control electrode 25 includes two transfer control electrode segments $25SG_1$ and $25SG_2$. Two sides $24S_1$ and $24S_2$ of the charge storage electrode 24 and two transfer control electrode segments $25SG_1$ and $25SG_2$ located on both sides of the opposite region 24a are disposed adjacent to each other via the insulating layer 82. Moreover, when two sides of the charge storage electrode 24 on both sides of the opposite region 24a are a first side $24S_1$ and a second side $24S_2$, a length of the first side $24S_1$ is $L_1$, a length of the second side $24S_2$ is $L_2$, a distance $LL_1$ between the first electrode 21 and an end of the transfer control electrode segment $25SG_1$ along the first side $24S_1$ is in the range of $0.02 \times L_1$ to $0.5 \times L_1$ (specifically, $0.2 \times L_1$) and a distance $LL_2$ between the first electrode 21 and an end of the transfer control electrode segment $25SG_2$ along the second side $24S_2$ is in the range of $0.02 \times L_2$ to $0.5 \times L_2$ (specifically, $0.2 \times L_2$). Furthermore, the transfer control electrode (the charge transfer electrode) 25 is connected to a pixel drive circuit included in a drive circuit via a connection hole 68B, a pad portion 68A, and a wiring $V_{OT}$ provided in the interlayer insulating layer 81.

The imaging element of Embodiment 1 further includes the semiconductor substrate (more specifically, silicon semiconductor layer) 70 is further included, and the photoelectric conversion unit is disposed above the semiconductor substrate 70. Furthermore, a control unit which is disposed on the semiconductor substrate 70 and has a drive circuit connected to the first electrode 21 and the second electrode 22 is further included. Here, the light incident surface of the semiconductor substrate 70 is defined as an above side, and the opposite side of the semiconductor substrate 70 is defined as a below side. A wiring layer 62 including a plurality of wirings is disposed below the semiconductor substrate 70.

The semiconductor substrate 70 further includes at least a floating diffusion layer $FD_1$ and an amplification transistor $TR1_{amp}$ forming the control unit, and the first electrode 21 is connected to the gate section of the floating diffusion layer $FD_1$ and the amplification transistor $TR1_{amp}$. The semiconductor substrate 70 further includes a reset transistor $TR1_{rst}$ and select transistor $TR1_{sel}$ forming the control unit. The floating diffusion layer $FD_1$ is connected to a source/drain region of one side of the reset transistor $TR1_{rst}$, and a source/drain region of one side of the amplification transistor $TR1_{amp}$ is connected to a source/drain region of one side of the select transistor $TR1_{sel}$, and a source/drain region of another side of the select transistor $TR1_{sel}$ is connected to the signal line $VSL_1$. The above-described amplification transistor $TR1_{amp}$, reset transistor $TR1_{rst}$, and select transistor $TR1_{sel}$ form the drive circuit.

Specifically, the imaging element of Embodiment 1 is a back surface illuminated type imaging element, and has a structure in which a first-type green imaging element of Embodiment 1 (hereinafter, referred to as "first imaging element") having a first-type green photoelectric conversion layer which absorbs green light and having sensitivity to green light, a second-type conventional blue imaging element (hereinafter, referred to as "second imaging element") having a second-type photoelectric conversion layer which absorbs blue light and having sensitivity to blue light, and a second-type conventional red imaging element (hereinafter, referred to as "third imaging element") having a second-type photoelectric conversion layer which absorbs red light and having sensitivity to red light are stacked. Here, the red imaging element (third imaging element) and the blue imaging element (second imaging element) are provided in the semiconductor substrate 70, and the second imaging element is located more closer to the light incident side as compared to the third imaging element. Furthermore, the green imaging element (first imaging element) is provided above the blue imaging element (second imaging element). One pixel is formed by the stacked structure of the first imaging element, the second imaging element, and the third imaging element. No color filter layer is provided.

In the first imaging element, the first electrode 21, the charge storage electrode 24, the transfer control electrode 25 are formed apart from each other on the interlayer insulating layer 81. The interlayer insulating layer 81, the charge storage electrode 24, and the transfer control electrode 25 are covered with an insulating layer 82. The photoelectric conversion layer 23 is formed on the insulating layer 82 and the second electrode 22 is formed on the photoelectric conversion layer 23. An insulating layer 83 is formed on the entire surface including the second electrode 22, and an on-chip microlens 14 is provided on the insulating layer 83. No color filter layer is provided. The first electrode 21, the charge storage electrode 24, the transfer control electrode 25, and the second electrode 22 include a transparent electrode including ITO (work function: about 4.4 eV), for example. The photoelectric conversion layer 23 includes a layer containing at least a known organic photoelectric conversion material sensitive to green light (e.g., organic material such as rhodamine-based pigment, melacyanine-based pigment, quinacridone, or the like). The interlayer insulating layer 81 and the insulating layers 82 and 83 include a known insulating material (e.g., $SiO_2$ or SiN). The photoelectric conversion layer 23 and the first electrode 21 are connected by the connection portion 67 provided on the insulating layer 82. The photoelectric conversion layer 23 extends in the connection portion 67. That is, the photoelectric conversion layer 23 extends in an opening 85 provided in the insulating layer 82 and is connected to the first electrode 21.

The charge storage electrode 24 and the transfer control electrode 25 (the transfer control electrode segments $25SG_1$ and $25SG_2$) are connected to the drive circuit. Specifically, the charge storage electrode 24 is connected to a vertical drive circuit 112 forming the drive circuit via a connection hole 66, a pad portion 64, and a wiring $V_{OA}$ provided in the interlayer insulating layer 81. Further, the transfer control electrode 25 is connected to a vertical drive circuit 112 forming the drive circuit via a connection hole 68B, a pad portion 68A, and a wiring $V_{OT}$ provided in the interlayer insulating layer 81.

The size of the charge storage electrode 24 is larger than that of the first electrode 21. When an area of the charge storage electrode 24 is defined as $S_1'$ and an area of the first electrode 21 is defined as $S_1$, it is preferable to satisfy $4 \leq S_1'/S_1$, but the present disclosure is not limited thereto, and in Embodiment 1, for example, $S_1'/S_1=8$, but the present disclosure is not limited thereto. Further, in Embodiments 9 to 13 which will be described below, three photoelectric conversion unit segments $10'_1$, $10'_2$, and $10'_3$ have the same size and have the same planar shape.

An element separation region 71 is formed on the side of the first surface (front surface) 70A of the semiconductor substrate 70, and an oxide film 72 is formed on the first surface 70A of the semiconductor substrate 70. Moreover, a reset transistor $TR1_{rst}$, an amplification transistor $TR1_{amp}$, and select transistor $TR1_{sel}$ forming the control unit of the first imaging element are provided on the side of the first surface of the semiconductor substrate 70, and a first floating diffusion layer $FD_1$ is further provided.

The reset transistor $TR1_{rst}$ includes a gate section 51, a channel forming region 51A, and source/drain regions 51B and 51C. The gate section 51 of the reset transistor $TR1_{rst}$ is connected to the reset line $RST_1$, and the source/drain region 51C of one side of the reset transistor $TR1_{rst}$ also functions as the first floating diffusion layer $FD_1$, and the source/drain region 51B of another side is connected to the power supply $V_{DD}$.

The first electrode 21 is connected to a source/drain region 51C (first floating diffusion layer $FD_1$) of one side of the reset transistor $TR1_{rst}$ via a connection hole 65 and a pad portion 63 provided in the interlayer insulating layer 81, a contact hole portion 61 formed in the semiconductor substrate 70 and the interlayer insulating layer 76, and the wiring layer 62 formed in the interlayer insulating layer 76.

The amplification transistor $TR1_{amp}$ includes a gate section 52, a channel forming region 52A, and source/drain regions 52B and 52C. The gate section 52 is connected to the first electrode 21 and the source/drain region 51C (first floating diffusion layer $FD_1$) of one side of the reset transistor $TR1_{rst}$ through the wiring layer 62. Furthermore, the source/drain region 52B of one side is connected to power supply $V_{DD}$.

The select transistor $TR1_{sel}$ includes a gate section 53, a channel forming region 53A, and source/drain regions 53B and 53C. The gate section 53 is connected to a select line $SEL_1$. Furthermore, the source/drain region 53B of one side shares a region with the source/drain region 52C of another side forming the amplification transistor $TR1_{amp}$, and the source/drain region 53C is connected to a signal line (data output line) $VSL_1$ (117).

The second imaging element includes an n-type semiconductor region 41 provided in the semiconductor substrate 70 as a photoelectric conversion layer. A gate section 45 of a transfer transistor $TR2_{trs}$ including the vertical transistor extends to the n-type semiconductor region 41 and is connected to a transfer gate line $TG_2$. Furthermore, a second floating diffusion layer $FD_2$ is provided in a region 45C of the semiconductor substrate 70 near the gate section 45 of the transfer transistor $TR2_{trs}$. Charges stored in the n-type semiconductor region 41 are read out to the second floating diffusion layer $FD_2$ via a transfer channel formed along the gate section 45.

In the second imaging element, a reset transistor $TR2_{rst}$, an amplification transistor $TR2_{amp}$, and a select transistor $TR2_{sel}$ forming the control unit of the second imaging element are further provided on the first surface side of the semiconductor substrate 70.

The reset transistor $TR2_{rst}$ includes the gate section, the channel forming region, and the source/drain region. The gate section of the reset transistor $TR2_{rst}$ is connected to a reset line $RST_2$, and a source/drain region of one side of the reset transistor $TR2_{rst}$ is connected to the power supply $V_{DD}$, and a source/drain region of another side also functions as the second floating diffusion layer $FD_2$.

The amplification transistor $TR2_{amp}$ includes the gate section, the channel forming region, and the source/drain region. The gate section is connected to a source/drain region (second floating diffusion layer $FD_2$) of another side of the reset transistor $TR2_{rst}$. Furthermore, a source/drain region of one side is connected to the power supply $V_{DD}$.

The select transistor $TR2_{sel}$ includes the gate section, the channel forming region, and the source/drain region. The gate section is connected to a select line $SEL_2$. Furthermore, a source/drain region of one side shares a region with a source/drain region of another side forming the amplification transistor $TR2_{amp}$, and a source/drain region of another side is connected to a signal line (data output line) $VSL_2$.

The third imaging element has an n-type semiconductor region 43 provided in the semiconductor substrate 70 as a photoelectric conversion layer. A gate section 46 of a transfer transistor $TR3_{trs}$ is connected to a transfer gate line $TG_3$. Furthermore, a third floating diffusion layer $FD_3$ is provided in a region 46C of the semiconductor substrate 70 near the gate section 46 of the transfer transistor $TR3_{trs}$. Charges stored in the n-type semiconductor region 43 are read out to the third floating diffusion layer $FD_3$ via a transfer channel 46A formed along the gate section 46.

In the third imaging element, a reset transistor $TR3_{rst}$, an amplification transistor $TR3_{amp}$, and a select transistor $TR3_{sel}$ forming the control unit of the third imaging element are further provided on the first surface side of the semiconductor substrate 70.

The reset transistor $TR3_{rst}$ includes the gate section, the channel forming region, and the source/drain region. The gate section of the reset transistor $TR3_{rst}$ is connected to a reset line $RST_3$, and a source/drain region of one side of the reset transistor $TR3_{rst}$ is connected to the power supply $V_{DD}$, and a source/drain region of another side also functions as the third floating diffusion layer $FD_3$.

The amplification transistor $TR3_{amp}$ includes the gate section, the channel forming region, and the source/drain region. The gate section is connected to the source/drain region (third floating diffusion layer $FD_3$) of another side of the reset transistor $TR3_{rst}$. Furthermore, a source/drain region of one side is connected to the power supply $V_{DD}$.

The select transistor $TR3_{sel}$ includes the gate section, the channel forming region, and the source/drain region. The gate section is connected to a select line $SEL_3$. Furthermore, a source/drain region of one side shares a region with a source/drain region of another side forming the amplification transistor $TR3_{amp}$, and a source/drain region of another side is connected to a signal line (data output line) $VSL_3$.

Reset lines $RST_1$, $RST_2$, and $RST_3$, select lines $SEL_1$, $SEL_2$, and $SEL_3$, and transfer gate lines $TG_2$ and $TG_3$ are connected to the vertical drive circuit 112 forming the drive circuit, and the signal lines (data output lines) $VSL_1$, $VSL_2$, and $VSL_3$ are connected to a column signal processing circuit 113 forming the drive circuit.

A $p^+$ layer 44 is provided between the n-type semiconductor region 43 and the surface 70A of the semiconductor substrate 70 to suppress generation of dark current. A $p^+$ layer 42 is formed between the n-type semiconductor region 41 and the n-type semiconductor region 43, and a part of the side surface of the n-type semiconductor region 43 is surrounded by the $p^+$ layer 42. A $p^+$ layer 73 is formed on the side of a back surface 70B of the semiconductor substrate 70, and an $HfO_2$ film 74 and an insulating material film 75 are formed in a portion of the semiconductor substrate 70 where the contact hole portion 61 is to be formed from the $p^+$ layer 73. In the interlayer insulating layer 76, wirings are formed over a plurality of layers, but are omitted from illustration.

The $HfO_2$ film 74 is a film having a negative fixed charge, and generation of dark current can be suppressed by providing such a film. Instead of the $HfO_2$ film, an aluminum oxide ($Al_2O_3$) film, a zirconium oxide ($ZrO_2$) film, a tantalum oxide ($Ta_2O_5$) film, a titanium oxide ($TiO_2$) film, a lanthanum oxide ($La_2O_3$) film, a praseodymium oxide ($Pr_2O_3$) film, a cerium oxide ($CeO_2$) film, a neodymium oxide ($Nd_2O_3$) film, a promethium oxide ($Pm_2O_3$) film, a samarium oxide ($Sm_2O_3$) film, a europium oxide ($Eu_2O_3$) film, a gadolinium oxide ($Gd_2O_3$) film, a terbium oxide ($Tb_2O_3$) film, a dysprosium oxide ($Dy_2O_3$) film, a holmium oxide ($Ho_2O_3$) film, a thulium oxide ($Tm_2O_3$) film, a ytterbium oxide ($Yb_2O_3$) film, a lutetium oxide ($Lu_2O_3$) film, a yttrium oxide ($Y_2O_3$) film, a hafnium nitride film, an aluminum nitride film, a hafnium oxynitride film, and an aluminum oxynitride film may be used. Examples of the film forming method of these films include a CVD method, a PVD method, and an ALD method.

Hereinafter, the operation of the stacked-type imaging elements (first imaging element) of Embodiment 1 will be described with reference to FIGS. 9, 10, and 11. Note that FIGS. 9, 10, and 11 are different in values of a potential applied to the charge storage electrode 24 and a potential at point $P_D$. Here, the potential of the first electrode 21 is higher than the potential of the second electrode 22. That is, for example, the first electrode 21 is set to a positive potential and the second electrode 22 is set to a negative potential, and photoelectric conversion is performed in the photoelectric conversion layer 23, and generated electrons are read out to the floating diffusion layer. This also applies to other embodiments.

Figure 35:
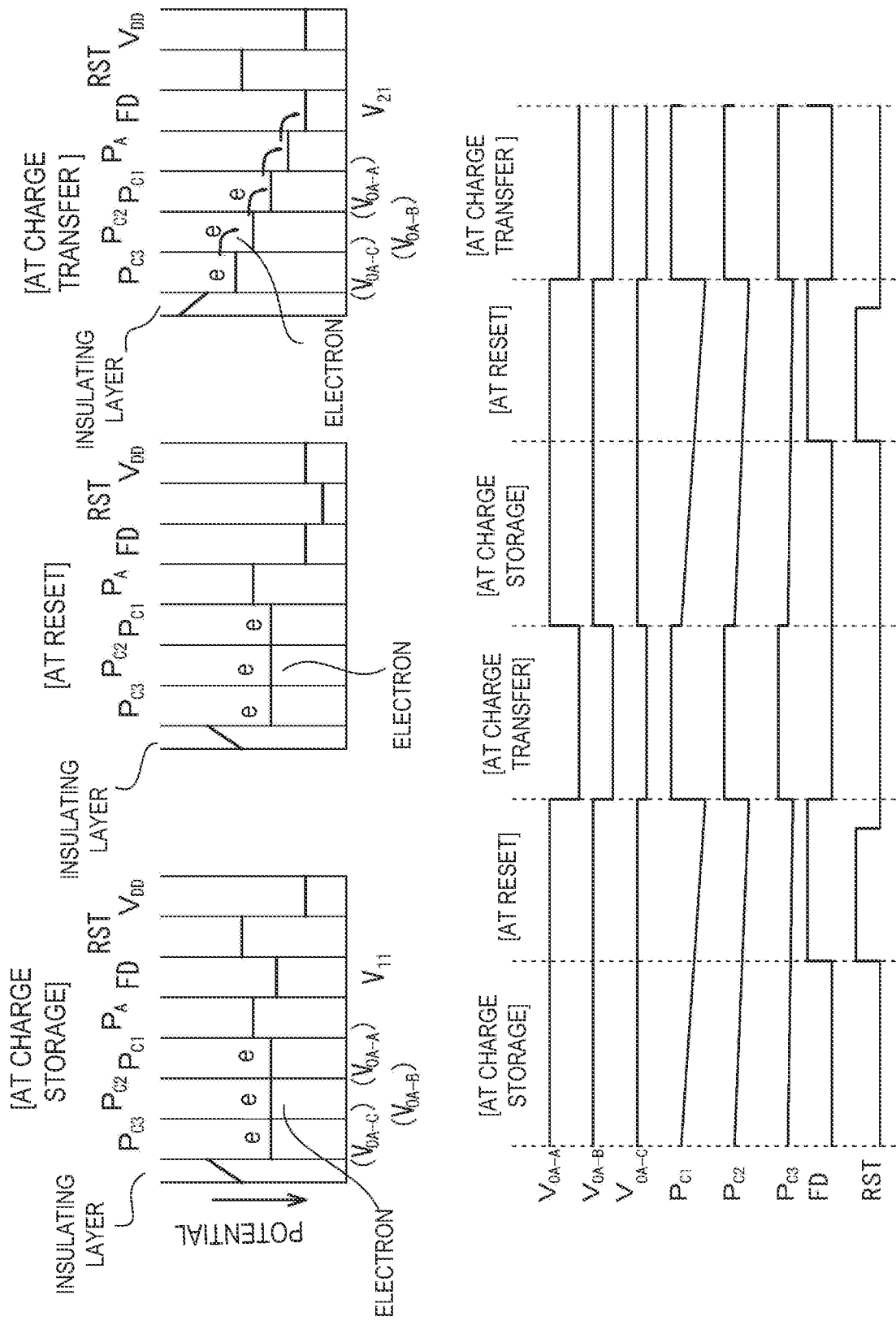
FIG. 35 is a view schematically showing a potential state in each portion during an operation of the imaging element of Embodiment 9.
Figure 36:
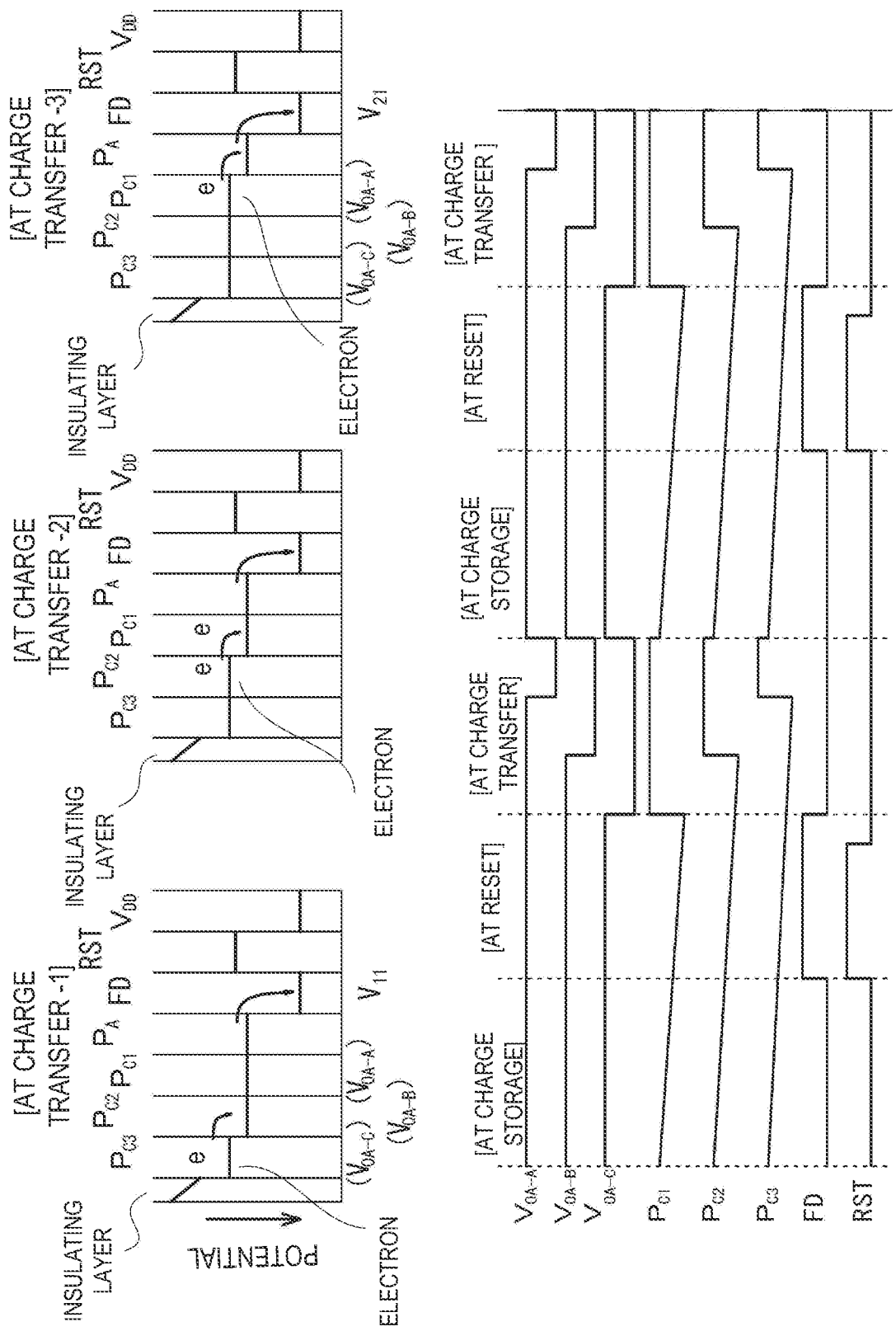
FIG. 36 is a view schematically showing a potential state in each portion during another operation (during transfer) of the imaging element of Embodiment 9.

The reference symbols used in FIGS. 9, 10, 11, FIG. 35 in Example 9, and FIG. 36 are as follows.

$P_A$: a potential at point $P_A$ of the photoelectric conversion layer 23 opposite to the region located between the charge storage electrode 24 or the transfer control electrode (charge transfer electrode) 25 and the first electrode 21

$P_B$: a potential at point $P_B$ in a region of the photoelectric conversion layer 23 opposite to the charge storage electrode 24

$P_{C1}$: a potential at point $P_{C1}$ in a region of the photoelectric conversion layer 23 opposite to the charge storage electrode segment 24A $P_{C2}$: a potential at point $P_{C2}$ in a region of the photoelectric conversion layer 23 opposite to the charge storage electrode segment 24B $P_{C3}$: a potential at point $P_{C3}$ in a region of the photoelectric conversion layer 23 opposite to the charge storage electrode segment 24C $P_D$: a potential at point $P_D$ in a region of the photoelectric conversion layer 23 opposite to the transfer control electrode (charge transfer electrode) 25

FD: a potential of the first floating diffusion layer $FD_1$ $V_{OA}$: a potential of the charge storage electrode 24

$V_{OA-A}$: a potential of the charge storage electrode segment 24A $V_{OA-B}$: a potential of the charge storage electrode segment 24B $V_{OA-C}$: a potential of the charge storage electrode segment 24C $V_{OT}$: a potential of the transfer control electrode (charge transfer electrode) 25

RST: a potential of the gate section 51 of the reset transistor $TR1_{rst}$ $V_{DD}$: a potential of the power supply $VSL_1$: the signal line (data output line) $VSL_1$ $TR1_{rst}$: the reset transistor $TR1_{rst}$ $TR1_{amp}$: the amplification transistor $TR1_{amp}$ $TR1_{sel}$: the select transistor $TR1_{sel}$ In Embodiment 1, during a charge storage period, a potential $V_{11}$ is applied from the drive circuit to the first electrode 21, a potential $V_{12}$ is applied from the drive circuit to the charge storage electrode 24, a potential $V_{13}$ is applied from the drive circuit to the transfer control electrode 25, and a charge is stored in the photoelectric conversion layer 23, during a charge transfer period, a potential $V_{21}$ is applied from the drive circuit to the first electrode 21, a potential $V_{22}$ is applied from the drive circuit to the charge storage electrode 24, a potential $V_{23}$ or the potential $V_{13}$ is applied from the drive circuit to the transfer control electrode 25, the charge stored in the photoelectric conversion layer 23 is read to the control unit via the first electrode 21. Because a potential of the first electrode 21 is higher than a potential of the second electrode 22, $V_{12}>V_{13}$ and $V_{22} \leq V_{23} \leq V_{21}$ (preferably $V_{22}<V_{23}<V_{21}$), or $V_{12}>V_{13}$ and $V_{22} \leq V_{13} \leq V_{21}$ (preferably $V_{22}<V_{13}<V_{21}$). Further, in a case where the potential of the first electrode is higher than the potential of the second electrode, it is desirable that $V_{12}>V_{11}$ (preferably $V_{12}=V_{11}$). In a case where the potential of the second electrode is higher than the potential of the first electrode, it is desirable that $V_{11} \geq V_{12}$ (preferably $V_{11}=V_{12}$).

Specifically, in the charge storage period, the potential $V_{11}$ is applied to the first electrode 21, the potential $V_{12}$ is applied to the charge storage electrode 24, and the potential $V_{13}$ is applied to the transfer control electrode 25 from the drive circuit. Photoelectric conversion occurs in the photoelectric conversion layer 23 by light incident on the photoelectric conversion layer 23. The holes generated by the photoelectric conversion are sent from the second electrode 22 to the drive circuit via a wiring $V_{OU}$. On the other hand, since the potential of the first electrode 21 is higher than the potential of the second electrode 22, that is, for example, a positive potential is applied to the first electrode 21 and a negative potential is applied to the second electrode 22, and thus $V_{12}>V_{13}$ (for example, $V_{12} \geq V_{11}>V_{13}$ or $V_{11}>V_{12}>V_{13}$). As a result, the electrons generated by the photoelectric conversion are attracted to the charge storage electrode 24 and stop at the region of the photoelectric conversion layer 23 opposite to the charge storage electrode 24. That is, charges are stored in the photoelectric conversion layer 23. Since $V_{12}>V_{13}$, electrons generated in the photoelectric conversion layer 23 surely can be prevented from moving toward the first electrode 21. As the photoelectric conversion time elapses, the potential in the region of the photoelectric conversion layer 23 opposite to the charge storage electrode 24 becomes a more negative value.

A reset operation is performed at the latter stage of the charge storage period. As a result, the potential of the first floating diffusion layer $FD_1$ is reset such that the potential of the first floating diffusion layer $FD_1$ becomes the potential $V_{DD}$ of the power supply.

After the reset operation is completed, charges are read out. That is, in the charge transfer period, the potential $V_{21}$ is applied to the first electrode 21, the potential $V_{22}$ is applied to the charge storage electrode 24, and the potential $V_{23}$ or the potential $V_{13}$ is applied to the transfer control electrode 25, from the drive circuit. Here, it is assumed that $V_{22} \leq V_{23} \leq V_{21}$ and preferably $V_{22}<V_{23}<V_{21}$ (see FIGS. 9 and 10). Alternatively, it is assumed that $V_{22} \leq V_{13} \leq V_{21}$ and preferably $V_{22}<V_{13}<V_{21}$ (see FIG. 11). That is, an embodiment in which the potential of the transfer control electrode 25 is fixed during the charge storage period, the reset operation, and the charge transfer period and a potential which is applied to the charge storage electrode 24 is moved vertically during the charge storage period and the charge transfer period may be adopted. Further, as a result, electrons that have stopped in the region of the photoelectric conversion layer 23 opposite to the charge storage electrode 24 are reliably read out to the first electrode 21 and further to the first floating diffusion layer $FD_1$. That is, the charges stored in the photoelectric conversion layer 23 are read out to the control unit.

Thus, a series of operations including charge storage, reset operation, charge transfer, and the like is completed.

The operations of the amplification transistor $TR1_{amp}$ and the select transistor $TR1_{sel}$ after the electrons are read out to the first floating diffusion layer $FD_1$ are the same as those of the conventional transistors. Further, for example, a series of operations such as charge storage, reset operation, and charge transfer of the second imaging element and the third imaging element are similar to a series of conventional operations such as charge storage, reset operation, and charge transfer. Furthermore, the reset noise of the first floating diffusion layer $FD_1$ can be removed by a correlated double sampling (CDS) process as in the related art.

As described above, in Embodiment 1, a charge storage electrode which is disposed to be spaced apart from the first electrode and disposed opposite to the photoelectric conversion layer via an insulating layer is included, and thus, when the photoelectric conversion layer is irradiated with light such that photoelectric conversion occurs in the photoelectric conversion layer, a type of capacitor is formed by the photoelectric conversion layer, the insulating layer, and the charge storage electrode, and charges can be stored in the photoelectric conversion layer. Therefore, at the start of exposure, it becomes possible to completely deplete the charge storage portion and remove charges. As a result, it is possible to suppress occurrence of a phenomenon in which kTC noise increases, random noise worsens, and degradation of the image quality is caused. Furthermore, since all the pixels can be reset simultaneously, a so-called global shutter function can be realized.

In addition, the transfer control electrode disposed adjacent to the charge storage electrode and the first electrode via the insulating layer and disposed opposite to the photoelectric conversion layer via the insulating layer is further included. Therefore, when the charges stored in the photoelectric conversion layer are transferred to the first electrode, high controllability can be attained. In addition, since it is not necessary to decrease the area of the charge storage electrode in the disposition of the transfer control electrode, it is possible to suppress occurrence of the problem that an amount of saturated charges in the photoelectric conversion layer decreases or sensitivity degrades.

FIG. 64 shows a conceptual diagram of a solid-state imaging apparatus of Embodiment 1. The solid-state imaging apparatus 100 of Embodiment 1 includes an imaging region 111 in which the stacked-type imaging elements 101 are arranged in a two-dimensional array, a vertical drive circuit 112 as a drive circuit (peripheral circuit), a column signal processing circuit 113, a horizontal drive circuit 114, an output circuit 115, a drive control circuit 116, etc. These circuits may be formed by well-known circuits, and moreover, may be formed by using other circuit configurations (e.g., various circuits used in a conventional CCD solid-state imaging apparatus or CMOS solid-state imaging apparatus). In FIG. 64, the reference number "101" of the stacked-type imaging element 101 is only shown in one row.

The drive control circuit 116 generates a clock signal and a control signal which are the basis of the operations of the vertical drive circuit 112, the column signal processing circuit 113, and the horizontal drive circuit 114 on the basis of a vertical synchronization signal, a horizontal synchronization signal, and a master clock. Further, the generated clock signal and control signal are input to the vertical drive circuit 112, the column signal processing circuit 113, and the horizontal drive circuit 114.

The vertical drive circuit 112 includes, for example, a shift register, and selectively scans each stacked-type imaging element 101 in the imaging region 111 in the vertical direction in units of rows. Further, a pixel signal (image signal) based on the current (signal) generated according to the amount of light received by each stacked-type imaging element 101 is sent to the column signal processing circuit 113 via the signal lines (data output lines) 117 and VSL.

For example, the column signal processing circuit 113 is arranged for each column of the stacked-type imaging element 101, and signal processing for noise removal and signal amplification is performed on image signal output from the stacked-type imaging element 101 for one row in each imaging element by a signal from a black reference pixel (not shown, but formed around the effective pixel area). A horizontal selection switch (not shown) is provided in the output stage of the column signal processing circuit 113 so as to be connected to the horizontal signal line 118.

The horizontal drive circuit 114 includes, for example, a shift register, and sequentially selects each of the column signal processing circuits 113 by sequentially outputting horizontal scanning pulses, and outputs signals from each of the column signal processing circuits 113 to the horizontal signal line 118.

The output circuit 115 is performs signal processing on signals sequentially supplied from each of the column signal processing circuits 113 via the horizontal signal line 118 and outputs the signals.

Figure 12:
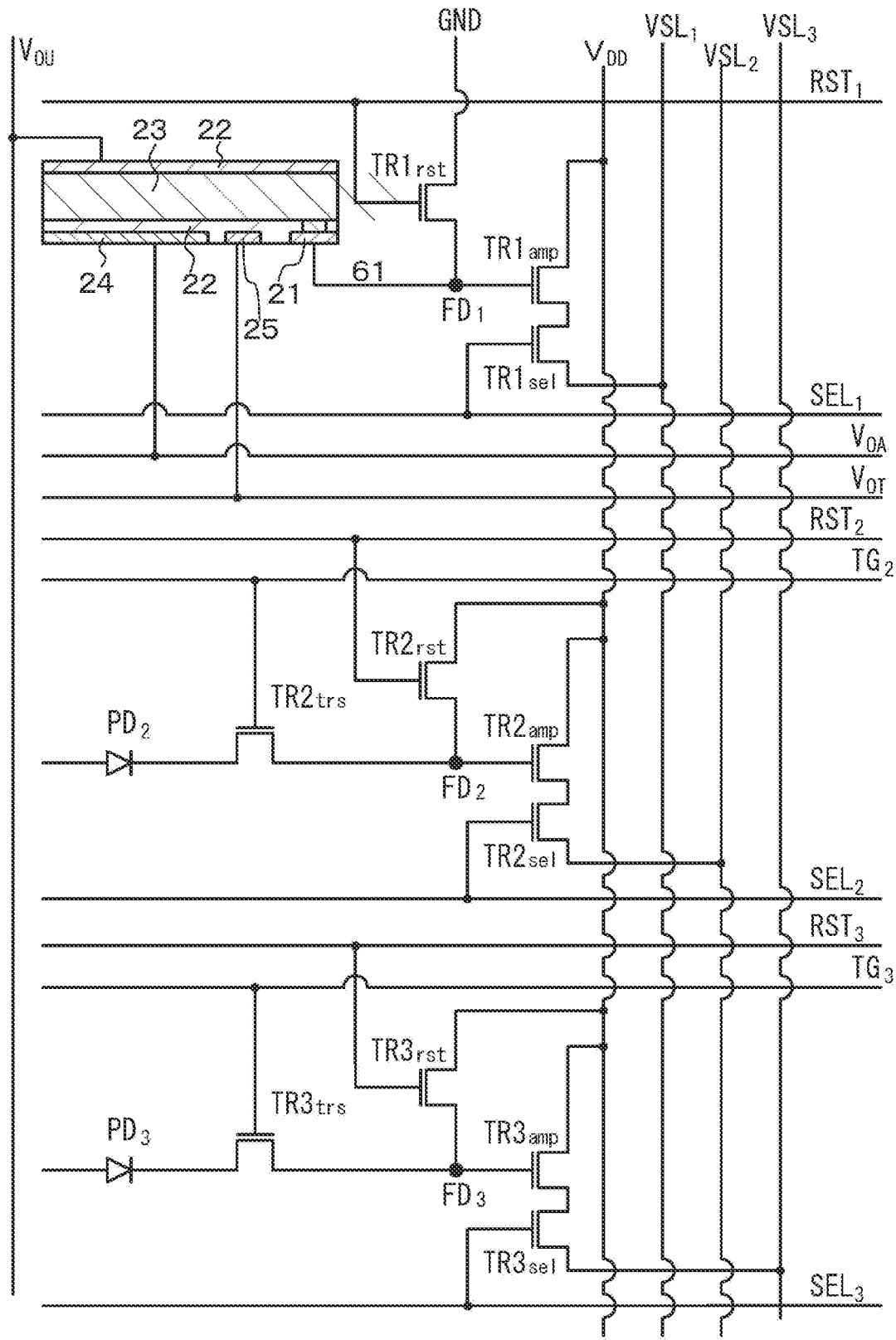
FIG. 12 is an equivalent circuit diagram of a modified example of the imaging element of Embodiment 1.
Figure 13:
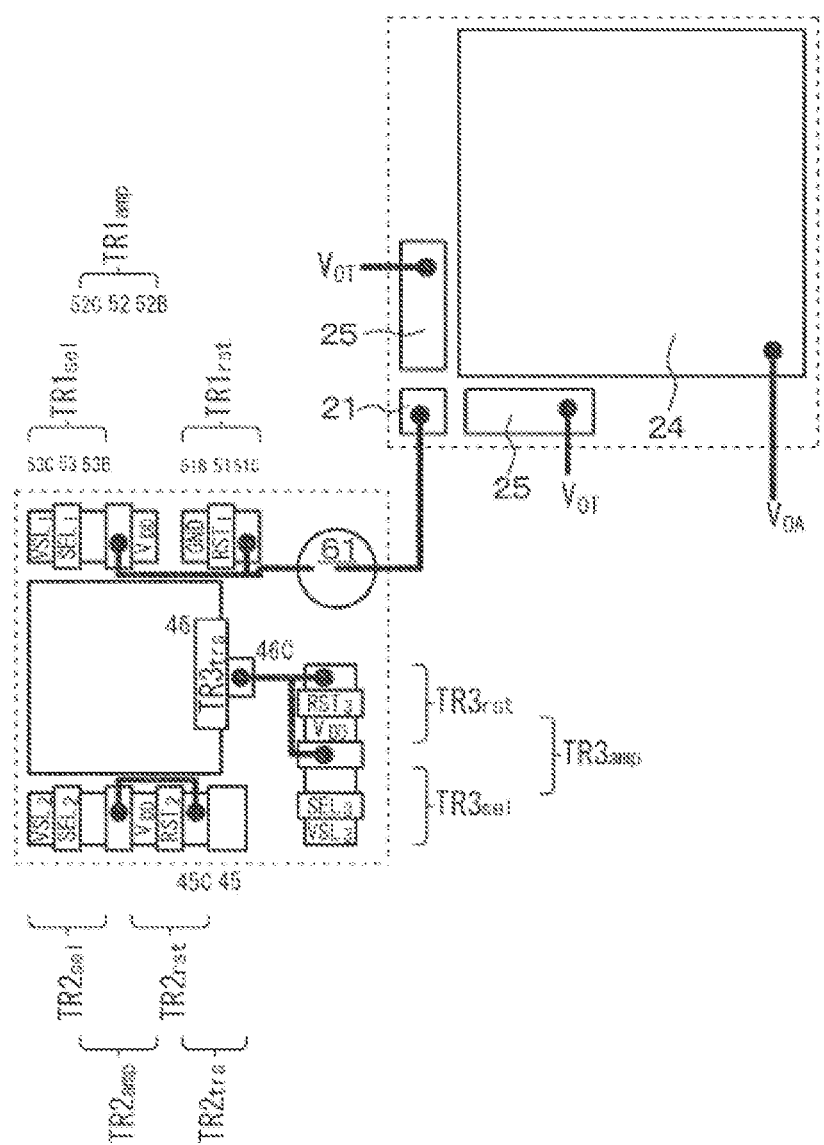
FIG. 13 is a schematic arrangement view of the first electrode, the charge storage electrode, and the transfer control electrode forming the modified example of the imaging element of Embodiment 1 shown in FIG. 12, and a transistor forming a control unit.

As shown in FIG. 12 showing an equivalent circuit diagram of a modified example of the imaging element of Embodiment 1 and in FIG. 13 showing the schematic arrangement of the first electrode, the charge storage electrode, and the transfer control electrode, and the transistor forming the control unit, the source/drain region 51B of another side of the reset transistor $TR1_{rst}$ may be grounded instead of being connected to the power supply $V_{DD}$.

The imaging element of Embodiment 1 may be manufactured by, for example, the following method. That is, first, an SOI substrate is prepared. Then, a first silicon layer is formed on the surface of the SOI substrate by an epitaxial growth method, and a $p^+$ layer 73 and an n-type semiconductor region 41 are formed in the first silicon layer. Next, a second silicon layer is formed on the first silicon layer by an epitaxial growth method, and the element separation region 71, the oxide film 72, the $p^+$ layer 42, the n-type semiconductor region 43, and the $p^+$ layer 44 are formed on the second silicon layer. Furthermore, various transistors and the like forming the control unit of the imaging element are formed on the second silicon layer, and the wiring layer 62, an interlayer insulating layer 76, and various wirings are further formed thereon, and then the interlayer insulating layer 76 and the supporting substrate (not shown) are bonded to each other. Thereafter, the SOI substrate is removed to expose the first silicon layer. Further, the surface of the second silicon layer corresponds to the surface 70A of the semiconductor substrate 70, and the surface of the first silicon layer corresponds to the back surface 70B of the semiconductor substrate 70. Furthermore, the first silicon layer and the second silicon layer are collectively referred to as the semiconductor substrate 70. Next, an opening for forming the contact hole portion 61 is formed on the side of the back surface 70B of the semiconductor substrate 70, and the $HfO_2$ film 74, the insulating material film 75, and the contact hole portion 61 are formed, and the pad portions 63, 64, and 68A, the interlayer insulating layer 81, the connection holes 65, 66, and 68B, the first electrode 21, the charge storage electrode 24, the transfer control electrode 25, and the insulating layer 82 are further formed. Next, the connection portion 67 is opened to form the photoelectric conversion layer 23, the second electrode 22, the insulating layer 83, and the on-chip microlens 14. Accordingly, the imaging element of Embodiment 1 may be obtained.

Furthermore, although illustration is omitted, the insulating layer 82 can have a configuration of two layers, an insulating lower layer and an insulating upper layer. That is, it is only required that the insulating lower layer is formed at least above the charge storage electrode 24, in a region between the charge storage electrode 24 and the first electrode 21, and in a region between the transfer control electrode 25 and the first electrode 21 (more specifically, the insulating lower layer is formed above the interlayer insulating layer 81 including the charge storage electrode 24), a flattening treatment is performed on the insulating lower layer, and subsequently the insulating upper layer is formed on the insulating lower layer, the charge storage electrode 24, and the transfer control electrode 25, and the flattening of the insulating layer 82 can thereby be reliably attained. Further, the connection portion 67 may be opened to the insulating layer 82 obtained in this way.

Embodiment 2

Figure 14A:
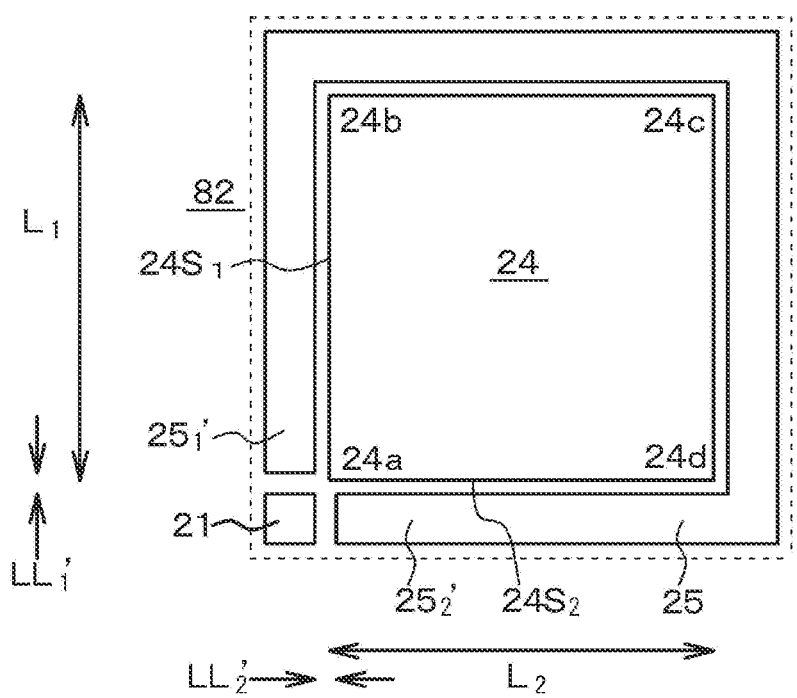
FIGS. 14A and 14B are schematic arrangement views of a first electrode, a charge storage electrode, and a transfer control electrode forming an imaging element of Embodiment 2.
Figure 14B:
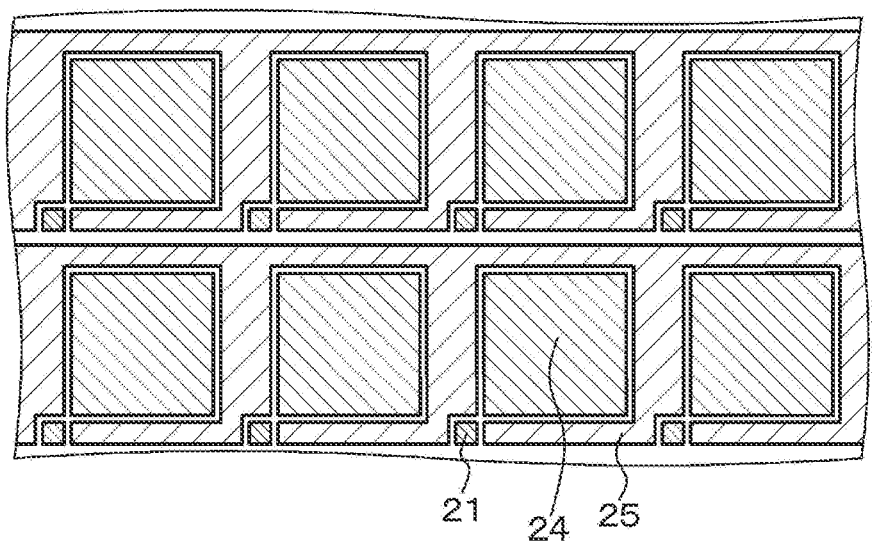

Embodiment 2 is a modification of Embodiment 1. As schematic plan views of the first electrode, the charge storage electrode, and the transfer control electrode included in the imaging element of Embodiment 2 are shown in FIGS. 14A and 14B, the transfer control electrode 25 surrounds the charge storage electrode 24 in a frame form. Further, when two sides of the charge storage electrode 24 on both sides of the opposite region 24a are a first side $24S_1$ and a second side $24S_2$, a length of the first side $24S_1$ is $L_1$, a length of the second side $24S_2$ is $L_2$, a distance $LL_1'$ between the first electrode 21 and an end of a portion of a transfer control electrode 251' along the first side $24S_1$ is in the range of $0.02 \times L_1$ to $0.5 \times L_1$ (specifically, $0.2 \times L_1$) and a distance $LL_2'$ between the first electrode 21 and an end of a portion of a transfer control electrode 252' along the second side $24S_2$ is in the range of $0.02 \times L_2$ to $0.5 \times L_2$ (specifically, $0.2 \times L_2$). Further, to clarify the first electrode 21, the charge storage electrode 24, and the transfer control electrode 25 in FIG. 14B, oblique lines are given in the first electrode 21, the charge storage electrode 24, and the transfer control electrode 25.

Even in Embodiment 2, as shown in FIG. 14B, the transfer control electrode 25 is shared by the plurality of imaging elements. Further, it is considered that the potential of the transfer control electrode 25 is constant ($V_{13}$) during the charge storage period, the reset operation, and the charge transfer period. That is, after the reset operation is completed, charges are read out. The potential $V_{21}$ is applied to the first electrode 21, the potential $V_{22}$ is applied to the charge storage electrode 24, and the potential $V_{13}$ is applied to the transfer control electrode 25, from the drive circuit. Here, it is assumed that $V_{22} \leq V_{13} \leq V_{21}$ and preferably $V_{22} < V_{13} < V_{21}$ (see FIG. 11). As a result, electrons that have stopped in the region of the photoelectric conversion layer 23 opposite to the charge storage electrode 24 are reliably read out to the first electrode 21 and further to the first floating diffusion layer $FD_1$. That is, the charges stored in the photoelectric conversion layer 23 are read out to the control unit.

Except for the above points, the configuration and structure of the imaging element of Embodiment 2 may be similar to those of the imaging element or the solid-state imaging apparatus of Embodiment 1, and thus detailed description will be omitted. Further, it is needless to say that the modified example of Embodiment 1 shown in FIGS. 5A and 5B can also be applied to Embodiment 2.

Embodiment 3

Figure 15A:
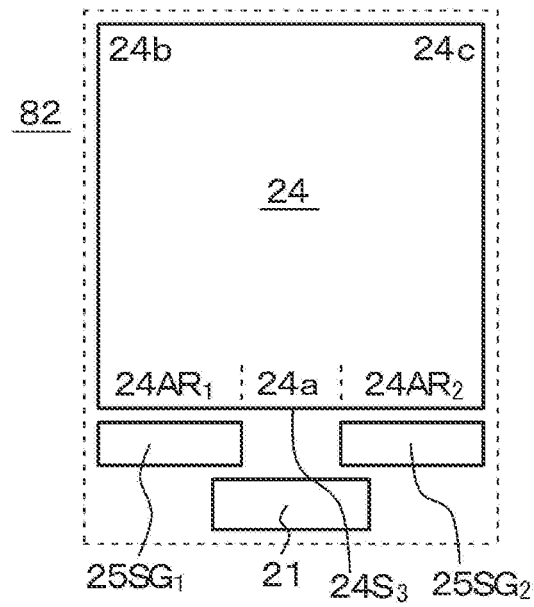
FIGS. 15A and 15B are schematic arrangement views of a first electrode, a charge storage electrode, and a transfer control electrode forming an imaging element of Embodiment 3.
Figure 15B:
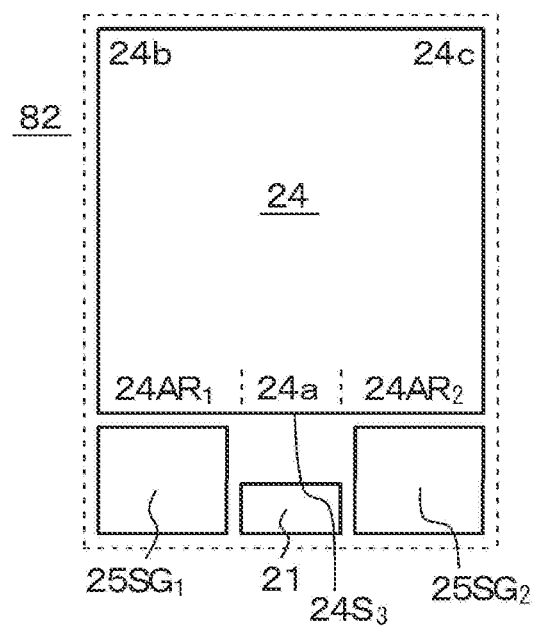
Figure 16:
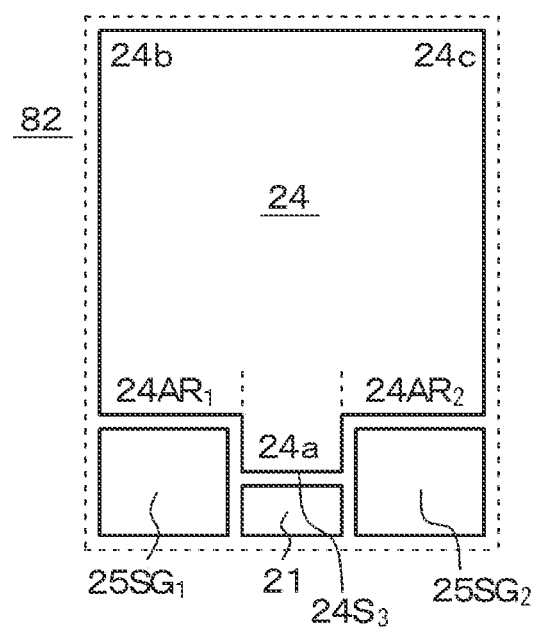
FIG. 16 is a schematic arrangement view of a first electrode, a charge storage electrode, and a transfer control electrode forming an imaging element of Embodiment 3.

Embodiment 3 is also a modification of Embodiment 1. As schematic plan views of the first electrode, the charge storage electrode, and the transfer control electrode included in the imaging element of Embodiment 3 are shown in FIG. 15A, 15B or 16, a planar shape of the charge storage electrode 24 is a rectangle in the imaging element of Embodiment 3. Further, the opposite region 24a is located to border one side $24S_3$ of the charge storage electrode 24 and the transfer control electrode 25 includes two transfer control electrode segments $25SG_1$ and $25SG_2$. Here, the first transfer control electrode segment $25SG_1$ is adjacent to the opposite region 24a and is opposite to the first electrode 21 and the first region $24AR_1$ of the charge storage electrode bordering the one side $24S_3$ of the charge storage electrode 24 via the insulating layer 82. The second transfer control electrode segment $25SG_2$ is adjacent to the opposite region 24a and is opposite to the first electrode 21 and the second region $24AR_2$ of the charge storage electrode bordering one side of the charge storage electrode 24 via the insulating layer 82.

Further, in the example shown in FIG. 15A, the transfer control electrode segments $25SG_1$ and $25SG_2$ are located between the charge storage electrode 24 and the first electrode 21. Furthermore, in the example shown in FIG. 15B, the transfer control electrode segments $25SG_1$ and $25SG_2$ border the first region $24AR_1$ of the charge storage electrode and the second region $24AR_2$ of the charge storage electrode, and border the first electrode 21. Moreover, in the example shown in FIG. 16, the opposite region 24a protrudes from the one side $24S_3$ of the charge storage electrode 24 to the first electrode 21. The transfer control electrode segments $25SG_1$ and $25SG_2$ border the opposite region 24a which is a protrusion of the charge storage electrode 24 and border the first region $24AR_1$ of the charge storage electrode and the second region $24AR_2$ of the charge storage electrode, and border the first electrode 21.

Except for the above points, the configuration and structure of the imaging element of Embodiment 3 may be similar to those of the imaging element or the solid-state imaging apparatus of Embodiment 1, and thus detailed description will be omitted.

Embodiment 4

Embodiment 4 relates to a solid-state imaging apparatus according to the second aspect of the present disclosure. The imaging element or the stacked-type imaging element included in the solid-state imaging apparatus of Embodiment 4 has the same configuration and structure as the imaging element or the stacked-type imaging element described in Embodiments 1 to 3. That is, the solid-state imaging apparatus of Embodiment 4 includes the plurality of imaging element blocks formed by the plurality of imaging elements described in Embodiments 1 to 3, and the first electrode 21 is shared by the plurality of imaging elements forming the imaging element block.

Further, a schematic arrangement view of the first electrode 21, the charge storage electrode 24, and the transfer control electrode 25 is shown in FIGS. 17, 18, 19, 20, 21, and 22. In examples shown in FIG. 17 or FIGS. 19 and 21 to be described below, the solid-state imaging apparatus includes the imaging element described in Embodiment 1. In examples shown in FIG. 18 or FIGS. 20 and 22 to be described below, the solid-state imaging apparatus includes the imaging element described in Embodiment 2. That is, the transfer control electrode 25 surrounds the charge storage electrode 24 in a frame form and the transfer control electrode 25 is shared by the adjacent imaging elements. Further, in the examples shown in FIGS. 17 and 18, the plurality of imaging elements is arrayed in a 2-dimensional matrix form and the imaging element block is formed by 2×2 imaging elements. Furthermore, in the examples illustrated in FIGS. 19, 20, 21, and 22, the plurality of imaging elements is arrayed in a 2-dimensional matrix form and the imaging element block is formed by two imaging elements adjacent in a diagonal direction. Further, in FIGS. 17 and 18, the imaging element block is surrounded by a dotted line. Suffixes attached to the first electrode 21, the charge storage electrode 24, and the transfer control electrode 25 are used to distinguish the first electrode 21, the charge storage electrode 24, and the transfer control electrode 25. Further, one on-chip microlens (not shown) is disposed above one imaging element. Further, in FIGS. 17, 18, 19, 20, 21, and 22, to clarify the transfer control electrode 25, oblique lines are given to the transfer control electrode 25. Here, in Embodiment 4, one floating diffusion layer is provided in each imaging element block. Further, the plurality of imaging elements forming the imaging element block can share one floating diffusion layer by suitably controlling a timing of the charge transfer period. Furthermore, the plurality of imaging elements forming the imaging element block shares one contact hole portion.

Figure 17:
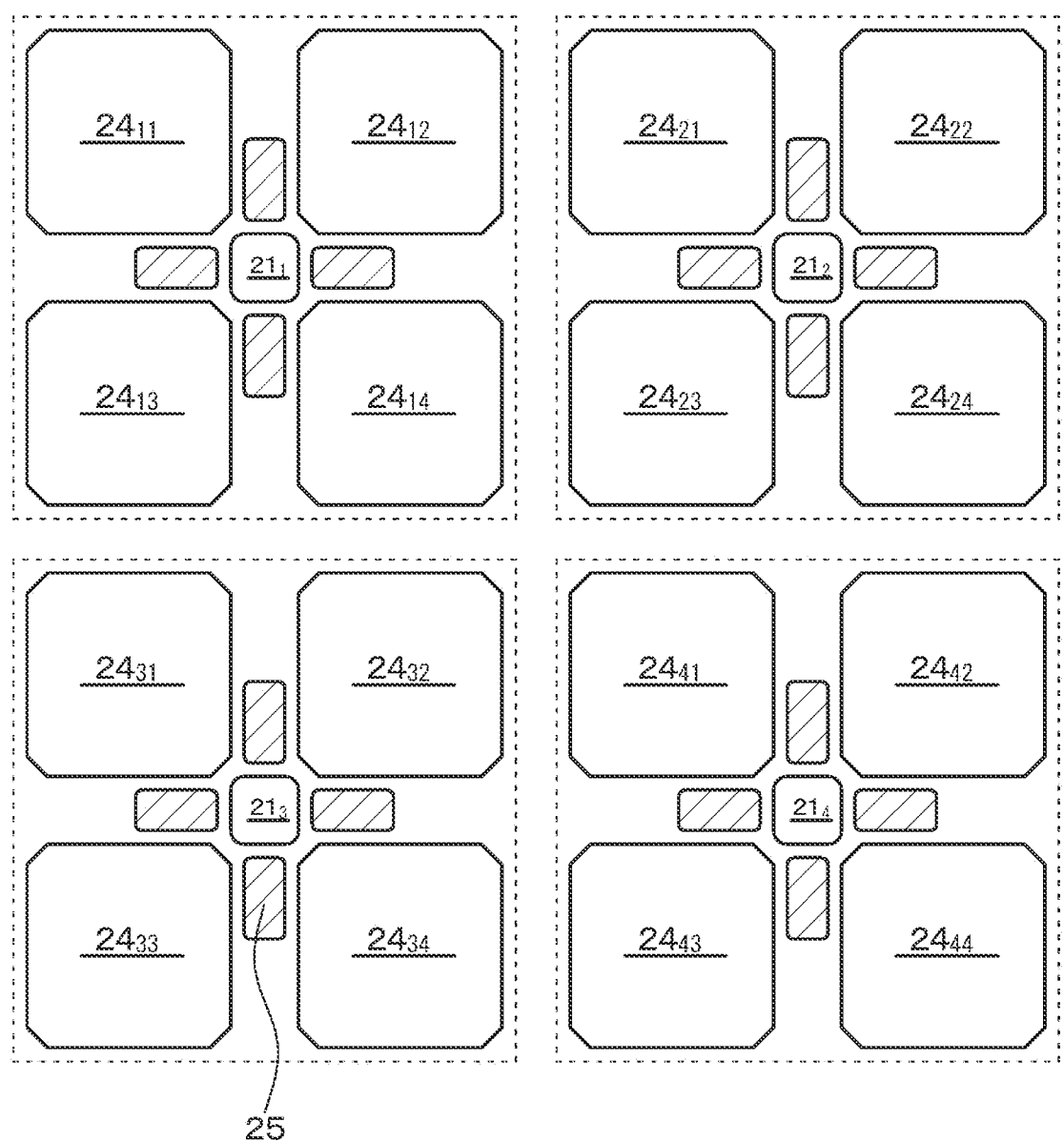
FIG. 17 is a schematic arrangement view of a first electrode, a charge storage electrode, and a transfer control electrode in an imaging element included in a solid-state imaging apparatus of Embodiment 4.
Figure 18:
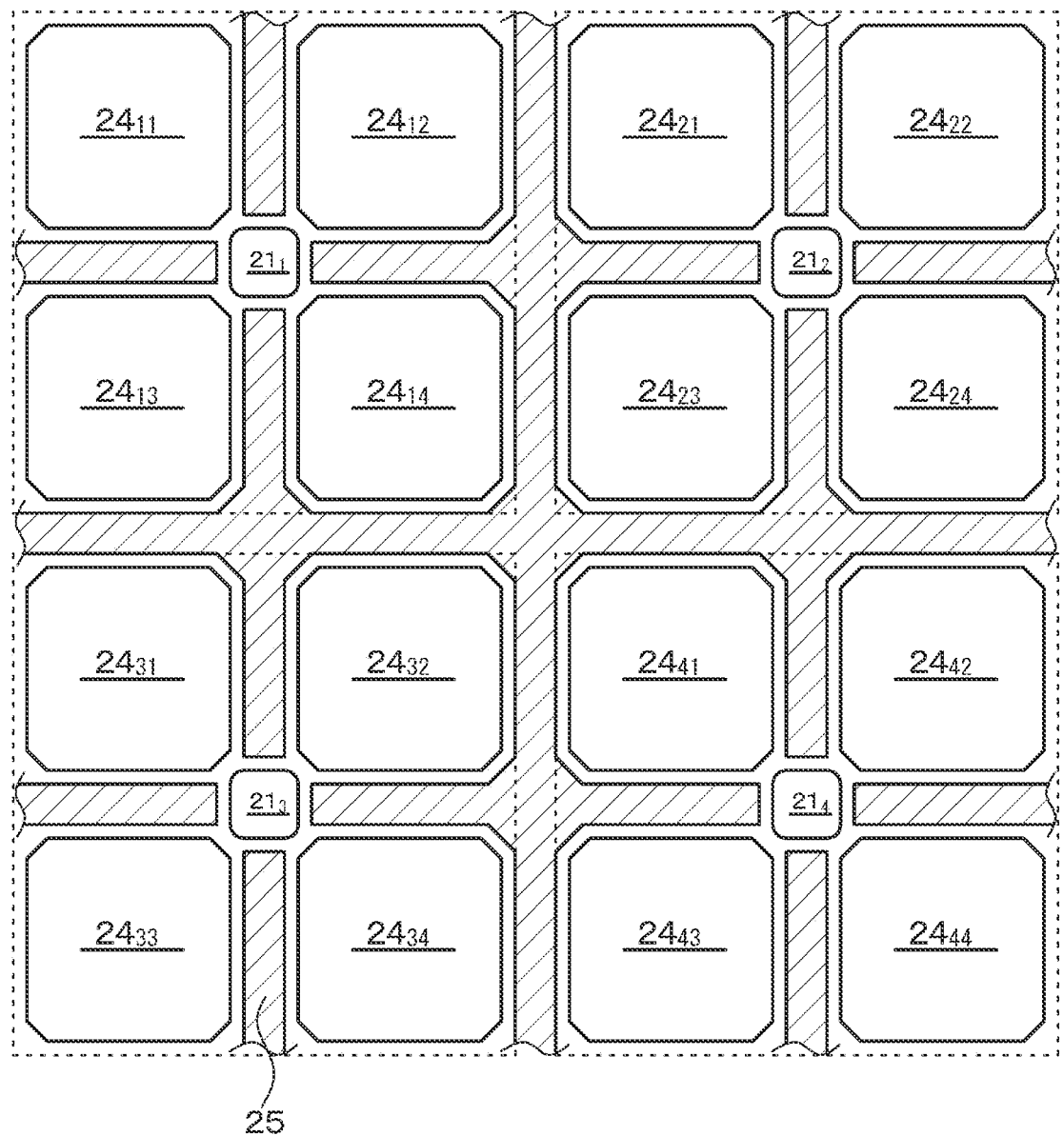
FIG. 18 is a schematic arrangement view of a first electrode, a charge storage electrode, and a transfer control electrode in an imaging element included in a modified example of the solid-state imaging apparatus of Embodiment 4.

That is, in the examples shown in FIGS. 17 and 18, four imaging elements (in FIGS. 17 and 18, charge storage electrodes $24_{m,1}$, $24_{m,2}$, $24_{m,3}$, and $24_{m,4}$ are shown) form one imaging element block. The four imaging elements share one first electrode $21_m$, one contact hole portion, and one floating diffusion layer. Here, m is a positive integer.

Figure 19:
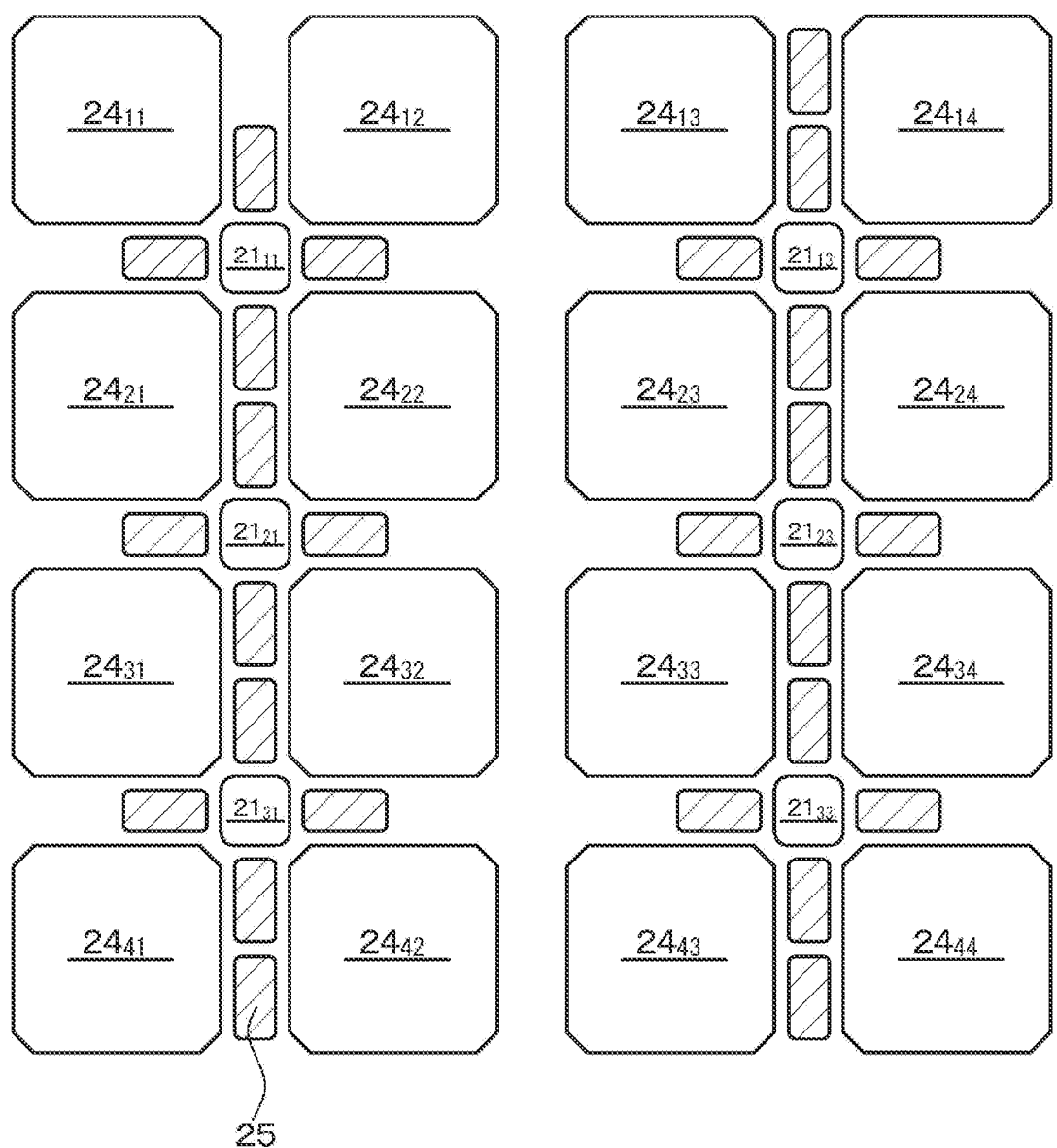
FIG. 19 is a schematic arrangement view of a first electrode, a charge storage electrode, and a transfer control electrode in an imaging element included in another modified example of the solid-state imaging apparatus of Embodiment 4.
Figure 20:
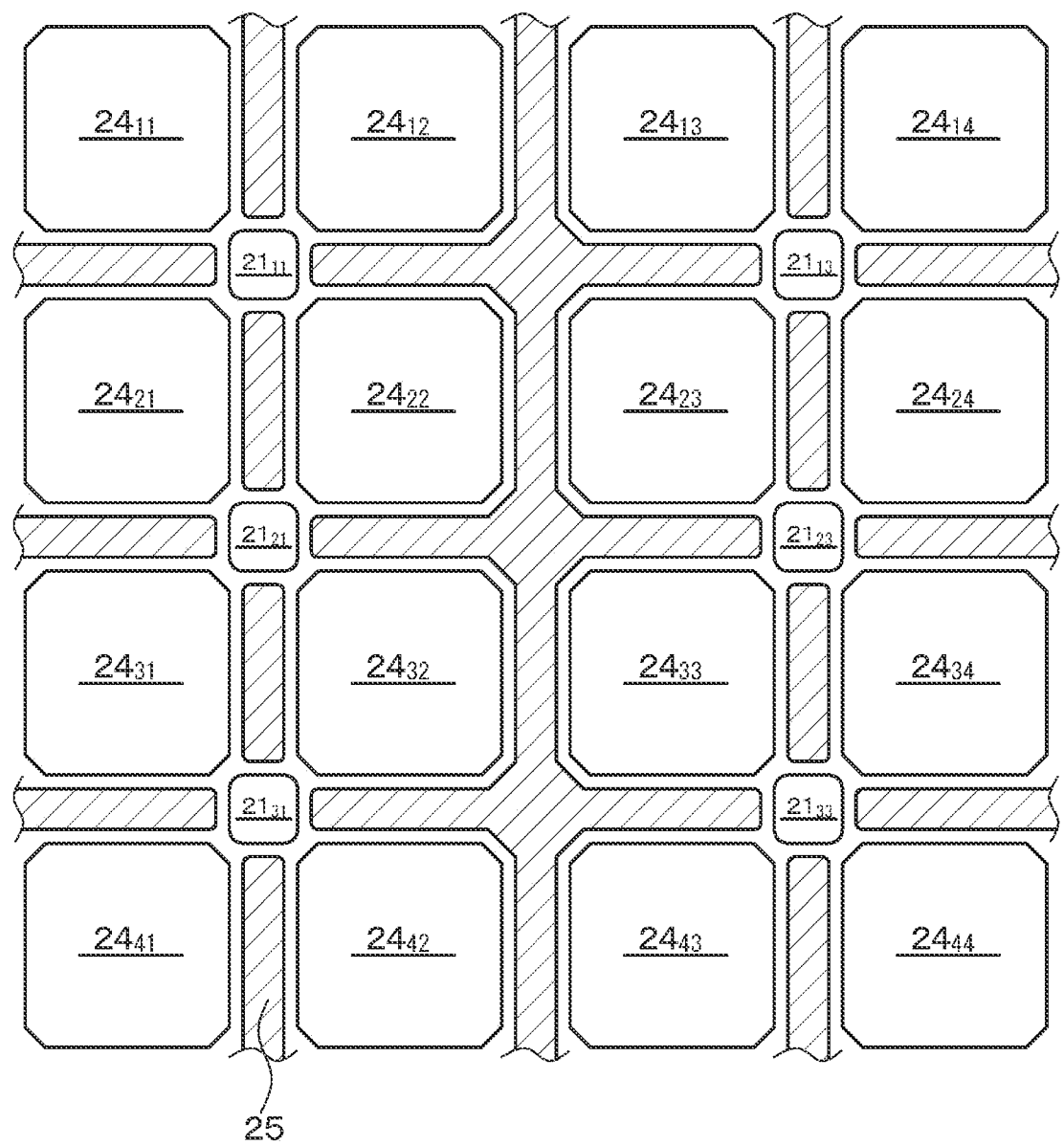
FIG. 20 is a schematic arrangement view of a first electrode, a charge storage electrode, and a transfer control electrode in an imaging element included in still another modified example of the solid-state imaging apparatus of Embodiment 4.

Further, in the examples shown in FIGS. 19 and 20, two imaging elements (in FIGS. 19 and 20, charge storage electrodes $24_{m,n+1}$, $24_{m+1,n}$ are shown) form one imaging element block. The two imaging elements share one first electrode $21_{m,n}$, one contact hole portion, and one floating diffusion layer. Here, m is a positive integer, and n is an odd number.

Figure 21:
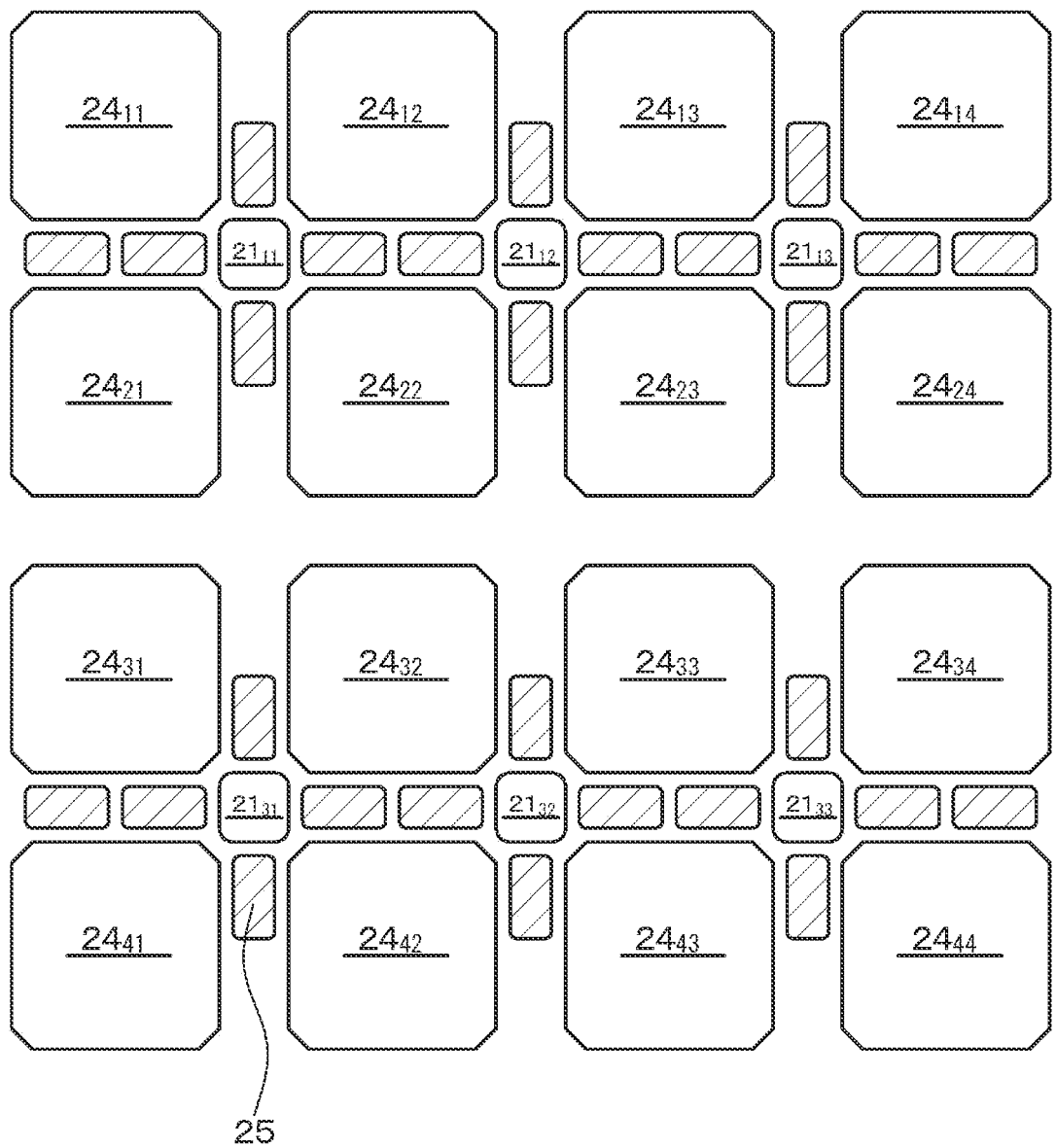
FIG. 21 is a schematic arrangement view of a first electrode, a charge storage electrode, and a transfer control electrode in an imaging element included in still another modified example of the solid-state imaging apparatus of Embodiment 4.
Figure 22:
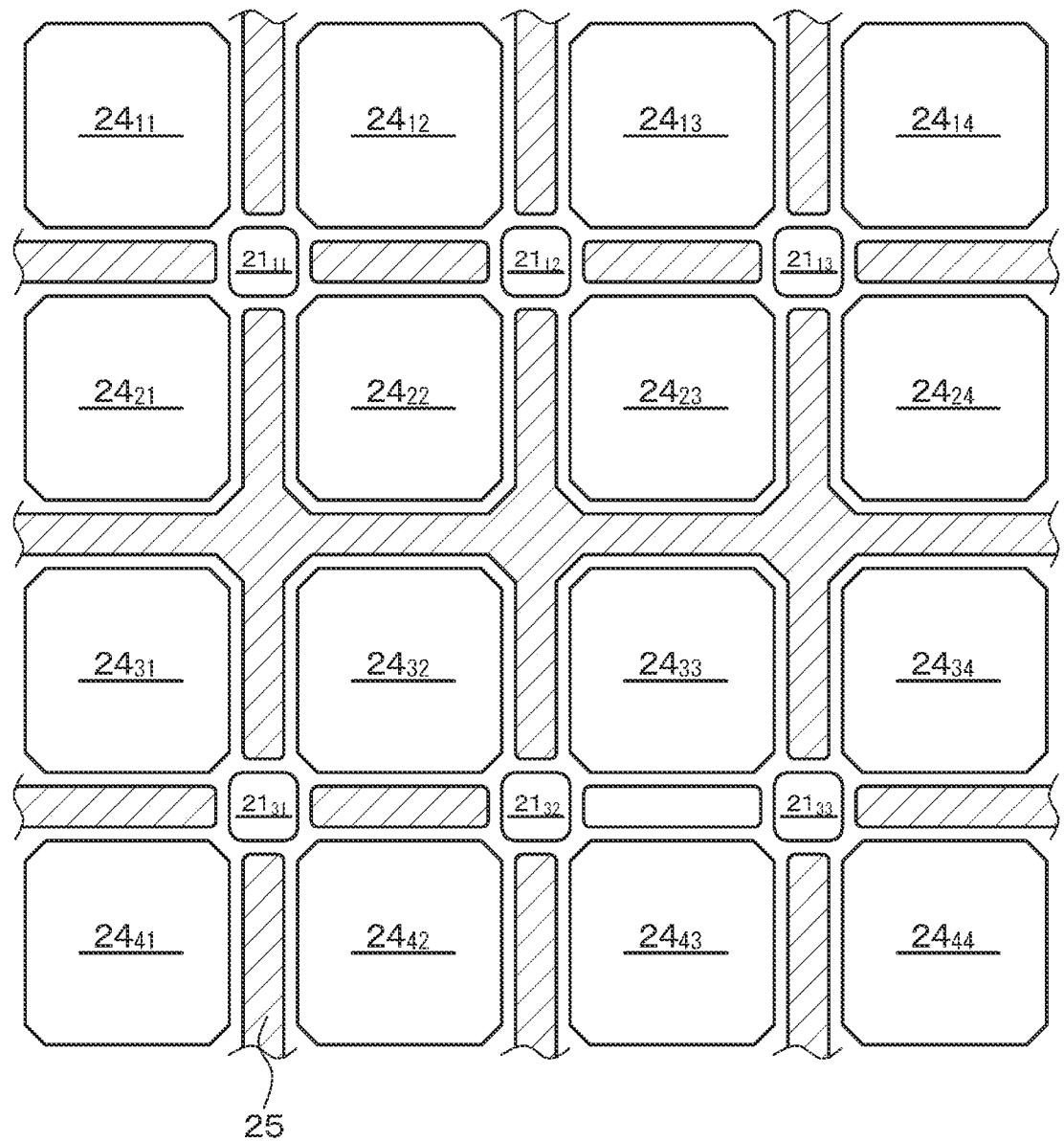
FIG. 22 is a schematic arrangement view of a first electrode, a charge storage electrode, and a transfer control electrode in an imaging element included in still another modified example of the solid-state imaging apparatus of Embodiment 4.

Further, in the examples shown in FIGS. 21 and 22, two imaging elements (in FIGS. 21 and 22, the charge storage electrodes $24_{m,n+1}$, $24_{m+1,n}$ are shown) form one imaging element block. The two imaging elements share one first electrode $21_{m,n}$, one contact hole portion, and one floating diffusion layer. Here, m is an odd number, and n is a positive integer.

Thus, the solid-state imaging apparatus of Embodiment 4 has the configuration and structure substantially similar to those of the solid-state imaging apparatus described in Embodiments 1 to 3 except that the first electrode 21 is shared by a plurality of the imaging elements forming the imaging element block.

Hereinafter, for example, the operation of the imaging element block including a first electrode $21_{11}$ and two two charge storage electrodes $24_{12}$ and $24_{21}$ shown in FIG. 20 will be described.

In the charge storage period, the potential $V_a$ ($=V_{11}$) is applied to the first electrode $21_{11}$, the potential $V_{13}$ is applied to the charge storage electrodes $24_{12}$ and $24_{21}$, and the potential $V_{12}$ is applied to the second electrode 22 (not illustrated), from the drive circuit. Photoelectric conversion occurs in the photoelectric conversion layer 23 by light incident on the photoelectric conversion layer 23. The holes generated by the photoelectric conversion are sent from the second electrode 22 to the drive circuit via a wiring $V_{OU}$. On the other hand, since the potential of the first electrode $21_{11}$ is higher than the potential of the second electrode 22, that is, for example, a positive potential is applied to the first electrode $21_{11}$ and a negative potential $V_{a'}$ ($=V_{12}$) is applied to the second electrode 22, and thus $V_a$>13. As a result, the electrons generated by the photoelectric conversion are attracted to the charge storage electrodes $24_{12}$ and $24_{21}$ and stop at the region of the photoelectric conversion layer 23 opposite to the charge storage electrodes $24_{12}$ and $24_{21}$. That is, charges are stored in the photoelectric conversion layer 23. Since $V_a$>13, electrons generated in the photoelectric conversion layer 23 do not move toward the first electrode $21_{11}$. As the photoelectric conversion time elapses, the potential in the region of the photoelectric conversion layer 23 opposite to the charge storage electrodes $24_{12}$ and $24_{21}$ becomes a more negative value.

A reset operation is performed at the latter stage of the charge storage period. As a result, the potential of the first floating diffusion layer is reset, and the potential of the first floating diffusion layer becomes the potential $V_{DD}$ of the power supply.

After the reset operation is completed, charges are read out. That is, in the charge transfer period, the potential $V_b$ ($=V_{12}$) is applied to the first electrode $21_{11}$, a potential $v_{12-b}$ is applied to the charge storage electrode $24_{12}$, a potential $v_{21-b}$ is applied to the charge storage electrode $24_{21}$, and the potential $V_{b'}$ ($=V_{22}$) is applied to the second electrode 22 (not shown), from the drive circuit. Here, $v_{12-b}$ ($=V_{13}$) <$V_b$<$v_{21-b}$. The potential of the transfer control electrode 25 is considered to be constant ($V_{13}$) during the charge storage period, the reset operation, and the charge transfer period. As a result, electrons that have stopped in the region of the photoelectric conversion layer 23 opposite to the charge storage electrode $24_{12}$ are read out to the first electrode $21_{11}$ and further to the first floating diffusion layer. That is, the charges stored in the region of the photoelectric conversion layer 23 opposite to the charge storage electrode $24_{12}$ are read out to the control unit. When the reading is completed, $v_{21-b}$ ($=V_{13}$)≤$v_{12-b}$<$V_b$ is set. Further, $v_{21-b}$ ($=V_{13}$)<$V_b$<$v_{12-b}$ may be set. As a result, electrons that have stopped in the region of the photoelectric conversion layer 23 opposite to the charge storage electrode $24_{21}$ are read out to the first electrode $21_{11}$ and further to the first floating diffusion layer. Further, when the reading of the charges stored in the region of the photoelectric conversion layer 23 opposite to the charge storage electrode $24_{12}$ to the control unit is completed, the potential of the first floating diffusion layer may be reset.

Figure 23A:
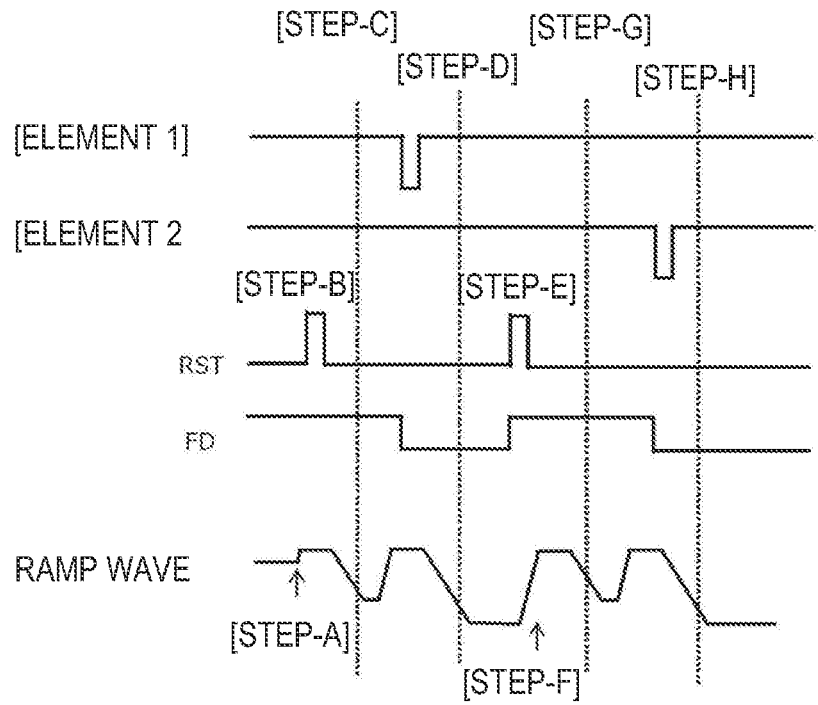
FIGS. 23A, 23B, and 23C are a flow chart showing a readout driving example in an imaging element block of Embodiment 4.

FIG. 23A shows readout driving examples in the imaging element block of Embodiment 4.

[Step A]
Auto zero signal input to comparator
[Step B]
Reset operation of one shared floating diffusion layer
[Step C]
P-phase readout in imaging element corresponding to charge storage electrode $24_{12}$ and charge movement to first electrode $21_{11}$
[Step D]
D-phase readout in imaging element corresponding to charge storage electrode $24_{12}$ and charge movement to first electrode $21_{11}$
[Step E]
Reset operation of one shared floating diffusion layer
[Step F]
Auto zero signal input to comparator
[Step G]
P-phase readout in imaging element corresponding to charge storage electrode $24_{21}$ and charge movement to first electrode $21_{11}$
[Step H]
D-phase readout in imaging element corresponding to charge storage electrode $24_{21}$ and charge movement to first electrode $21_{11}$ Signals from two imaging elements corresponding to the charge storage electrode $24_{12}$ and charge storage electrode $24_{21}$ are read out in accordance with the flow described above. On the basis of the correlated double sampling (CDS) processing, the difference between the P-phase readout in [Step C] and the D-phase readout in [Step D] is a signal from the imaging element corresponding to the charge storage electrode $24_{12}$, and the difference between the P-phase readout in [Step G] and the D-phase readout in [Step H] is a signal from the imaging element corresponding to the charge storage electrode $24_{21}$.

Figure 23B:
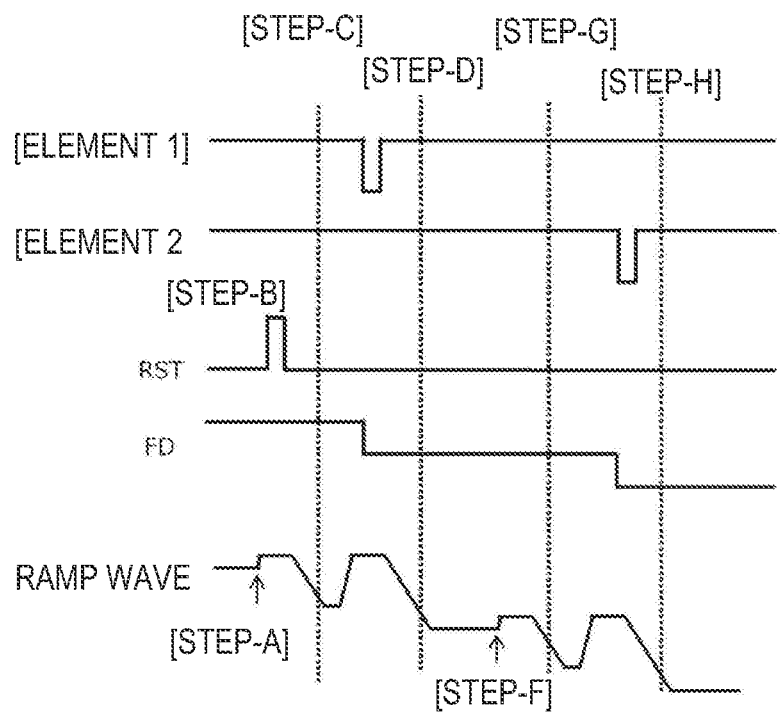
Figure 23C:
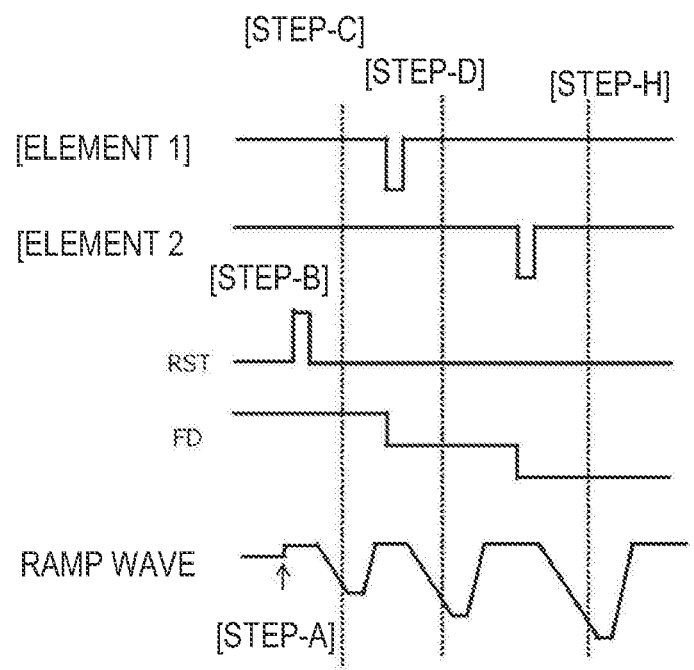

Further, the operation of [Step E] may be omitted (see FIG. 23B). Furthermore, the operation of [Step F] may be omitted, and in this case, further, [Step G] can be omitted (see FIG. 23C), and a difference between the P-phase readout in [Step C] and the D-phase readout in [Step D] is a signal from the imaging element corresponding to the charge storage electrode $24_{12}$, and a difference between the D-phase readout in [Step D] and the D-phase readout in [Step H] is a signal from the imaging element corresponding to the charge storage electrode $24_{21}$.

In the solid-state imaging apparatus of Embodiment 4, the first electrode is shared by a plurality of the imaging elements forming the imaging element block, and thus the configuration and structure of a pixel area in which a plurality of imaging elements is arranged can be simplified and miniaturized. Further, a plurality of imaging elements provided for one floating diffusion layer may include a plurality of the first-type imaging elements or may include at least one first-type imaging element and one or two or more second-type imaging elements.

Embodiment 5

Figure 24:
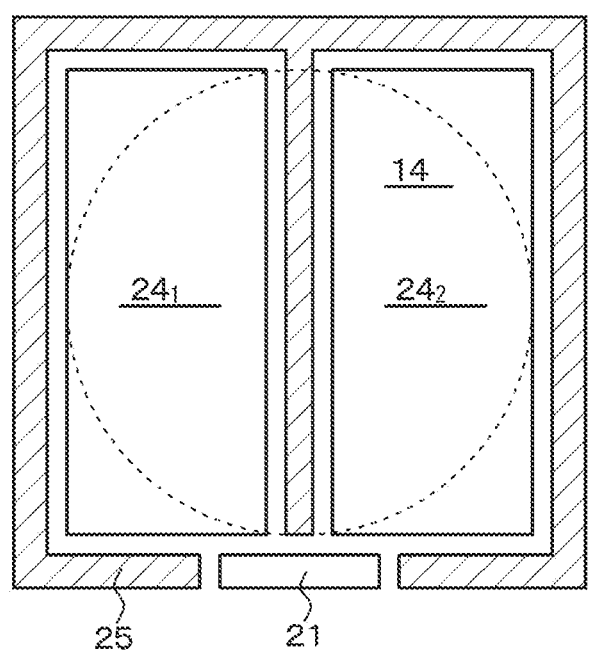
FIG. 24 is a schematic arrangement view of a first electrode, a charge storage electrode, a transfer control electrode, and an on-chip microlens in an imaging element included in a solid-state imaging apparatus of Embodiment 5.

Embodiment 5 is a modification of Embodiment 4. In the solid-state imaging apparatus of Embodiment 5 in which a disposition state of the first electrode 21 and the charge storage electrode 24 is schematically shown in FIG. 24, an imaging element block is formed by two imaging elements adjacent in an imaging horizontal direction. Further, one on-chip microlens 14 (shown by a dotted line) is disposed above the imaging element block. Further, in FIG. 24, to clarify the transfer control electrode 25, oblique lines are given to the transfer control electrode 25.

For example, the photoelectric conversion layers corresponding to the charge storage electrodes $24_1$ forming the imaging element block have high sensitivity to incident light from obliquely upper right in the drawing. Further, the photoelectric conversion layers corresponding to the charge storage electrodes $24_2$ forming the imaging element block have high sensitivity to incident light from obliquely upper left in the drawing. Accordingly, for example, it is possible to acquire an image-plane phase difference signal by combining an imaging element having the charge storage electrode $24_1$ and an imaging element having the charge storage electrode $24_2$. Furthermore, when a signal from an imaging element having the charge storage electrode $24_1$ and a signal from an imaging element having the charge storage electrode $24_2$ are added, one imaging element may be formed by a combination of these imaging elements.

Embodiment 6

Figure 25:
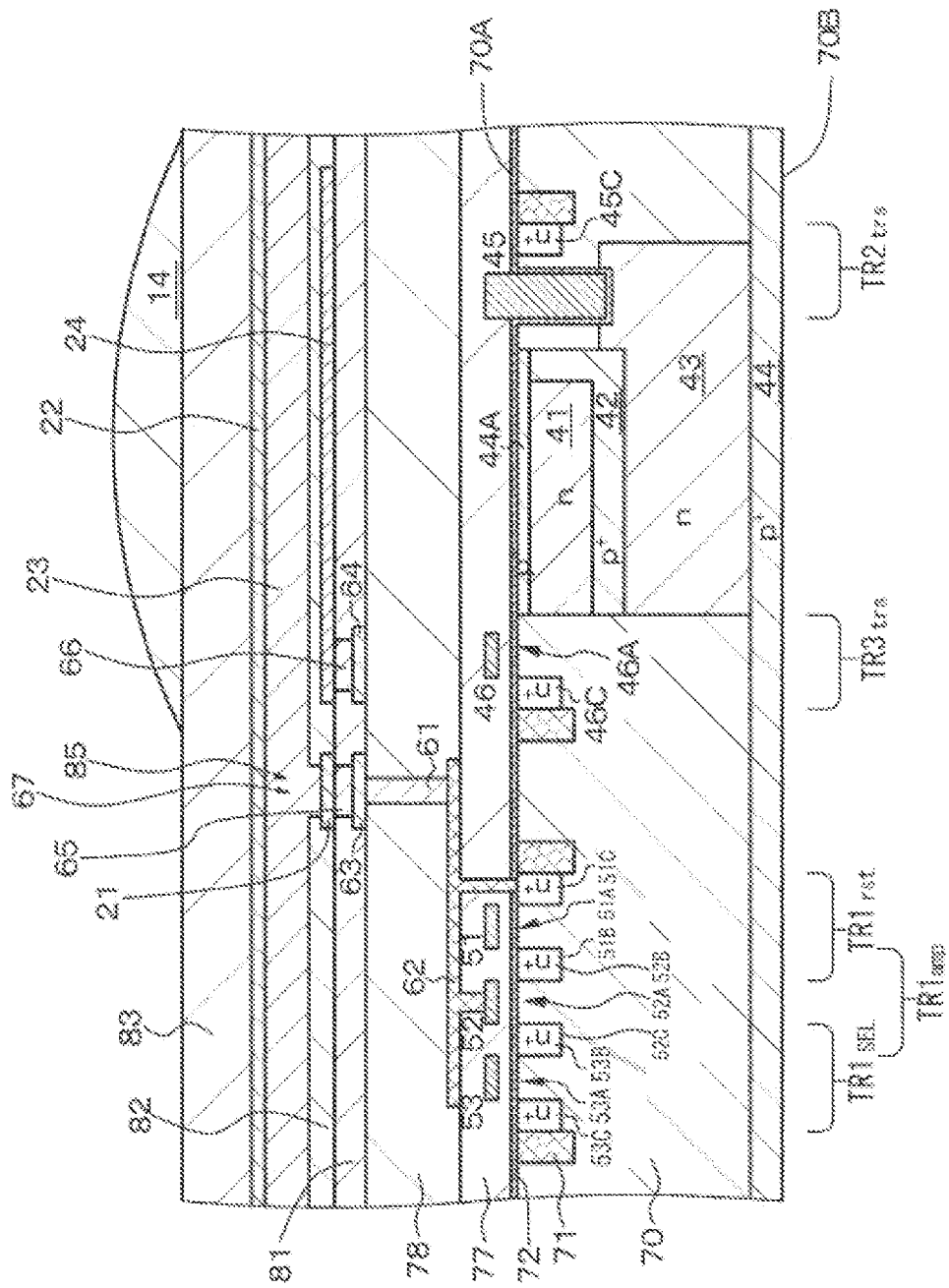
FIG. 25 is a schematic partial sectional view of an imaging element of Embodiment 6.

Embodiment 6 is the modification of Embodiments 1 to 5. The imaging element of Embodiment 6 schematically shown in FIG. 25 is front-surface illuminated type imaging element, and has a structure in which three imaging elements including a first-type green imaging element of Embodiments 1 to 5 (first imaging element) having a first-type green photoelectric conversion layer which absorbs green light and having sensitivity to green light, a second-type conventional blue imaging element (second imaging element) having a second-type blue photoelectric conversion layer which absorbs blue light and having sensitivity to blue light, and a second-type conventional red imaging element (third imaging element) having a second-type red photoelectric conversion layer which absorbs red light and having sensitivity to red light, are stacked. Here, the red imaging element (third imaging element) and the blue imaging element (second imaging element) are provided in the semiconductor substrate 70, and the second imaging element is located more closer to the light incident side as compared to the third imaging element. Furthermore, the green imaging element (first imaging element) is provided above the blue imaging element (second imaging element).

Various transistors forming the control unit are provided on the surface 70A of the semiconductor substrate 70, as in Embodiment 1. These transistors may have the configuration and structure substantially similar to those of the transistors described in Embodiment 1. Furthermore, the second imaging element and the third imaging element are provided on the semiconductor substrate 70, and these imaging elements also may have the configuration and structure substantially similar to those of the second imaging element and the third imaging element described in Embodiment 1.

The interlayer insulating layer 81 is formed above the surface 70A of the semiconductor substrate 70, and the photoelectric conversion unit (first electrode 21, photoelectric conversion layer 23, second electrode 22, charge storage electrode 24, transfer control electrode 25, and the like) having charge storage electrode that forms the imaging element of Embodiments 1 to 5 are formed above the interlayer insulating layer 81.

As described above, the configuration and structure of the imaging element of Embodiment 6 may be similar to those of the imaging element of Embodiments 1 to 5 except for being the front-surface illuminated type imaging element and stacked-type imaging element, and thus detailed description will be omitted.

Embodiment 7

Embodiment 7 is the modification of Embodiments 1 to 6.

Figure 26:
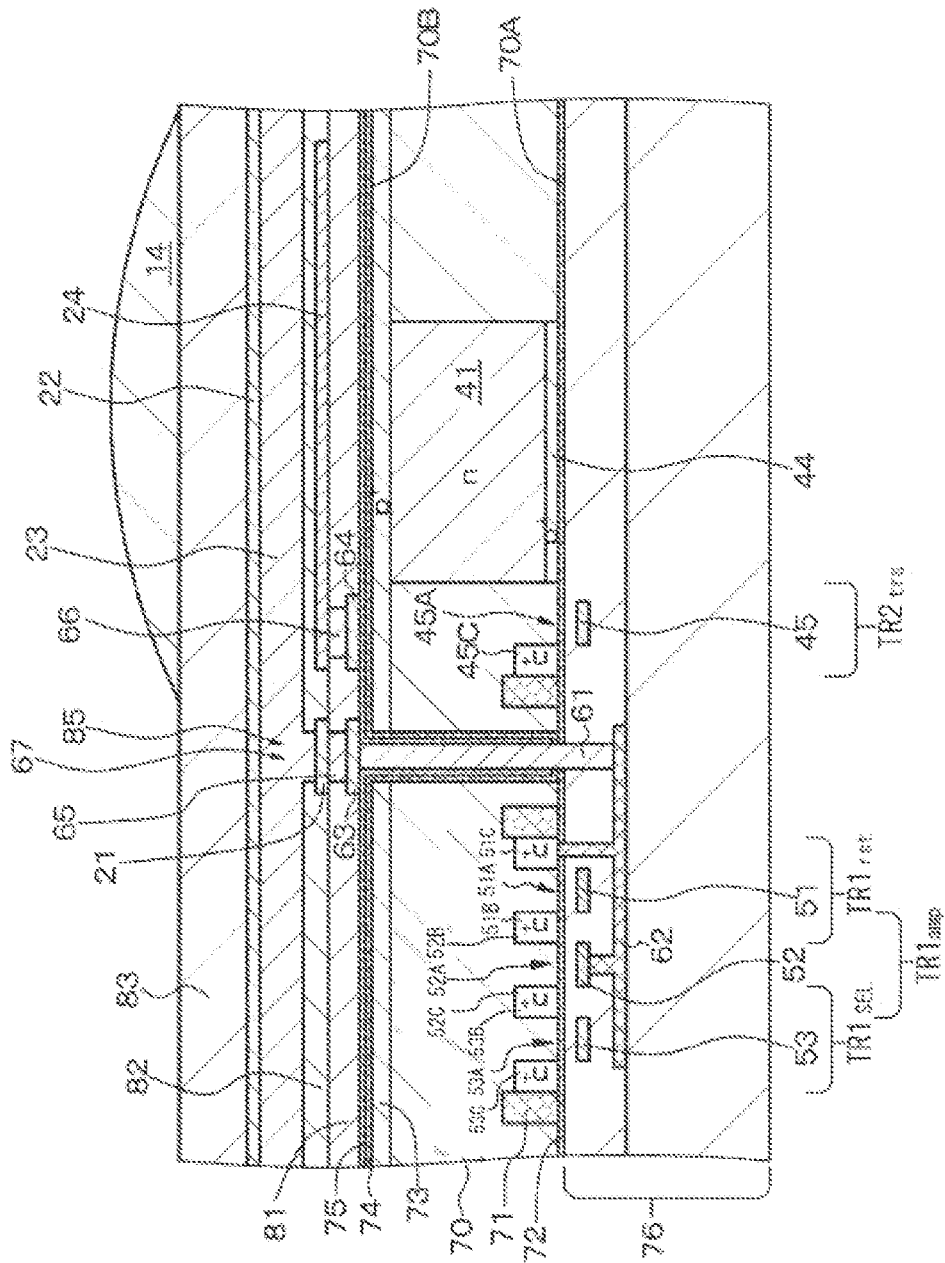
FIG. 26 is a schematic partial sectional view of an imaging element of Embodiment 7.
Figure 27:
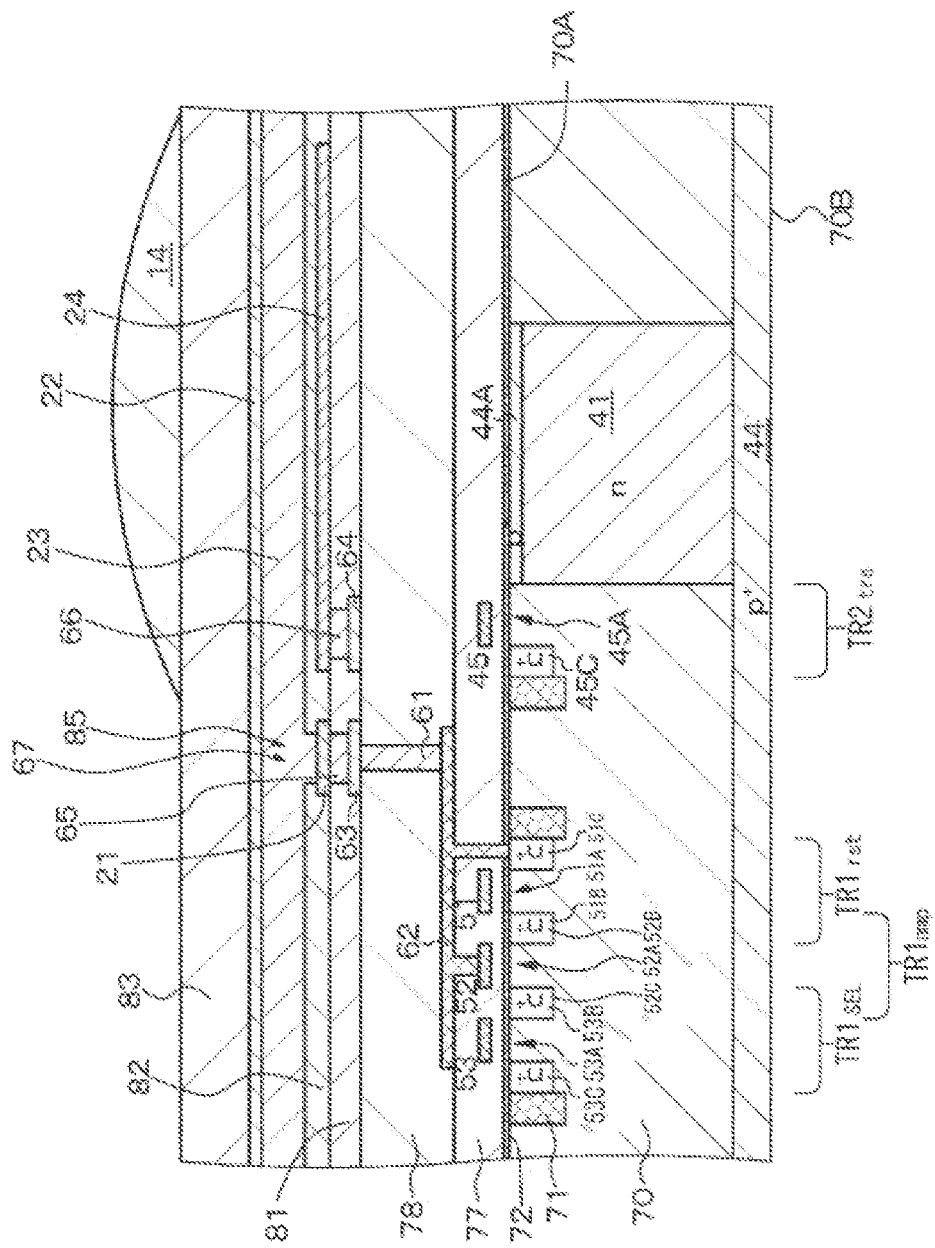
FIG. 27 is a schematic partial sectional view of a modified example of the imaging element of Embodiment 7.

The imaging element of Embodiment 7 of which a schematic partial cross sectional view is shown in FIG. 26 is a back-surface illuminated type imaging element, and has a structure in which the first imaging element of the first type of Embodiments 1 to 5 and two second imaging elements of the second type are stacked. Further, a modified example of the imaging element of Embodiment 7 of which a schematic partial cross sectional view is shown in FIG. 27 is a front-surface illuminated type imaging element, and has a structure in which the first imaging element of the first type of Embodiments 1 to 5 and two second imaging elements of the second type are stacked. Here, the first imaging element absorbs primary color of light, and the second imaging element absorbs complementary color of light. Alternatively, the first imaging element absorbs white light and the second imaging element absorbs infrared light.

Figure 28:
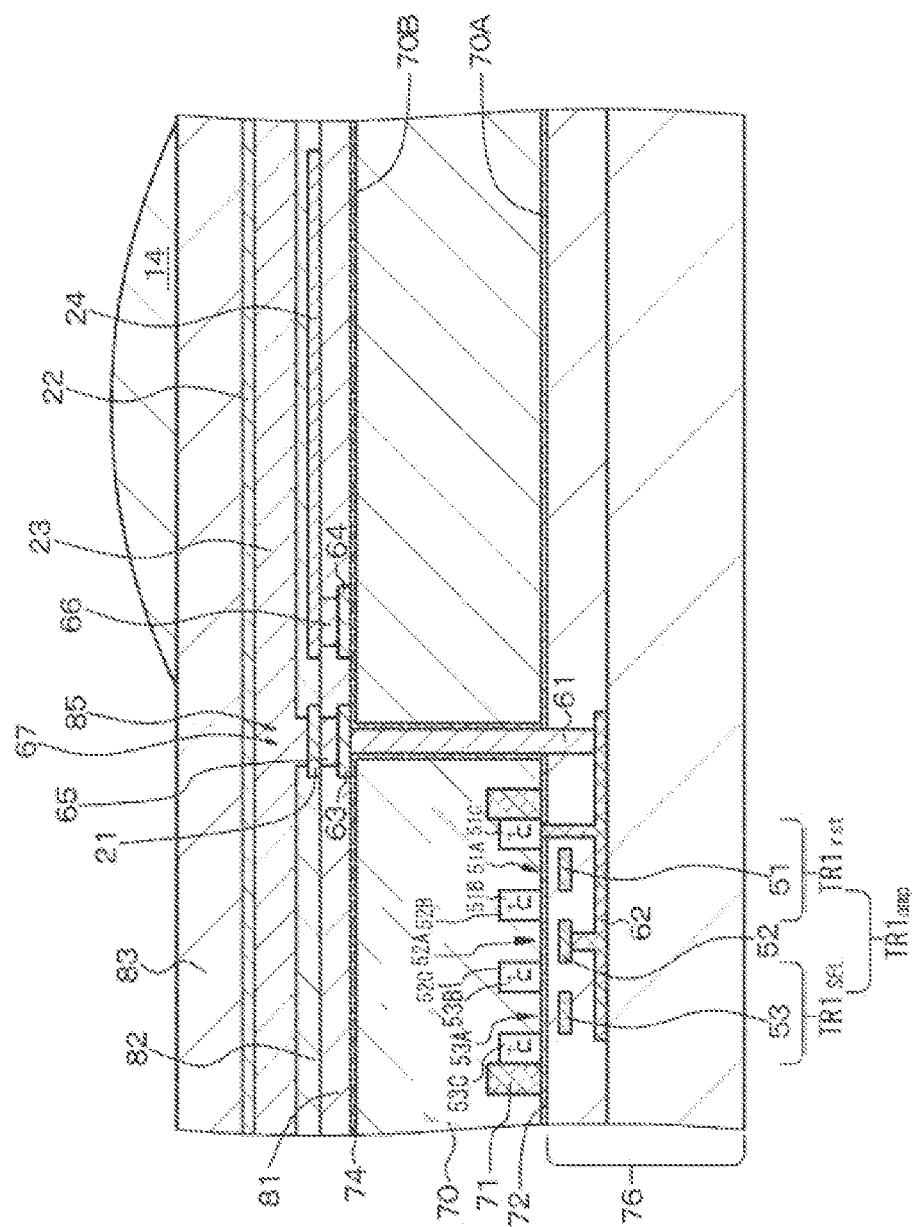
FIG. 28 is a schematic partial sectional view of another modified example of the imaging element of Embodiment 7.
Figure 29:
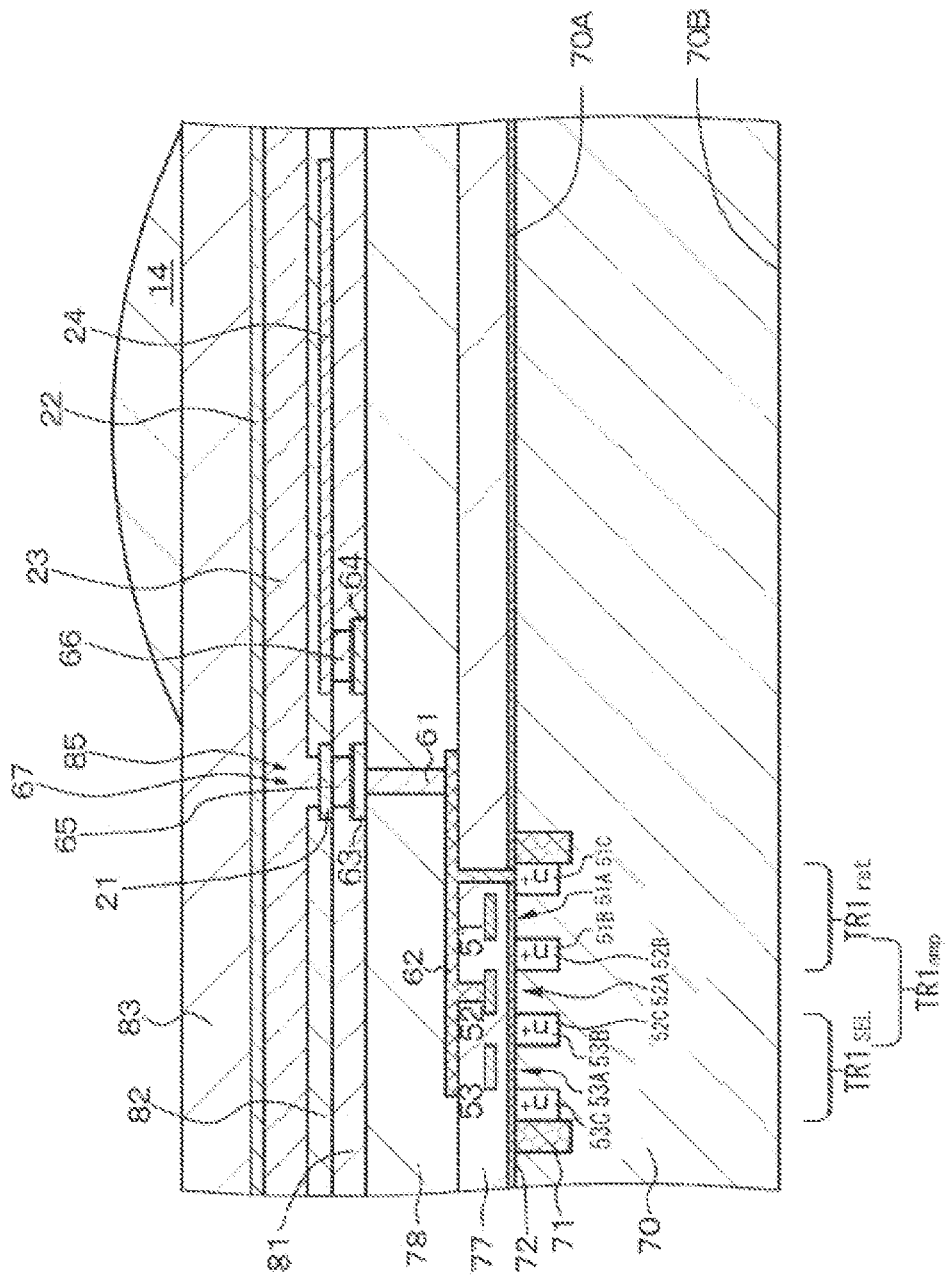
FIG. 29 is a schematic partial sectional view of still another modified example of the imaging element of Embodiment 7.

A modified example of the imaging element of Embodiment 7 of which a schematic partial sectional view is shown in FIG. 28 is a back-surface illuminated type imaging element, and includes the first imaging element of the first type of Embodiments 1 to 5. Furthermore, a modified example of the imaging element of Embodiment 7 of which a schematic partial sectional view is shown in FIG. 29 is a front-surface illuminated type imaging element, and includes the first imaging element of the first type of Embodiments 1 to 5. Here, the first imaging element includes three types of imaging elements including an imaging element absorbing red light, an imaging element absorbing green light, and an imaging element absorbing blue light. An example of the arrangement of a plurality of the imaging elements may include a Bayer array. Color filter layers for performing spectral division of blue, green, and red are provided as necessary at the light incident side of each imaging element.

Further, the form in which two photoelectric conversion units including first-type charge storage electrode of Embodiments 1 to 5 are stacked (i.e., form in which two photoelectric conversion units including charge storage electrode are stacked and control units of two photoelectric conversion units are provided on semiconductor substrate), or, the form in which three photoelectric conversion units including first-type charge storage electrode of Embodiments 1 to 5 are stacked (i.e., form in which three photoelectric conversion units including charge storage electrode are stacked and control units of three photoelectric conversion units are provided on semiconductor substrate) may be adopted instead of providing one first-type charge storage electrode of Embodiments 1 to 5. An example of a stacked structure of the first-type imaging element and the second-type imaging element is exemplified in the following table.

|  | First type | Second type |
|---|---|---|
| Back surface illuminated type and front surface illuminated type | 1<br>Green<br>1<br>Primary color<br>1<br>White<br>1<br>Blue or green or red<br>2<br>Green + infrared light<br>2<br>Green + blue<br>2<br>White + infrared light<br>3<br>Green + blue + red<br>3<br>Green + blue + red<br>3<br>Blue + green + red | 2<br>Blue + red<br>1<br>Complementary color<br>1<br>Infrared ray<br>0<br>2<br>Blue + red<br>1<br>Red<br>0<br>2<br>Blue-green (emerald color) + infrared light<br>1<br>Infrared light<br>0 |

Embodiment 8

Figure 30:
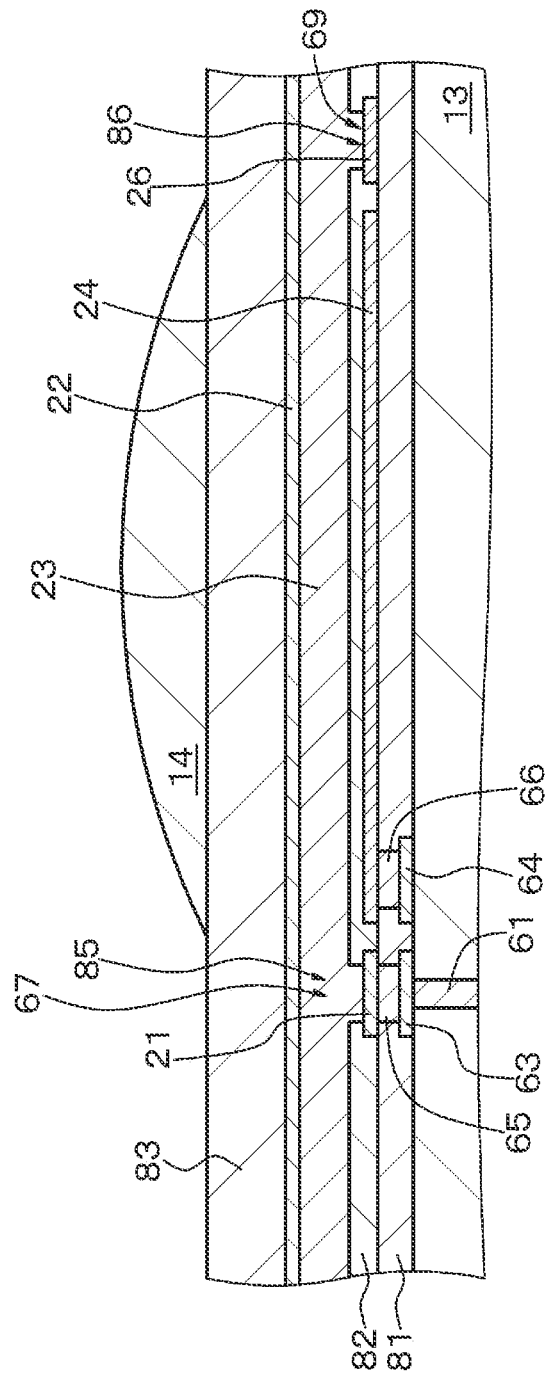
FIG. 30 is a schematic partial sectional view of a part of an imaging element of Embodiment 8.

Embodiment 8 is the modification of Embodiments 1 to 7, and relates to the imaging element or the like having the charge discharge electrode according to the present disclosure. A schematic partial sectional view of a part of the imaging element of Embodiment 8 is shown in FIG. 30.

The imaging element of Embodiment 8 further includes a charge discharge electrode 26 that is connected to the photoelectric conversion layer 23 via the connection portion 69 and is disposed to be spaced apart from the first electrode 21 and the charge storage electrode 24. Here, in some cases, the charge discharge electrode 26 may be disposed to surround the first electrode 21, the charge storage electrode 24, and the transfer control electrode 25 (i.e., in a frame form). The charge discharge electrode 26 is connected to a pixel drive circuit forming a drive circuit. The photoelectric conversion layer 23 extends in the connection portion 69. In other word, the photoelectric conversion layer 23 extends in a second opening 86 provided in an insulating layer 82, and is connected to the charge discharge electrode 26. The charge discharge electrode 26 is shared by (commonized in) a plurality of imaging elements.

In Embodiment 8, in the charge storage period, the potential $V_{11}$ is applied to the first electrode 21, the potential $V_{12}$ is applied to the charge storage electrode 24, the potential $V_{13}$ is applied to the transfer control electrode 25, and the potential $V_{14}$ is applied to the charge discharge electrode 26, from the drive circuit, and charges are stored in the photoelectric conversion layer 23. Photoelectric conversion occurs in the photoelectric conversion layer 23 by light incident on the photoelectric conversion layer 23. The holes generated by the photoelectric conversion are sent from the second electrode 22 to the drive circuit via a wiring $V_{OU}$. On the other hand, since the potential of the first electrode 21 is higher than the potential of the second electrode 22, that is, for example, a positive potential is applied to the first electrode 21 and a negative potential is applied to the second electrode 22, and thus $V_{14} > V_{11}$ (e.g., $V_{12} > V_{14} > V_{11}$). Further, the potential $V_{13}$ is applied to the transfer control electrode 25. As a result, the electrons generated by the photoelectric conversion are attracted to the charge storage electrode 24 and stop at the region of the photoelectric conversion layer 23 opposite to the charge storage electrode 24, and are reliably prevented from moving toward the first electrode 21. However, electrons (so-called overflowed electrons) that are not sufficiently attracted by the charge storage electrode 24 or are not stored in the photoelectric conversion layer 23 are sent to the drive circuit via the charge discharge electrode 26.

A reset operation is performed at the latter stage of the charge storage period. As a result, the potential of the first floating diffusion layer $FD_1$ is reset such that the potential of the first floating diffusion layer $FD_1$ becomes the potential $V_{DD}$ of the power supply.

After the reset operation is completed, charges are read out. That is, in the charge transfer period, the potential $V_{21}$ is applied to the first electrode 21, the potential $V_{22}$ is applied to the charge storage electrode 24, the potential $V_{13}$ or the potential $V_{23}$ is applied to the transfer control electrode 25, and the potential $V_{24}$ is applied to the charge discharge electrode 26, from the drive circuit. Here, it is assumed that $V_{24} < V_{21}$ (for example, $V_{24} < V_{22} < V_{21}$). As a result, electrons that have stopped in the region of the photoelectric conversion layer 23 opposite to the charge storage electrode 24 are reliably read out to the first electrode 21 and further to the first floating diffusion layer $FD_1$. That is, the charges stored in the photoelectric conversion layer 23 are read out to the control unit.

Thus, a series of operations including charge storage, reset operation, charge transfer, and the like is completed.

The operations of the amplification transistor $TR1_{amp}$ and the select transistor $TR1_{sel}$ after the electrons are read out to the first floating diffusion layer $FD_1$ are the same as those of the conventional transistors. Further, for example, a series of operations such as charge storage, reset operation, and charge transfer of the second imaging element and the third imaging element are similar to a series of conventional operations such as charge storage, reset operation, and charge transfer.

In Embodiment 8, so-called overflowed electrons are sent to the drive circuit via the charge discharge electrode 26, and thus leakage of adjacent pixels to the charge storage portion can be suppressed and occurrence of blooming can be suppressed. Further, as a result, the imaging performance of the imaging element can be improved. In some cases, by omitting the charge discharge electrode 26 and controlling the potential of the first electrode 21, overflowed electrons may be discharged via the first electrode 21.

Embodiment 9

Embodiment 9 is a modification of Embodiments 1 to 8, and relates to the imaging element or the like including a plurality of charge storage electrode segments according to the present disclosure.

Figure 6B:
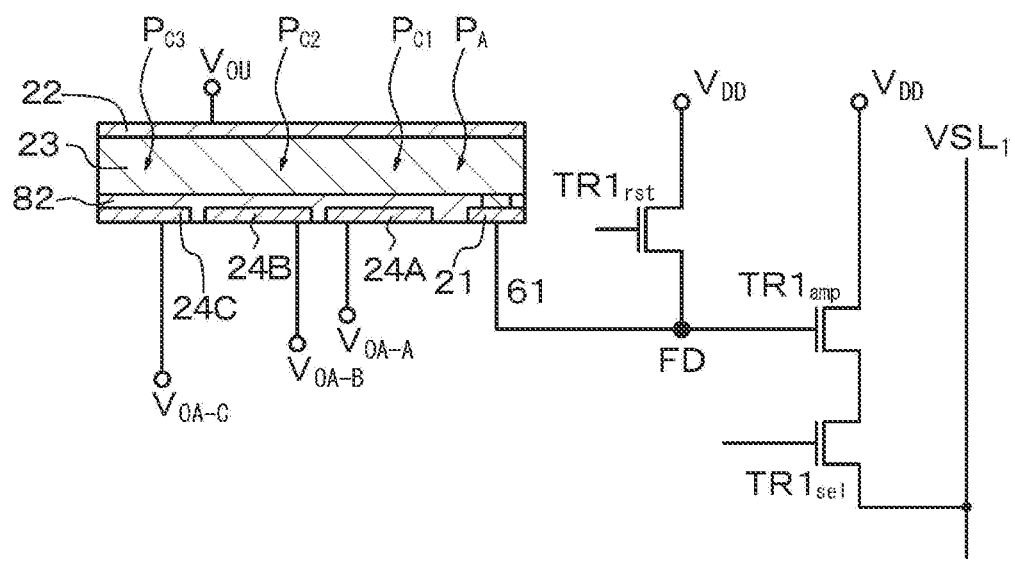
Figure 31:
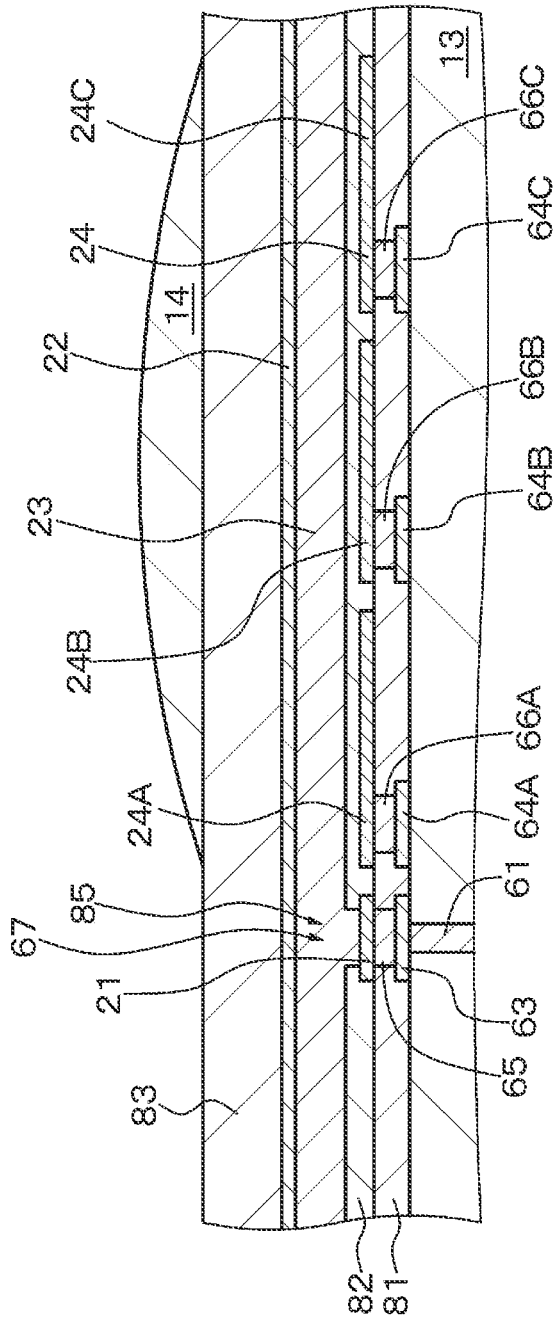
FIG. 31 is a schematic partial sectional view of an imaging element of Embodiment 9.
Figure 32:
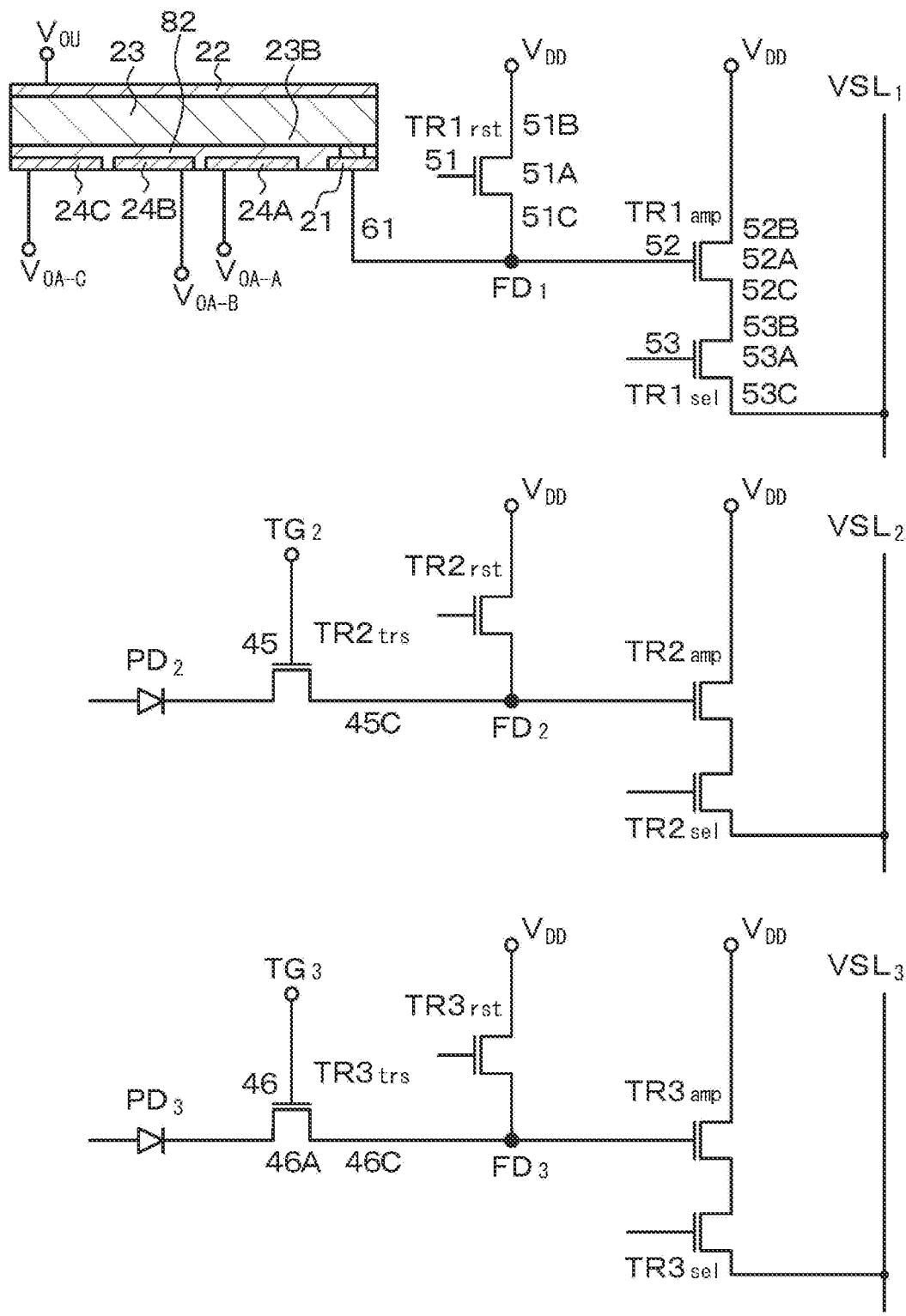
FIG. 32 is an equivalent circuit diagram of the imaging element of Embodiment 9.
Figure 33:
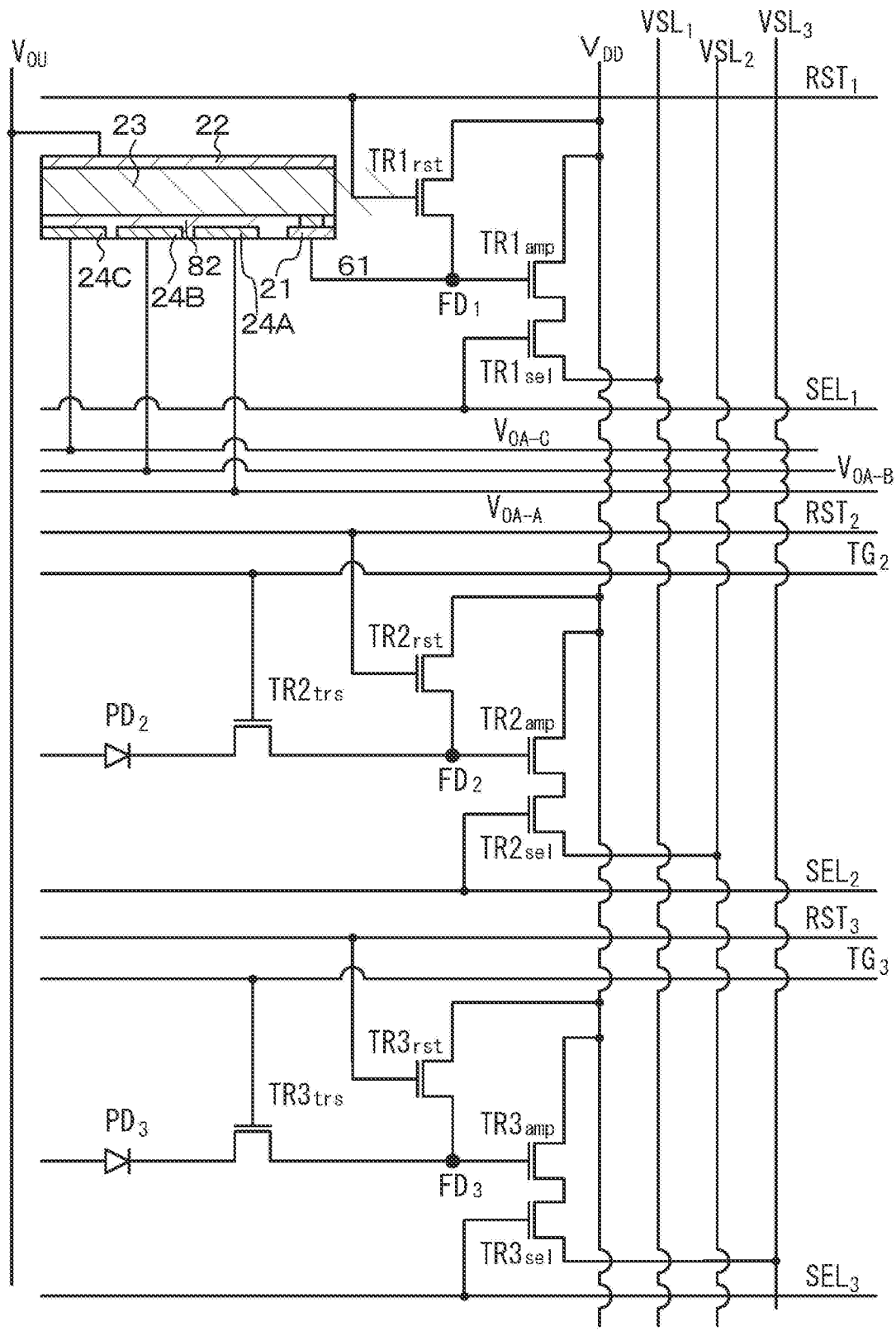
FIG. 33 is an equivalent circuit diagram of the imaging element of Embodiment 9.
Figure 34:
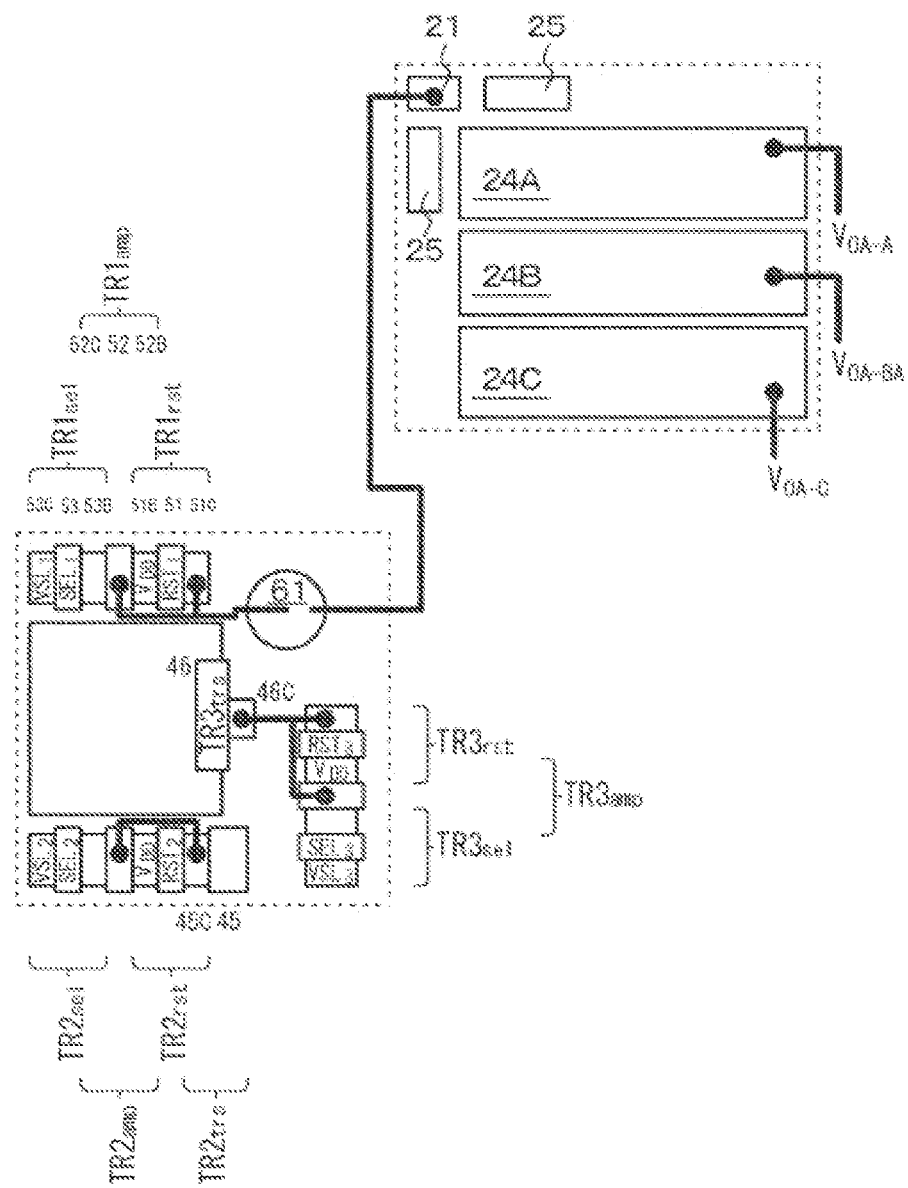
FIG. 34 is a schematic arrangement view of a first electrode and a charge storage electrode forming the imaging element of Embodiment 9 and a transistor forming a control unit.

A schematic partial sectional view of a part of the imaging element of Embodiment 9 is shown in FIG. 31, an equivalent circuit diagram of the imaging element of Embodiment 9 is shown in FIGS. 32 and 33, a schematic arrangement view of the first electrode and the charge storage electrode forming the photoelectric conversion unit including the charge storage electrode of the imaging element of Embodiment 9, and a transistor forming the control unit is shown in FIG. 34, and a potential state of each portion during an operation of the imaging element of Embodiment 9 is schematically shown in FIGS. 35 and 36. Furthermore, an equivalent circuit diagram of the imaging element of Embodiment 9 for describing each portion of FIGS. 35 and 36 is shown in FIG. 6B. Further, in Embodiments 9 to 15, specific description of the transfer control electrode 25 will be omitted. Furthermore, illustration of the transfer control electrode 25 in FIGS. 36B, 32, and 33 is omitted.

In Embodiment 9, the charge storage electrode 24 includes a plurality of the charge storage electrode segments 24A, 24B, and 24C. The number of the charge storage electrode segments may be 2 or more, and is set to "3" in Embodiment 9. Further, in the imaging element of Embodiment 9, since the potential of the first electrode 21 is higher than the potential of the second electrode 22, that is, for example, a positive potential is applied to the first electrode 21, and a negative potential is applied to the second electrode 22. Thus, in the charge transfer period, the potential applied to the charge storage electrode segment 24A located closest to the first electrode 21 is higher than the potential applied to the charge storage electrode segment 24C located farthest from the first electrode 21. In this way, electrons that have stopped in the region of the photoelectric conversion layer 23 opposite to the charge storage electrode 24 are further reliably read out to the first electrode 21, and further to the first floating diffusion layer $FD_1$ by imparting a potential gradient to the charge storage electrode 24. That is, the charges stored in the photoelectric conversion layer 23 are read out to the control unit.

In an example shown in FIG. 35, when the potential of charge storage electrode segment 24C<the potential of charge storage electrode segment 24B<the potential of charge storage electrode segment 24A in the charge transfer period, electrons that have stopped in the region of the photoelectric conversion layer 23 are simultaneously read out to the first floating diffusion layer $FD_1$. On the other hand, in an example shown in FIG. 36, when the potential of the charge storage electrode segment 24C, the potential of the charge storage electrode segment 24B, and the potential of the charge storage electrode segment 24A are gradually changed (that is, changed in a step manner or in a slope manner) in the charge transfer period, the electrons that have stopped in the region of the photoelectric conversion layer 23 opposite to the charge storage electrode segment 24C are moved to the region of the photoelectric conversion layer 23 opposite to the charge storage electrode segment 24B, subsequently, the electrons that have stopped in the region of the photoelectric conversion layer 23 opposite to the charge storage electrode segment 24B are moved to the region of the photoelectric conversion layer 23 opposite to the charge storage electrode segment 24A, and subsequently, the electrons that have stopped in the region of the photoelectric conversion layer 23 opposite to the charge storage electrode segment 24A are reliably read out to the first floating diffusion layer $FD_1$.

Figure 37:
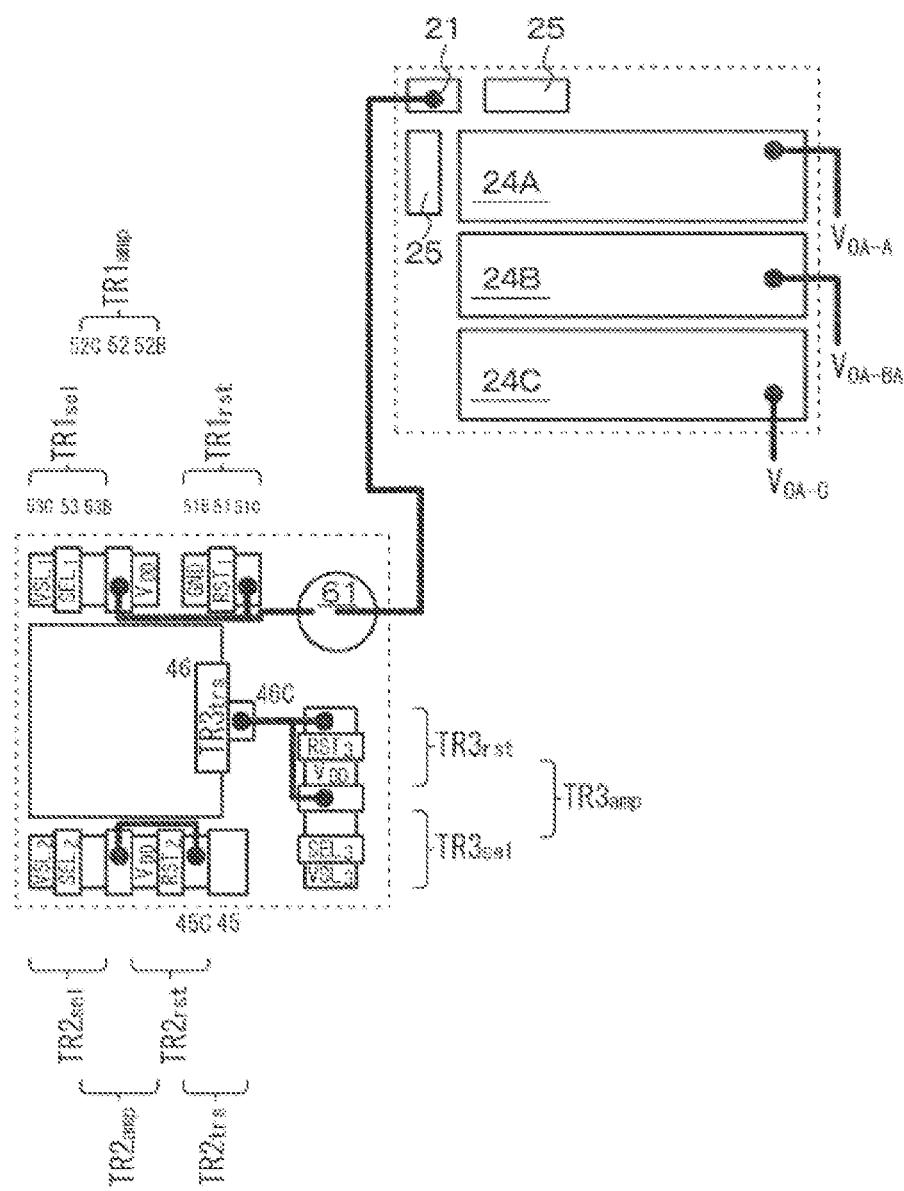
FIG. 37 is a schematic arrangement view of a first electrode and a charge storage electrode forming a modified example of the imaging element of Embodiment 9.

As a schematic arrangement view of a first electrode and a charge storage electrode forming a modified example of the imaging element of Embodiment 9 and a transistor forming a control unit shown in FIG. 37, a source/drain region 51B of another side of the reset transistor $TR1_{rst}$ may be grounded instead of being connected to the power supply $V_{DD}$.

Embodiment 10

Embodiment 10 is a modification of Embodiments 1 to 9 and relates to the imaging element of the first and sixth configurations.

Figure 38:
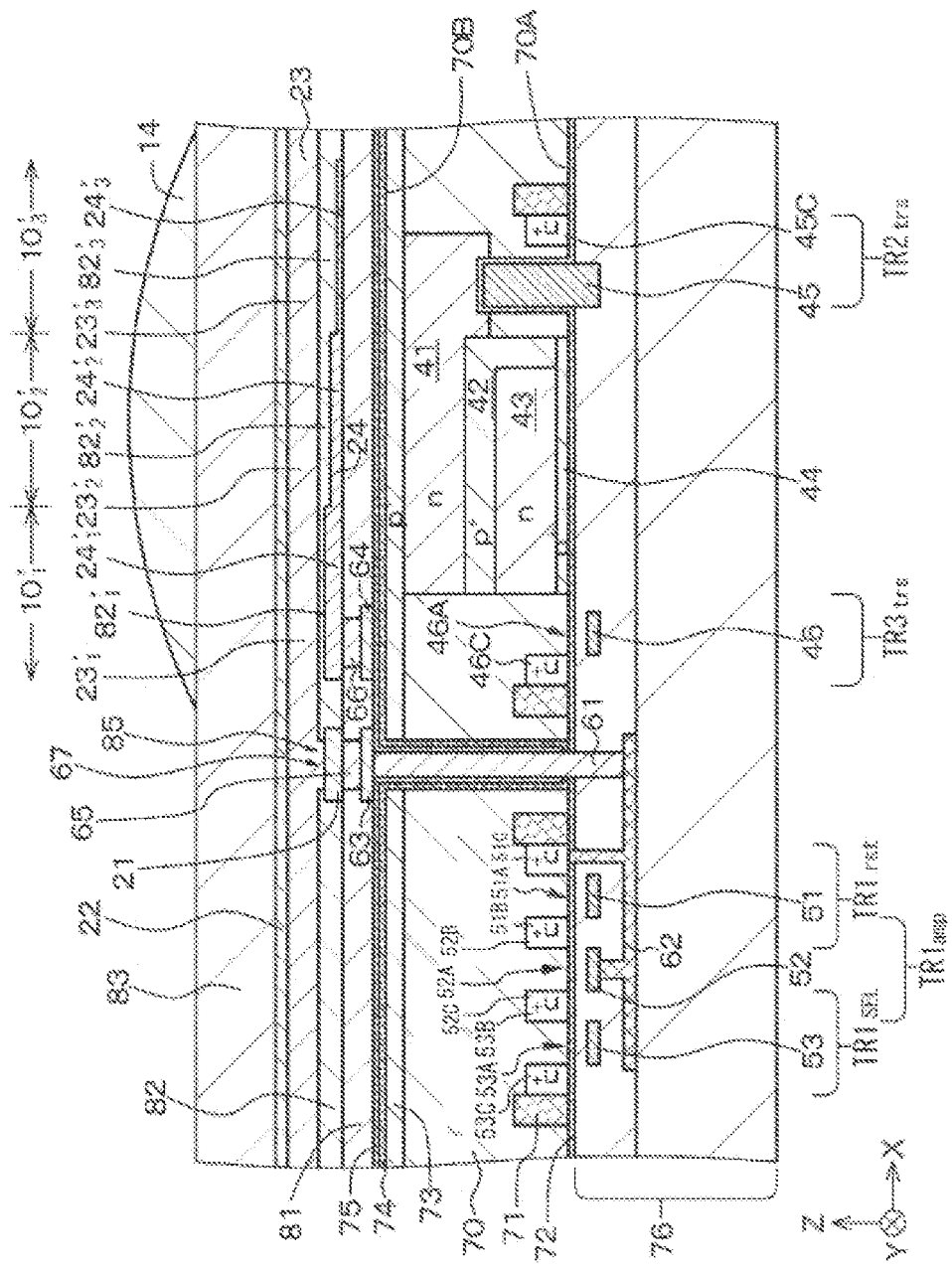
FIG. 38 is a schematic partial sectional view of an imaging element of Embodiment 10.
Figure 39:
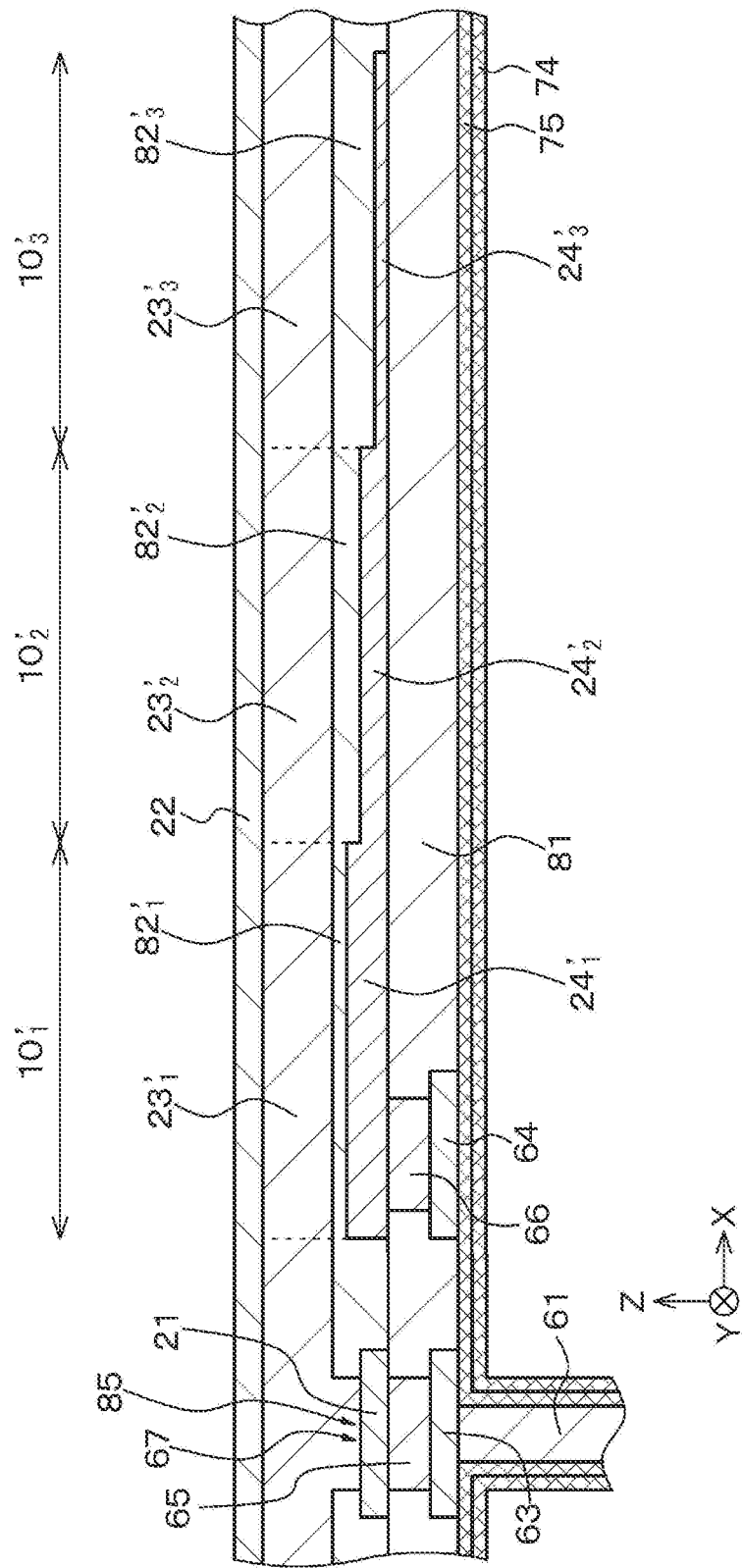
FIG. 39 is an enlarged schematic partial sectional view of a part in which a charge storage electrode, a photoelectric conversion layer, and a second electrode are stacked in the imaging element of Embodiment 10.

A schematic partial sectional view of the imaging element of Embodiment 10 is shown in FIG. 38 and an enlarged schematic partial sectional view of a part in which the charge storage electrode, the photoelectric conversion layer, and the second electrode are stacked is shown in FIG. 39. An equivalent circuit diagram of the imaging element of Embodiment 10 is similar to the equivalent circuit diagram of the imaging element of Embodiment 1 described in FIGS. 7 and 8, and a schematic arrangement view of the first electrode and the charge storage electrode forming the photoelectric conversion unit including the charge storage electrode of the imaging element of Embodiment 10, and a transistor forming the control unit is similar to that of the imaging element of Embodiment 1 described in FIG. 3, 4, 5A, or 5B. Furthermore, an operation of the imaging element (the first imaging element) of Embodiment 10 is substantially similar to the operation of the imaging element of Embodiment 1.

Here, in the imaging element of Embodiment 10 or imaging elements of Embodiments 11 to 15 to be described below, the photoelectric conversion unit includes N (where N≥2) photoelectric conversion unit segments (specifically, three photoelectric conversion unit segments $10'_1$, $10'_2$, and $10'_3$).

The photoelectric conversion layer 23 includes N photoelectric conversion layer segments (specifically, three photoelectric conversion layer segments $23'_1$, $23'_2$, and $23'_3$).

The insulating layer 82 includes N insulating layer segments (specifically, three insulating layer segments $82'_1$, $82'_2$, and $82'_3$).

In Embodiments 10 to 12, the charge storage electrode 24 includes N charge storage electrode segments (specifically, in each embodiment, three charge storage electrode segments $24'_1$, $24'_2$, and $24'_3$).

In Embodiments 13 and 14, in some cases, the charge storage electrode 24 includes N charge storage electrode segments disposed to be separated from each other in Embodiment 12 (specifically, three charge storage electrode segments $24'_1$, $24'_2$, and $24'_3$).

An $n^{th}$ (where n=1, 2, 3, . . . , N) photoelectric conversion unit segment $10'_n$ includes an $n^{th}$ charge storage electrode segment $24'_n$, an $n^{th}$ insulating layer segment $82'_n$, and an $n^{th}$ photoelectric conversion layer segment $23'_n$.

The photoelectric conversion unit segment of a larger value of n is located more away from the first electrode 21.

Further, in the photoelectric conversion layer segment, the thickness of a part of the photoelectric conversion layer may be changed and the thickness of the part of the insulating layer may be set to be constant to change the thickness of the photoelectric conversion layer segment, the thickness of the part of the photoelectric conversion layer may be set to be constant and the thickness of a part of the insulating layer may be changed to change the thickness of the photoelectric conversion layer segment, or the thickness of the part of the photoelectric conversion layer may be changed and the thickness of the part of the insulating layer may be changed to change the thickness of the photoelectric conversion layer segment.

The imaging element of Embodiment 10 or the imaging element of Embodiments 11 and 14 described below includes a photoelectric conversion unit formed by stacking a first electrode 21, a photoelectric conversion layer 23, and a second electrode 22, and the photoelectric conversion unit further includes a charge storage electrode 24 which is disposed to be spaced apart from the first electrode 21 and is disposed to face the photoelectric conversion layer 23 via the insulating layer 82.

Further, in a case in which a stacking direction of the charge storage electrode 24, the insulating layer 82, and the photoelectric conversion layer 23 is defined as a Z direction and a direction away from the first electrode 21 is defined as an X direction, the cross-sectional area of the stacked portion when the stacked portion in which the charge storage electrode 24, the insulating layer 82, and the photoelectric conversion layer 23 are stacked is cut in a YZ virtual plane changes depending on the distance from the first electrode.

Furthermore, in the imaging element of Embodiment 10, the thickness of the insulating layer segment gradually changes from the first photoelectric conversion unit segment $10'_1$ to the $N^{th}$ photoelectric conversion unit segment $10'_N$. Specifically, the thickness of the insulating layer segment gradually increases. Alternatively, in the imaging element of Embodiment 10, the width of the cross section of the stacked portion is constant and the thickness of the cross section of the stacked portion, specifically, the thickness of the insulating layer segment gradually increases depending on the distance from the first electrode 21. Further, the thickness of the insulating layer segment increases in a stepwise manner. The thickness of the insulating layer segment $82'_n$ in the $n^{th}$ photoelectric conversion unit segment $10'_n$ is constant. When the thickness of the insulating layer segment $82'_n$ in the $n^{th}$ photoelectric conversion unit segment $10'_n$ is defined as "1", the thickness of the insulating layer segment $82'_{(n+1)}$ in the $(n+1)^{th}$ photoelectric conversion unit segment $10'_{(n+1)}$ may be 2 to 10, but are not limited thereto. In Embodiment 10, the thickness of the insulating layer segments $82'_1$, $82'_2$, and $82'_3$ gradually increases by gradually decreasing the thickness of the charge storage electrode segments $24'_1$, $24'_2$, and $24'_3$. The thickness of the photoelectric conversion layer segments $23'_1$, $23'_2$, and $23'_3$ is constant.

Hereinafter, the operation of the imaging element of Embodiment 10 will be described.

In the charge storage period, the potential $V_{11}$ is applied to the first electrode 21 and the potential $V_{12}$ is applied to the charge storage electrode 24, from the drive circuit. Photoelectric conversion occurs in the photoelectric conversion layer 23 by light incident on the photoelectric conversion layer 23. The holes generated by the photoelectric conversion are sent from the second electrode 22 to the drive circuit via a wiring $V_{OU}$. On the other hand, since the potential of the first electrode 21 is higher than the potential of the second electrode 22, that is, for example, a positive potential is applied to the first electrode 21 and a negative potential is applied to the second electrode 22, and thus $V_{12} \geq V_{11}$, or preferably $V_{12} > V_{11}$. As a result, the electrons generated by the photoelectric conversion are attracted to the charge storage electrode 24 and stop at the region of the photoelectric conversion layer 23 opposite to the charge storage electrode 24. That is, charges are stored in the photoelectric conversion layer 23. Since $V_{12} > V_{11}$, electrons generated in the photoelectric conversion layer 23 do not move toward the first electrode 21. As the photoelectric conversion time elapses, the potential in the region of the photoelectric conversion layer 23 opposite to the charge storage electrode 24 becomes a more negative value.

In the imaging element of Embodiment 10, since the configuration in which the thickness of the insulating layer segment gradually increases is adopted, when $V_{12} \geq V_{11}$ in the charge storage period, the $n^{th}$ photoelectric conversion unit segment $10'_n$ can store a larger amount of charge as compared to the $(n+1)^{th}$ photoelectric conversion unit segment $10'_{(n+1)}$, and a strong electric field can be applied thereto, and thus can reliably prevent the charge flow from the first photoelectric conversion unit segment $10'_1$ to the first electrode 21.

A reset operation is performed at the latter stage of the charge storage period. As a result, the potential of the first floating diffusion layer $FD_1$ is reset such that the potential of the first floating diffusion layer $FD_1$ becomes the potential $V_{DD}$ of the power supply.

After the reset operation is completed, charges are read out. That is, in the charge transfer period, the potential $V_{21}$ is applied to the first electrode 21 and the potential $V_{22}$ is applied to the charge storage electrode 24, from the drive circuit. Here, it is assumed that $V_{21} > V_{22}$. As a result, electrons that have stopped in the region of the photoelectric conversion layer 23 opposite to the charge storage electrode 24 are read out to the first electrode 21 and further to the first floating diffusion layer $FD_1$. That is, the charges stored in the photoelectric conversion layer 23 are read out to the control unit.

More specifically, when $V_{21} > V_{22}$ in the charge transfer period, the charge flow from the first photoelectric conversion unit segment $10'_1$ to the first electrode 21, the charge flow from the $(n+1)^{th}$ photoelectric conversion unit segment $10'_{(n+1)}$ to the $n^{th}$ photoelectric conversion unit segment $10'_n$ can be reliably secured.

Thus, a series of operations including charge storage, reset operation, charge transfer, and the like is completed.

In the imaging element of Embodiment 10, since the thickness of the insulating layer segments gradually changes from the first photoelectric conversion unit segment to the $N^{th}$ photoelectric conversion unit segment, or, since the cross-sectional area of the stacked portion when the stacked portion in which the charge storage electrode, the insulating layer, and the photoelectric conversion layer are stacked is cut in a YZ virtual plane changes depending on the distance from the first electrode, a type of charge transfer gradient is formed, and charges generated by photoelectric conversion can be transferred more easily and reliably.

Since the imaging element of Embodiment 10 can be manufactured substantially in accordance with a similar method to that of the imaging element of Embodiment 1, detailed description will be omitted.

Figure 40:
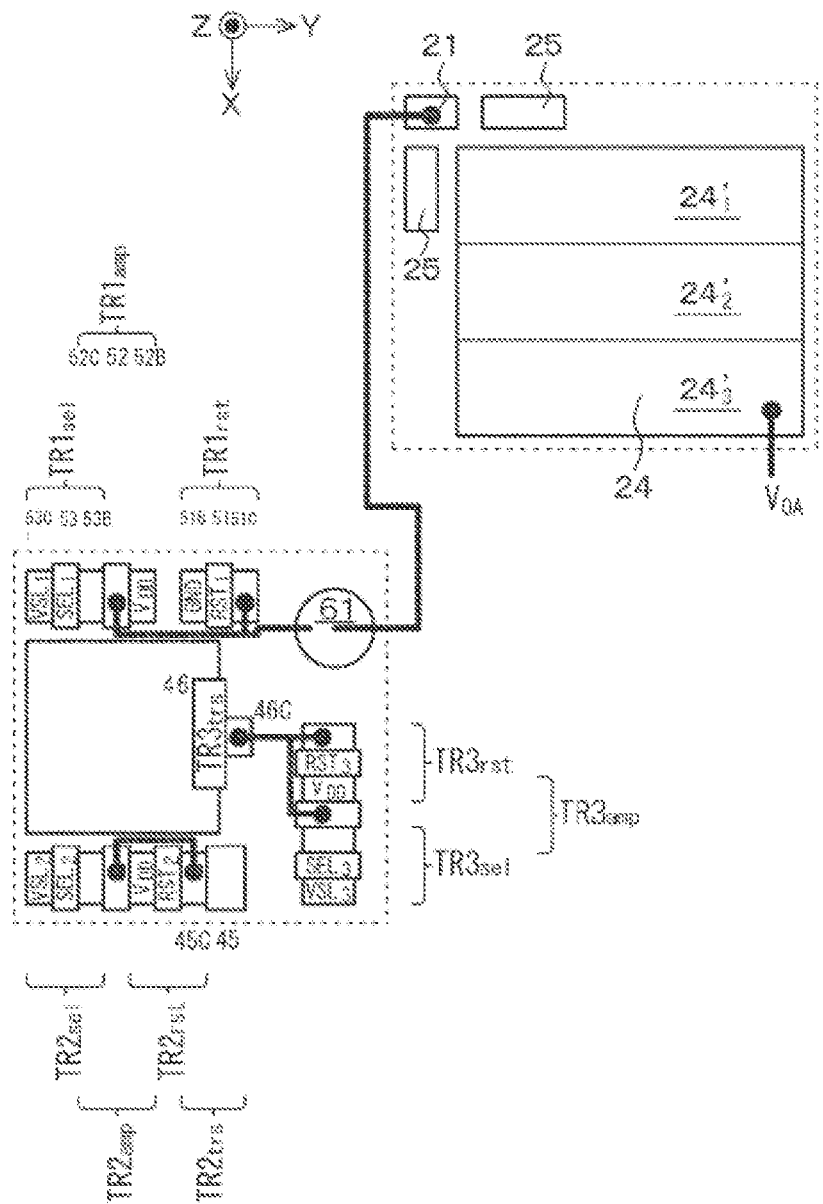
FIG. 40 is a schematic arrangement view of the first electrode and the charge storage electrode forming the modified example of the imaging element of Embodiment 10, and a transistor forming a control unit.

Further, in the imaging element of Embodiment 10, in the formation of the first electrode 21, the charge storage electrode 24, and the insulating layer 82, first, a conductive material for forming the charge storage electrode $24'_3$ is formed on the interlayer insulating layer 81 and the conductive material layer is patterned to leave the conductive material layer in the region where the photoelectric conversion unit segments $10'_1$, $10'_2$, and $10'_3$ and the first electrode 21 are to be formed, whereby a part of the first electrode 21 and the charge storage electrode $24'_3$ may be obtained. Next, an insulating layer for forming the insulating layer segment $82'_3$ is formed on the entire surface, the insulating layer is patterned, and a flattening treatment is performed thereon, and thereby the insulating layer segment $82'_3$ may be obtained. Next, a conductive material layer for forming the charge storage electrode $24'_2$ is formed on the entire surface, and the conductive material layer is patterned to leave the conductive material layer in the region where the photoelectric conversion unit segments $10'_1$ and $10'_2$ and the first electrode 21 are to be formed, and thereby a part of the first electrode 21 and the charge storage electrode $24'_2$ may be obtained. Next, an insulating layer for forming the insulating layer segment $82'_2$ is formed on the entire surface, the insulating layer is patterned, and planarization treatment is performed thereon, and thereby the insulating layer segment $82'_2$ may be obtained. Next, a conductive material layer for forming the charge storage electrode $24'_1$ is formed on the entire surface, and the conductive material layer is patterned to leave the conductive material layer in the region where the photoelectric conversion unit segment $10'_1$ and the first electrode 21 are to be formed, and thereby the first electrode 21 and the charge storage electrode $24'_1$ may be obtained. Next, the insulating layer is formed on the entire surface, and planarization treatment is performed thereon, and thereby the insulating layer segment $82'_1$ (insulating layer 82) may be obtained. Then, the photoelectric conversion layer 23 is formed on the insulating layer 82. Thus, the photoelectric conversion unit segments $10'_1$, $10'_2$, and $10'_3$ may be obtained. As a schematic arrangement view of a first electrode and a charge storage electrode forming a modified example of the imaging element of Embodiment 10 and a transistor forming a control unit shown in FIG. 40, a source/drain region 51B of another side of the reset transistor $TR1_{rst}$ may be grounded instead of being connected to the power supply $V_{DD}$.

Embodiment 11

Figure 41:
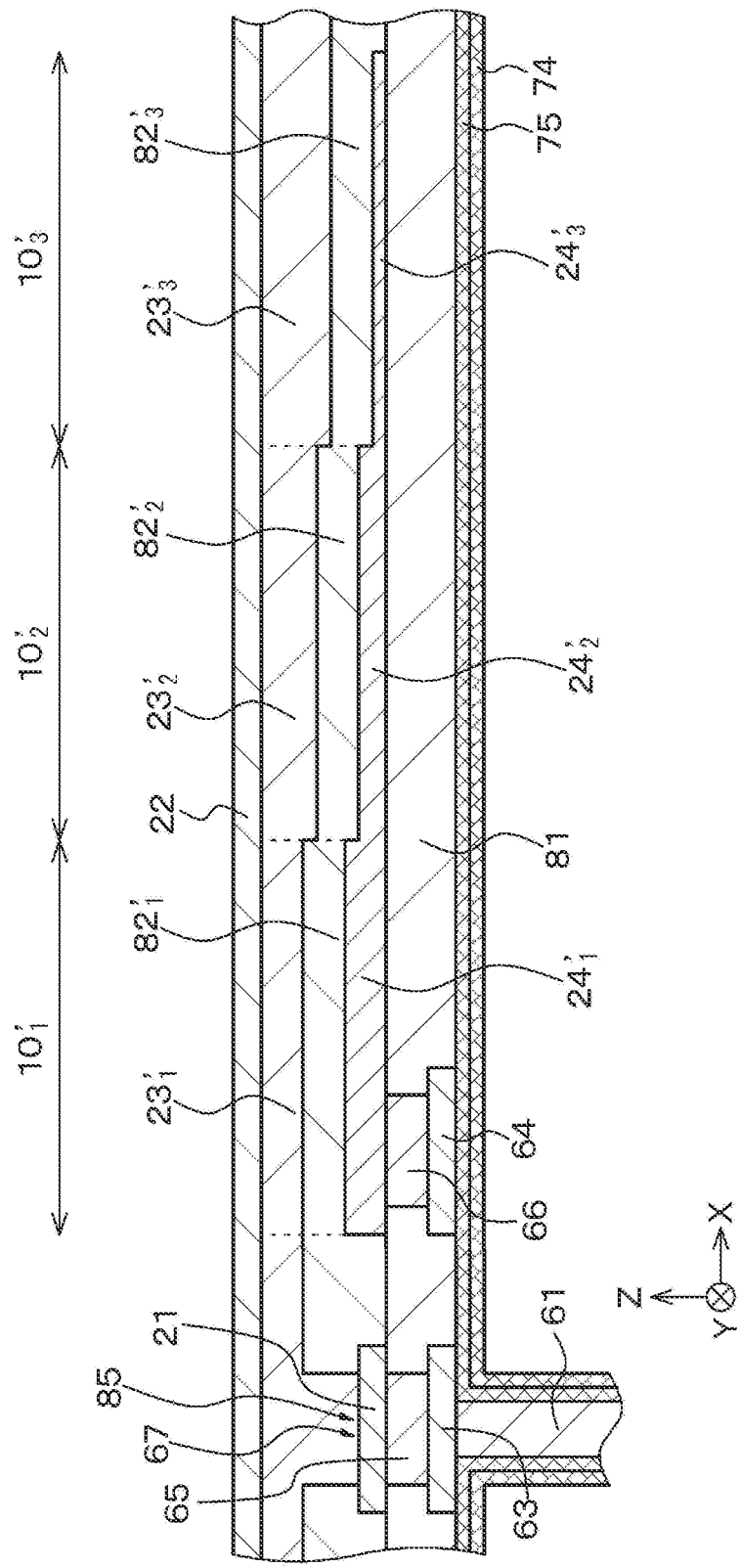
FIG. 41 is an enlarged schematic partial sectional view of a part in which a charge storage electrode, a photoelectric conversion layer, and a second electrode are stacked in an imaging element of Embodiment 11.

The imaging element of Embodiment 11 relates to an imaging element according to the second and sixth configurations. As shown in FIG. 41 which is an enlarged schematic partial sectional view of a part in which a charge storage electrode, a photoelectric conversion layer, and a second electrode are stacked, in an imaging element of Embodiment 11, the thickness of the photoelectric conversion layer segment gradually changes from the first photoelectric conversion unit segment $10'_1$ to the $N^{th}$ photoelectric conversion unit segment $10'_N$. Alternatively, in the imaging element of Embodiment 11, the width of the cross section of the stacked portion is constant and the thickness of the cross section of the stacked portion, specifically the thickness of the photoelectric conversion layer segment gradually increases depending on the distance from the first electrode 21. More specifically, the thickness of the photoelectric conversion layer segment gradually increases. Further, the thickness of the photoelectric conversion layer segment increases in a stepwise manner. The thickness of the photoelectric conversion layer segment $23'_n$ in the $n^{th}$ photoelectric conversion unit segment $10'_n$ is constant. When the thickness of the photoelectric conversion layer segment $23'_n$ in the $n^{th}$ photoelectric conversion unit segment $10'_n$ is defined as "1", the photoelectric conversion layer segment $23_{(n+1)}$ in the $(n+1)^{th}$ photoelectric conversion unit segment $10_{(n+1)}$ may be exemplified as 2 to 10, but it is not limited to such values. In Embodiment 11, the thicknesses of the photoelectric conversion layer segments $23'_1$, $23'_2$, and $23'_3$ are gradually increased by gradually decreasing the thickness of the charge storage electrode segments $24'_1$, $24'_2$, and $24'_3$. The thickness of the insulating layer segments $82'_1$, $82'_2$, and $82'_3$ is constant. Furthermore, in the photoelectric conversion layer segment, for example, it is only required that the thickness of a part of the insulating layer is constant and the thickness of a part of the photoelectric conversion layer is changed to change the thickness of the photoelectric conversion layer segment.

In the imaging element of Embodiment 11, since the thickness of the photoelectric conversion layer segment gradually increases, when $V_{12} \geq V_{11}$ in the charge storage period, the $n^{th}$ photoelectric conversion unit segment $10'_n$ is applied with a stronger electric field than the $(n+1)^{th}$ photoelectric conversion unit segment $10'_{(n+1)}$, and thereby the charge flow from the first photoelectric conversion unit segment $10'_1$ to the first electrode 21 may be reliably prevented. Further, when $V_{22} < V_{21}$ in the charge transfer period, the charge flow from the first photoelectric conversion unit segment $10'_1$ to the first electrode 21, and the charge flow from the $(n+1)^{th}$ photoelectric conversion unit segment $10'_{(n+1)}$ to the $n^{th}$ photoelectric conversion unit segment $10'_n$ may be reliably ensured.

As such, in the imaging element of Embodiment 11, the thickness of the photoelectric conversion layer segment gradually changes from the first photoelectric conversion unit segment to the $N^{th}$ photoelectric conversion unit segment, or, the cross sectional area of the stacked portion when the stacked portion in which the charge storage electrode, the insulating layer, and the photoelectric conversion layer are stacked is cut in a YZ virtual plane changes depending on the distance from the first electrode, a type of charge transfer gradient is formed, and charges generated by photoelectric conversion can be transferred more easily and reliably.

In the imaging element of Embodiment 11, in the formation of the first electrode 21, the charge storage electrode 24, the insulating layer 82, and the photoelectric conversion layer 23, first, a conductive material for forming the charge storage electrode $24'_3$ is formed on the interlayer insulating layer 81 and the conductive material layer is patterned to leave the conductive material layer in the region where the photoelectric conversion unit segments $10'_1$, $10'_2$, and $10'_3$ and the first electrode 21 are to be formed, whereby a part of the first electrode 21 and the charge storage electrode $24'_3$ may be obtained. Next, a conductive material layer for forming the charge storage electrode $24'_2$ is formed on the entire surface, the conductive material layer is patterned to leave the conductive material layer in the region where the photoelectric conversion unit segments $10'_1$ and $10'_2$ and the first electrode 21 are to be formed, and thereby a part of the first electrode 21 and the charge storage electrode $24'_2$ may be obtained. Next, a conductive material layer for forming the charge storage electrode $24'_1$ is formed on the entire surface, the conductive material layer is patterned to leave the conductive material layer in the region where the photoelectric conversion unit segment $10'_1$ and the first electrode 21 are to be formed, and thereby the first electrode 21 and the charge storage electrode $24'_1$ may be obtained. Then, an insulating layer 82 is conformally deposited on the entire surface. Then, the photoelectric conversion layer 23 is formed on the insulating layer 82, and the photoelectric conversion layer 23 is subjected to planarization processing. Thus, the photoelectric conversion unit segments $10'_1$, $10'_2$, and $10'_3$ may be obtained.

Embodiment 12

Figure 42:
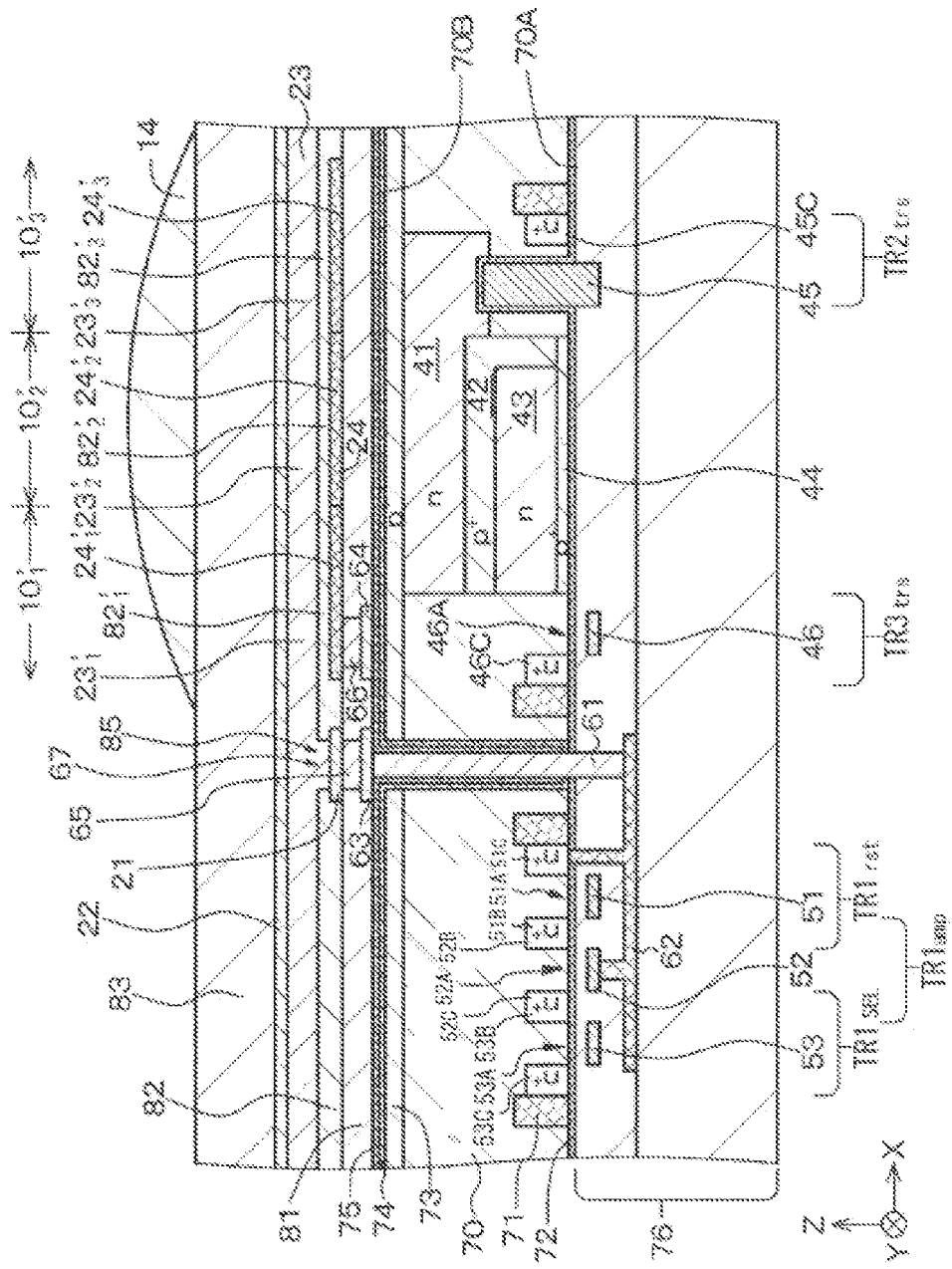
FIG. 42 is a schematic partial sectional view of an imaging element of Embodiment 12.

Embodiment 12 relates to the imaging element according to the third configuration. A schematic partial sectional view of the imaging element of Embodiment 12 is shown in FIG. 42. In the imaging element of Embodiment 12, materials forming the insulating layer segments are different in the adjacent photoelectric conversion unit segments. Here, the value of the relative dielectric constant of the material forming the insulating layer segment gradually decreases from the first photoelectric conversion unit segment $10'_1$ to the $N^{th}$ photoelectric conversion unit segment $10'_N$. In the imaging element of Embodiment 12, the same electric potential may be applied to all of the N charge storage electrode segments or different electric potentials may be applied to each of the N charge storage electrode segments. In the latter case, as described in Embodiment 13, the charge storage electrode segments $24'_1$, $24'_2$, and $24'_3$, which are disposed to be spaced apart from each other, may be connected to the vertical drive circuit 112 forming the drive circuit via pad portions 641, 642, and 643.

Further, when such a configuration is adopted, a type of charge transfer gradient is formed, and thus, when $V_{12} \geq V_{11}$ in the charge storage period, the $n^{th}$ photoelectric conversion unit segment stores a larger amount of charge than the $(n+1)^{th}$ photoelectric conversion unit segment. Further, in the state of $V_{22} < V_{21}$ during the charge storage period, the charge flow from the first photoelectric conversion unit segment to the first electrode, and the charge flow from the $(n+1)^{th}$ photoelectric conversion unit segment to the $n^{th}$ photoelectric conversion unit segment can be reliably ensured.

Embodiment 13

Figure 43:
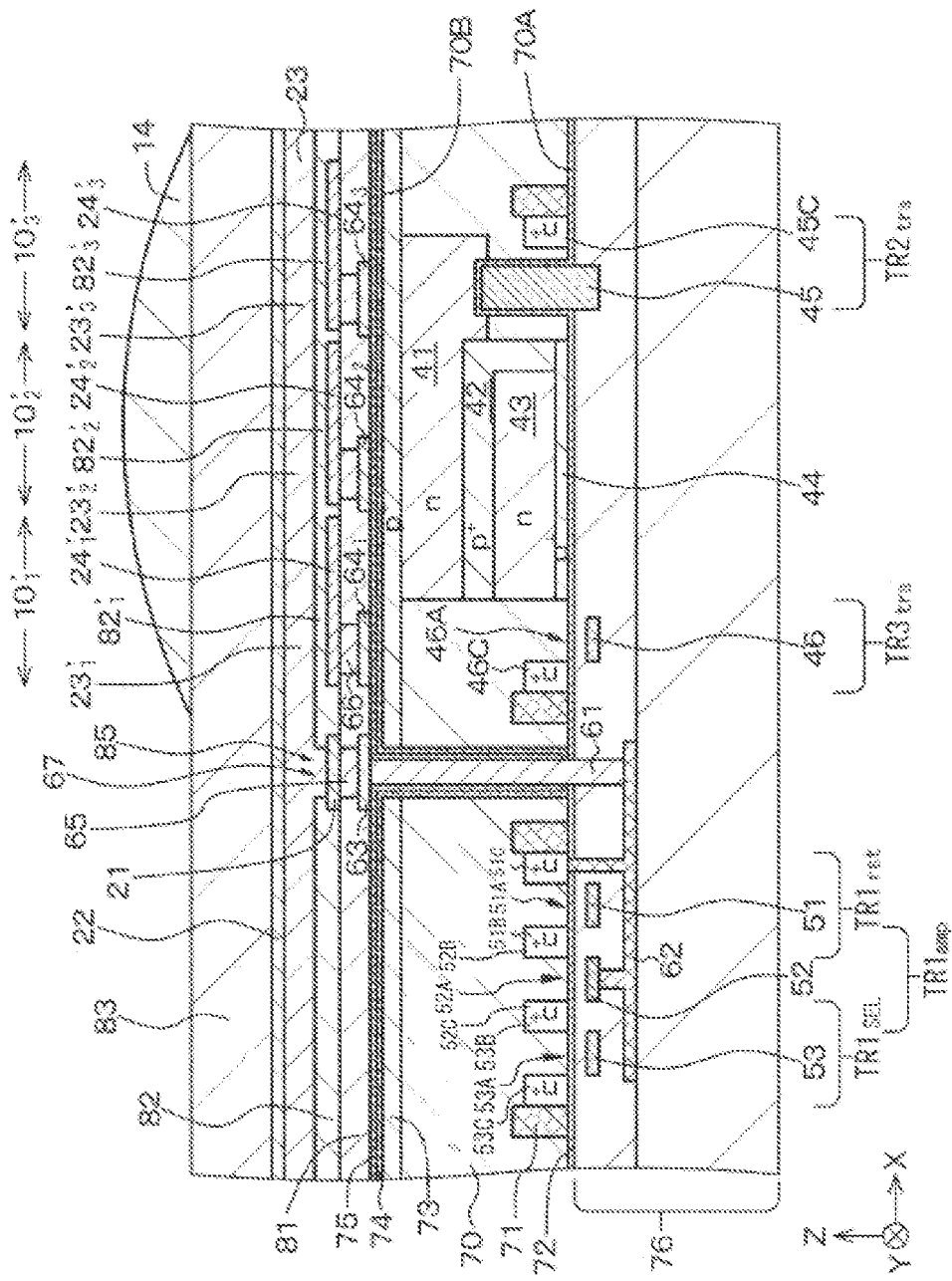
FIG. 43 is a schematic partial sectional view of an imaging element of Embodiment 13 and Embodiment 14.
Figure 44A:
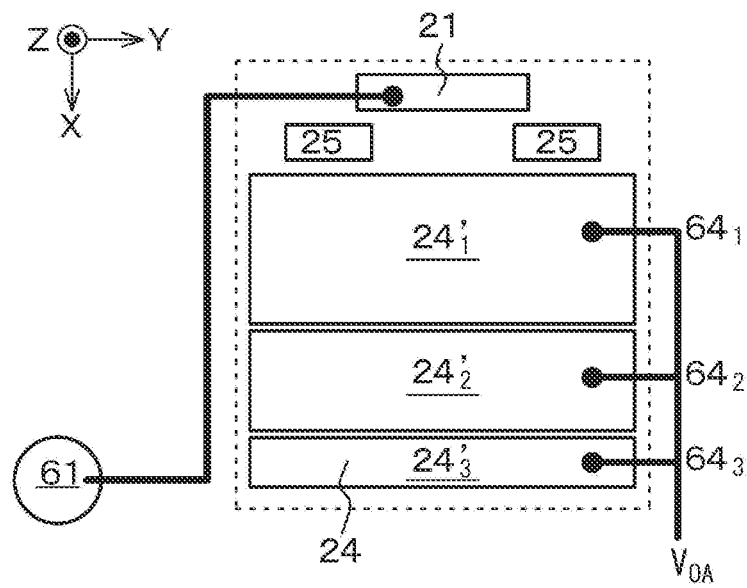
FIGS. 44A and 44B show schematic plan views of a charge storage electrode segment in Embodiment 14.
Figure 44B:
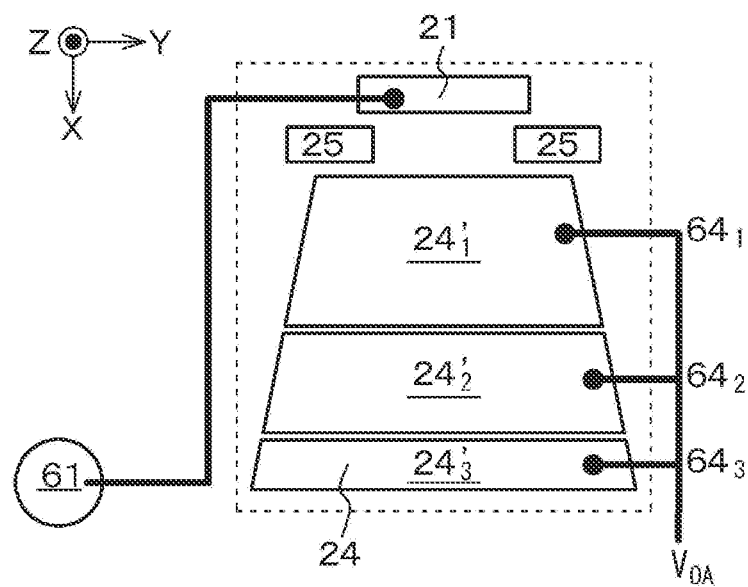
Figure 45A:
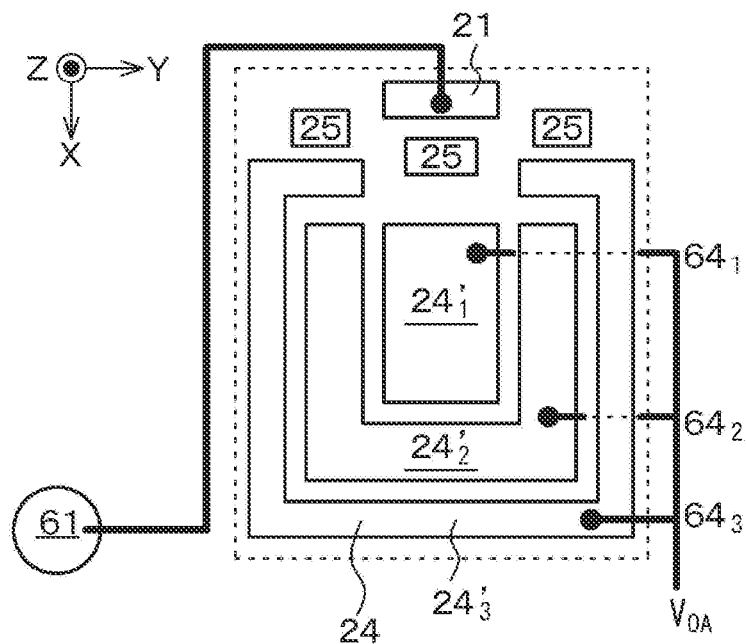
FIGS. 45A and 45B show schematic plan views of a charge storage electrode segment in Embodiment 14.
Figure 45B:
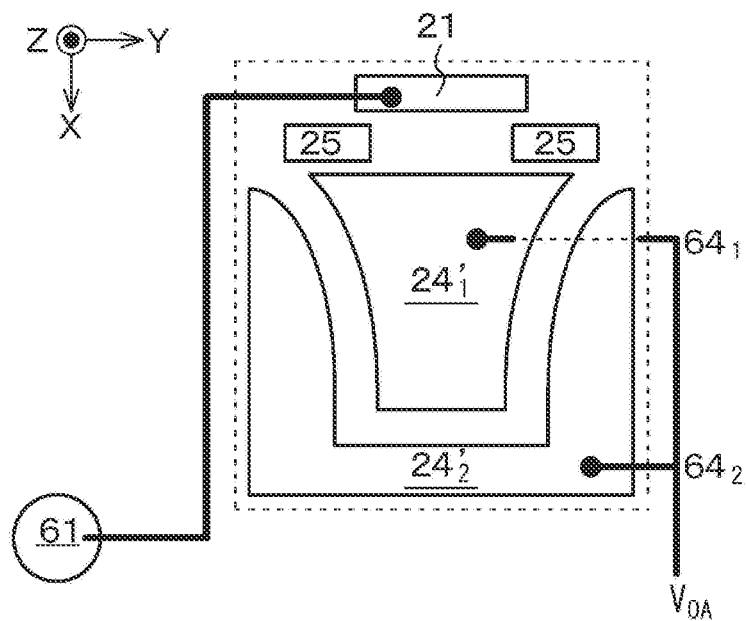

Embodiment 13 relates to the imaging element according to the fourth configuration. A schematic partial sectional view of the imaging element of Embodiment 13 is illustrated in FIG. 43. In the imaging element of Embodiment 13, materials forming the charge storage electrode segments are different in adjacent photoelectric conversion unit segments. Here, the value of the work function of the material forming the insulating layer segment gradually increases from the first photoelectric conversion unit segment $10'_1$ to the $N^{th}$ photoelectric conversion unit segment $10'_N$. In the imaging element of Embodiment 13, the same electric potential may be applied to all of the N charge storage electrode segments, or different electric potentials may be added to each of the N charge storage electrode segments. In the latter case, the charge storage electrode segments $24'_1$, $24'_2$, and $24'_3$ are connected to the vertical drive circuit 112 forming the drive circuit via the pad portions 641, 642, and 643.

Embodiment 14

Figure 46:
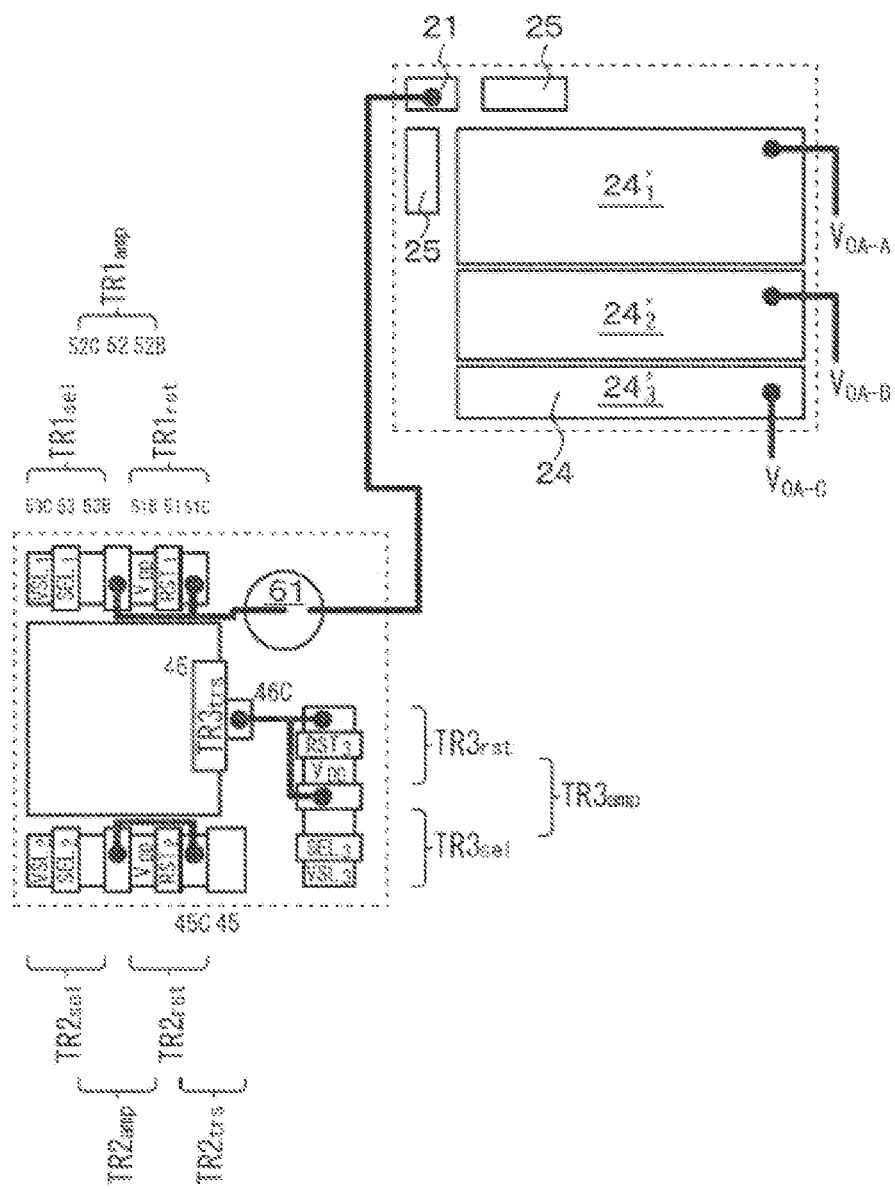
FIG. 46 is a schematic arrangement view of a first electrode and a charge storage electrode forming the imaging element of Embodiment 14, and a transistor forming a control unit.

The imaging element of Embodiment 14 relates to the imaging element according to the fifth configuration. Schematic plan views of the charge storage electrode segment of Embodiment 14 are shown in FIGS. 44A, 44B, 45A, and 45B, and a schematic arrangement view of a first electrode and a charge storage electrode forming the photoelectric conversion unit including the charge storage electrode of the imaging element of Embodiment 14 and a transistor forming a control unit is shown in FIG. 46. The schematic partial sectional view of the imaging element of Embodiment 14 is similar to that shown in FIG. 43 or 48. In the imaging element of Embodiment 14, the area of the charge storage electrode segment gradually decreases from the first photoelectric conversion unit segment $10'_1$ to the $N^{th}$ photoelectric conversion unit segment $10'_N$. In the imaging element of Embodiment 14, the same electric potential may be applied to all of the N charge storage electrode segments, or different electric potentials may be added to each of the N charge storage electrode segments. In the latter case, as described in Embodiment 13, the charge storage electrode segments $24'_1$, $24'_2$, and $24'_3$ disposed to be spaced apart from each other may be connected to the vertical drive circuit 112 forming the drive circuit via the pad portions 641, 642, and 643.

In Embodiment 14, the charge storage electrode 24 includes a plurality of the charge storage electrode segments $24'_1$, $24'_2$, and $24'_3$. The number of the charge storage electrode segments may be 2 or more, and is set to "3" in Embodiment 14. Further, in the imaging element of Embodiment 14, since the potential of the first electrode 21 is higher than the potential of the second electrode 22, that is, for example, a positive potential is applied to the first electrode 21 and the negative potential is applied to the second electrode 22, and thus, in the charge transfer period, the potential applied to the charge storage electrode segment $24'_1$ located closest to the first electrode 21 is higher than the potential applied to the charge storage electrode segment $24'_3$ located farthest from the first electrode 21. In this way, electrons that have stopped in the region of the photoelectric conversion layer 23 opposite to the charge storage electrode 24 are further reliably read out to the first electrode 21, and further to the first floating diffusion layer $FD_1$ by imparting a potential gradient to the charge storage electrode 24. That is, the charges stored in the photoelectric conversion layer 23 are read out to the control unit.

Then, when the potential of charge storage electrode segment $24'_3$<the potential of charge storage electrode segment $24'_2$<the potential of charge storage electrode segment $24'_1$ in the charge transfer period, electrons that have stopped in the region of the photoelectric conversion layer 23 are simultaneously read out to the first floating diffusion layer $FD_1$. On the other hand, when the potential of the charge storage electrode segment $24'_3$, the potential of the charge storage electrode segment $24'_2$, and the potential of the charge storage electrode segment $24'_1$ are gradually changed (that is, changed in a step manner or in a slope manner) in the charge transfer period, the electrons that have stopped in the region of the photoelectric conversion layer 23 opposite to the charge storage electrode segment $24'_3$ are moved to the region of the photoelectric conversion layer 23 opposite to the charge storage electrode segment $24'_2$, and subsequently, the electrons that have stopped in the region of the photoelectric conversion layer 23 opposite to the charge storage electrode segment $24'_2$ are moved to the region of the photoelectric conversion layer 23 opposite to the charge storage electrode segment $24'_1$, and subsequently, the electrons that have stopped in the region of the photoelectric conversion layer 23 opposite to the charge storage electrode segment $24'_1$ are reliably read out to the first floating diffusion layer $FD_1$.

Figure 47:
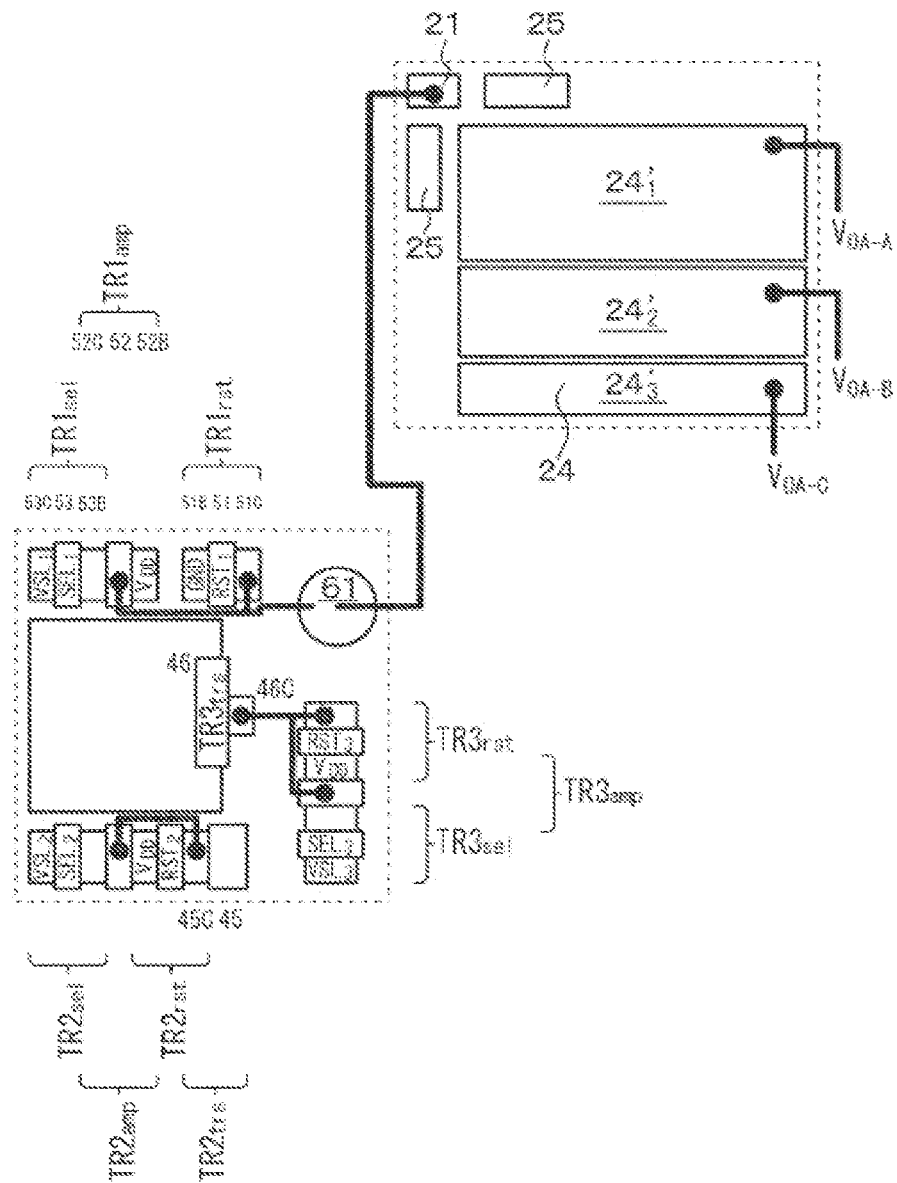
FIG. 47 is a schematic arrangement view of a first electrode and a charge storage electrode forming a modified example of the imaging element of Embodiment 14.

As a schematic arrangement view of a first electrode and a charge storage electrode forming a modified example of the imaging element of Embodiment 14 and a transistor forming a control unit shown in FIG. 47, a source/drain region 51B of another side of the reset transistor $TR3_{rst}$ may be grounded instead of being connected to the power supply $V_{DD}$.

Even in the imaging element of Embodiment 14, a type of charge transfer gradient is formed by adopting such a configuration. That is, since the area of the charge storage electrode segment gradually decreases from the first photoelectric conversion unit segment $10'_1$ to the $N^{th}$ photoelectric conversion unit segment $10'_N$, when $V_{12} \geq V_{11}$ in the charge storage period, the $n^{th}$ photoelectric conversion unit segment can store a larger amount of charge than the $(n+1)^{th}$ photoelectric conversion unit segment. Further, in the state of $V_{22} < V_{21}$ during the charge storage period, the charge flow from the first photoelectric conversion unit segment to the first electrode, and the charge flow from the $(n+1)^{th}$ photoelectric conversion unit segment to the $n^{th}$ photoelectric conversion unit segment can be reliably ensured.

Embodiment 15

Figure 48:
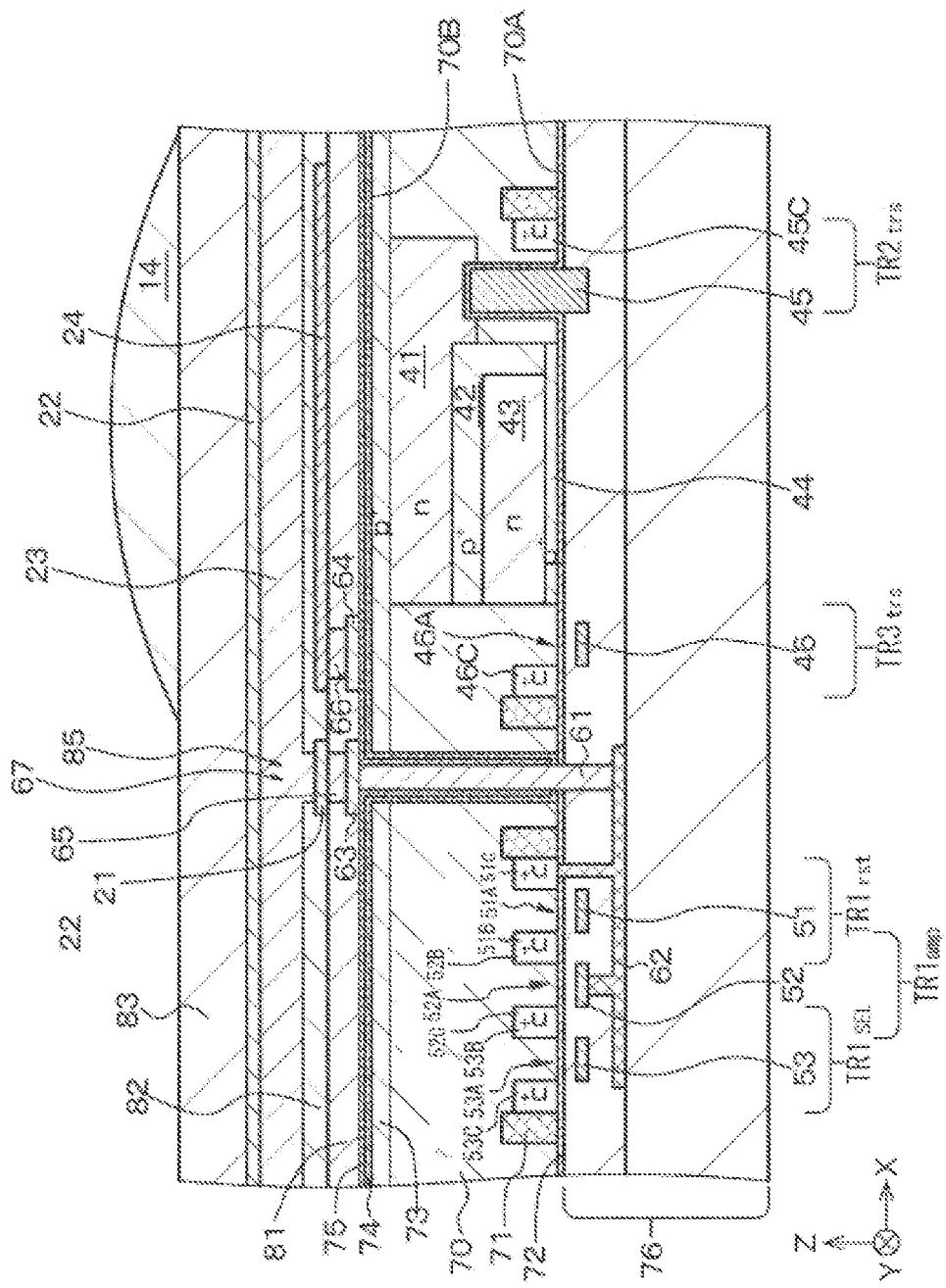
FIG. 48 is a schematic partial sectional view of an imaging element of Embodiment 15 and Embodiment 14.
Figure 49A:
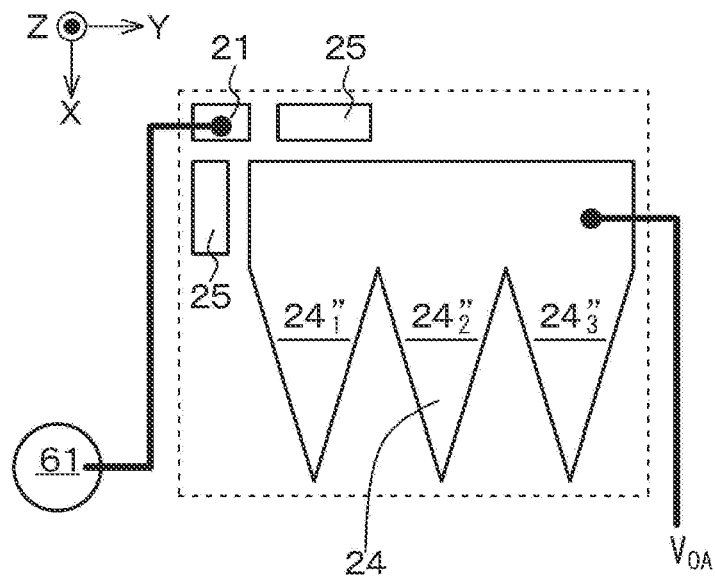
FIGS. 49A and 49B show schematic plan views of a charge storage electrode segment in Embodiment 15.
Figure 49B:
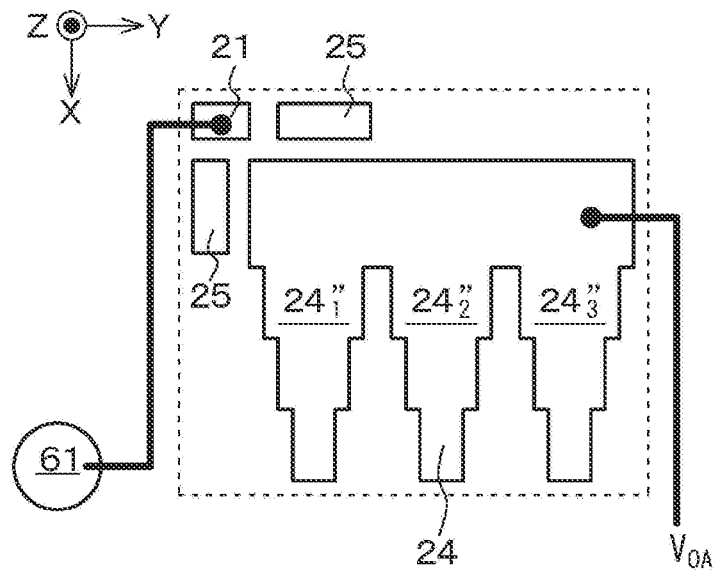

Embodiment 15 relates to the imaging element according to the sixth configuration. A schematic partial sectional view of the imaging element of Embodiment 15 is shown in FIG. 48. Furthermore, schematic plan views of the charge storage electrode segments of Embodiment 15 are shown in FIGS. 49A and 49B. The imaging element of Embodiment 15 includes a photoelectric conversion unit formed by stacking a first electrode 21, a photoelectric conversion layer 23, and a second electrode 22, and the photoelectric conversion unit further includes a charge storage electrode 24 ($24''_1$, $24''_2$, $24''_3$) which is disposed to be spaced apart from the first electrode 21 and is disposed to face the photoelectric conversion layer 23 via the insulating layer 82. Further, in a case in which a stacking direction of the charge storage electrode 24 ($24''_1$, $24''_2$, $24''_3$), the insulating layer 82, and the photoelectric conversion layer 23 is defined as a Z direction and a direction away from the first electrode 21 is defined as an X direction, the cross-sectional area of the stacked portion when the stacked portion in which the charge storage electrode 24 ($24''_1$, $24''_2$, $24''_3$), the insulating layer 82, and the photoelectric conversion layer 23 are stacked is cut in a YZ virtual plane changes depending on the distance from the first electrode 21.

Specifically, in the imaging element of Embodiment 15, the thickness of the cross section of the stacked portion is constant, and the width of the cross section of the stacked portion is narrowed as being away from the first electrode 21. Further, the width may be continuously narrowed (see FIG. 49A), or may be narrowed in a stepwise manner (see FIG. 49B).

As described above, in the imaging element of Embodiment 15, since the cross-sectional area of the stacked portion when the stacked portion in which the charge storage electrode 24 ($24''_1$, $24''_2$, $24''_3$), the insulating layer 82, and the photoelectric conversion layer 23 are stacked is cut in the YZ virtual plane varies depending on the distance from the first electrode, a type of charge transfer gradient is formed, and the charges generated by photoelectric conversion can be transferred more easily and reliably.

Although the present disclosure has been described on the basis of the preferred embodiments, the present disclosure is not limited to these embodiments. The structure and configuration, the manufacturing conditions, the manufacturing method, and the used materials of the stacked-type imaging element, imaging element, and solid-state imaging apparatus described in the embodiments are illustrative and may be suitably changed. The imaging elements of each embodiment can be used in combination appropriately. For example, the imaging element of Embodiment 10, the imaging element of Embodiment 11, the imaging element of Embodiment 12, the imaging element of Embodiment 13, and the imaging element of Embodiment 14 may be arbitrarily combined, and the imaging element of Embodiment 10, the imaging element of Embodiment 11, the imaging element of Embodiment 12, the imaging element of Embodiment 13, and the imaging element of Embodiment 15 may be arbitrarily combined.

Figure 63A:
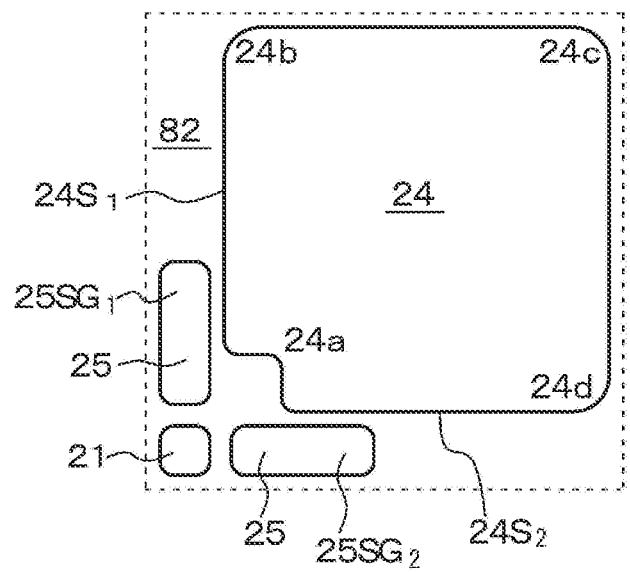
FIGS. 63A and 63B are schematic arrangement views of the first electrode, the charge storage electrode, and the transfer control electrode according to still another modified example of the imaging element and the stacked-type imaging element of Embodiment 1.

As a modified example of the example (the example in which the first corner 24a is chamfered) illustrated in FIG. 5B, as shown in a schematic plan view of FIG. 63A, a notched portion of the first corner 24a can have a shape depressed toward the middle of the charge storage electrode 24.

In some cases, floating diffusion layers $FD_1$, $FD_2$, $FD_3$, 51C, 45C, and 46C may be shared.

Figure 50:
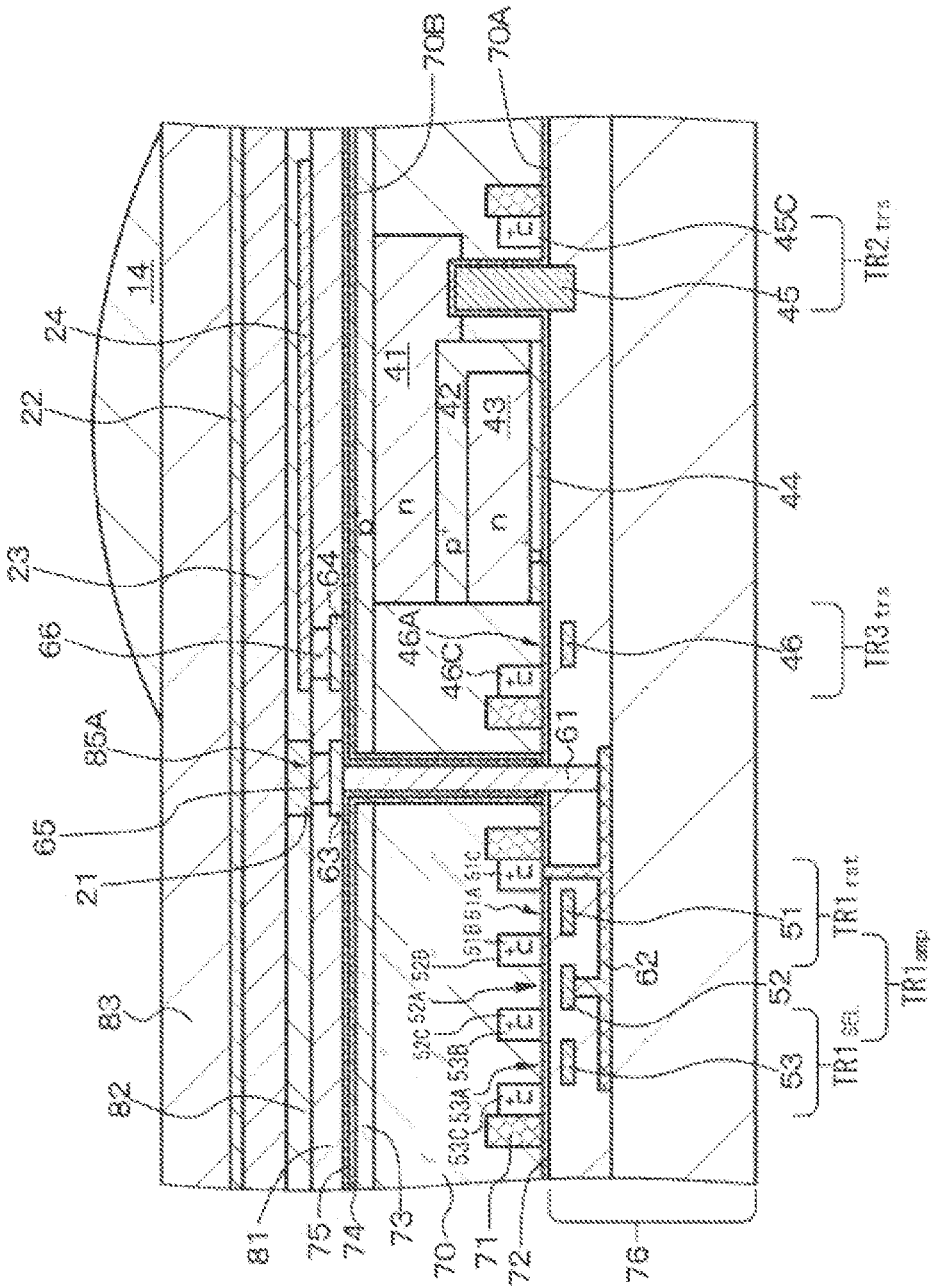
FIG. 50 is a schematic partial sectional view of another modified example of the imaging element of Embodiment 1.

For example, as a modified example of the imaging element in Embodiment 1 shown in FIG. 50, the first electrode 21 may extend in the opening 85A provided in the insulating layer 82 and may be connected to the photoelectric conversion layer 23.

Figure 51:
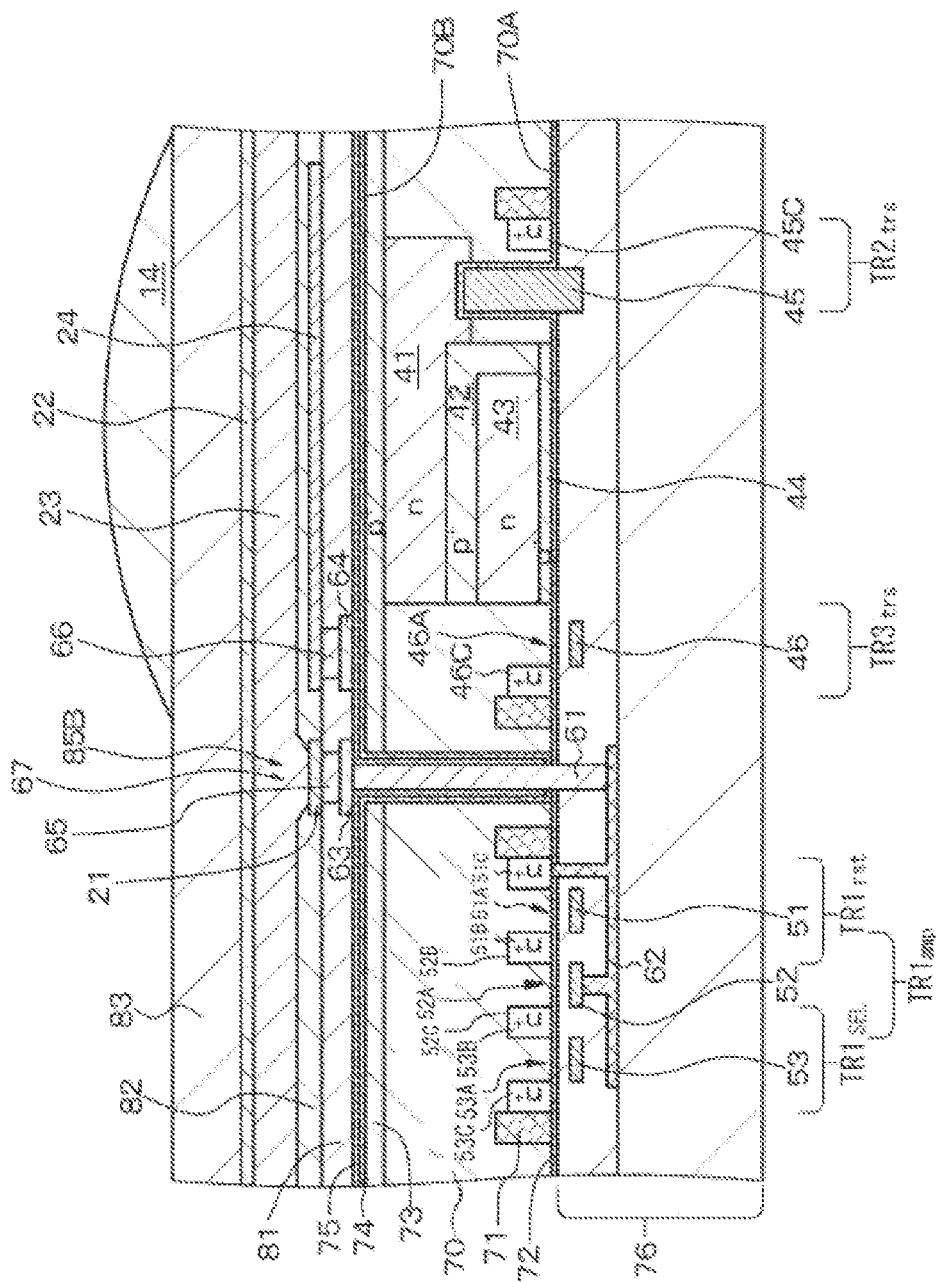
FIG. 51 is a schematic partial sectional view of still another modified example of the imaging element of Embodiment 1.
Figure 52A:
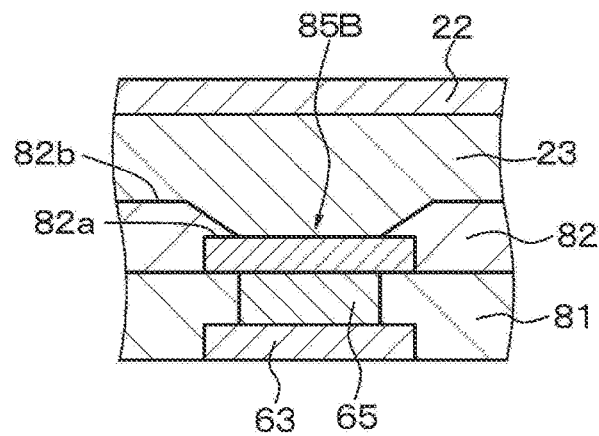
FIGS. 52A, 52B, and 52C are enlarged schematic partial sectional views of a part or the like of the first electrode of still another modified example of the imaging element of Embodiment 1.
Figure 52B:
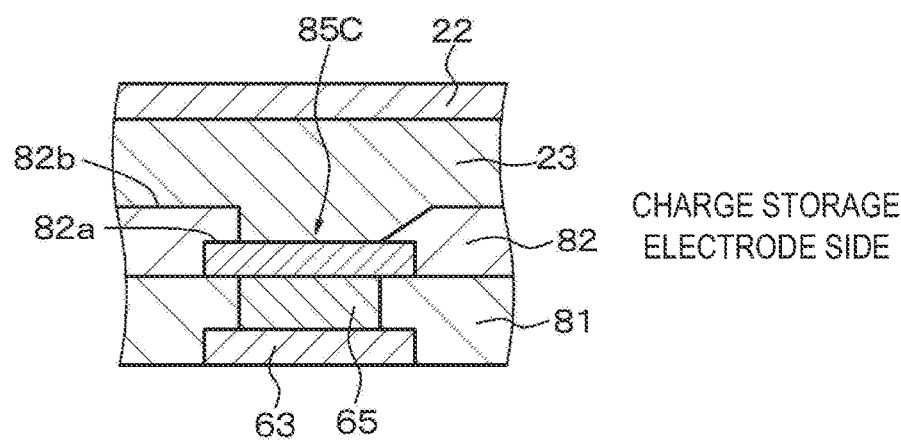
Figure 52C:
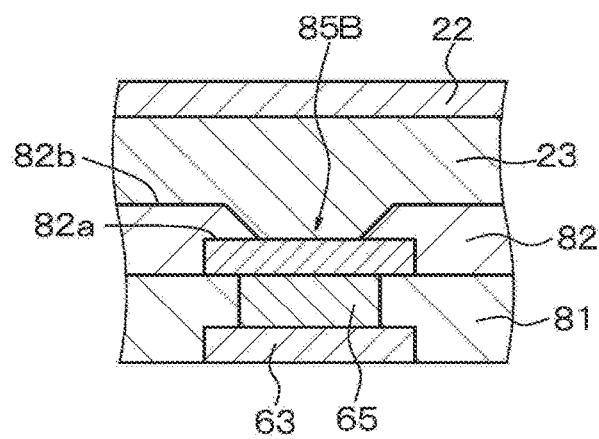

Alternatively, for example, as a modified example of the imaging element described in Embodiment 1 shown in FIG. 51, and an enlarged schematic partial sectional view of a part of the first electrode and the like shown in FIG. 52A, the edge of the top surface pf the first electrode 21 is covered with the insulating layer 82, and the first electrode 21 is exposed on the bottom surface of the opening 85B. When the surface of the insulating layer 82 in contact with the top surface of the first electrode 21 is defined as the first surface 82a and the surface of the insulating layer 82 in contact with the portion of the photoelectric conversion layer 23 opposite to the charge storage electrode 24 is defined as the second surface 82b, the side surface of the opening 85B has an inclination that expands from the first surface 82a toward the second surface 82b. As described above, the movement of charges from the photoelectric conversion layer 23 to the first electrode 21 becomes smoother by inclining the side surface of the opening 85B. Further, the side surface of the opening 85B is rotationally symmetric about the axis of the opening 85B in an example shown in FIG. 52A, but the opening 85C may be provided such that the side surface the opening 85C having an inclination expanding from the first surface 82a towards the second surface 82b is positioned on the side of the charge storage electrode 24 as shown in FIG. 52B. As a result, it becomes difficult to transfer charges from a part of the photoelectric conversion layer 23 on the side opposite to the charge storage electrode 24 across the opening 85C. Furthermore, the side surface of the opening 85B has an inclination that expands from the first surface 82a toward the second surface 82b, but the edge portion of the side surface of the opening 85B in the second surface 82b may be located outside the edge of the first electrode 21 as shown in FIG. 52A or may be located inside the edge of the first electrode 21 as shown in FIG. 52C. When the former configuration is adopted, transfer of charges becomes further easier, and when the latter configuration is adopted, it is possible to reduce variations in shape at the time of forming an opening.

These openings 85B and 85C may be formed by inclining an opening side surface of an etching mask by reflowing an etching mask including a resist material formed when an opening is formed in an insulating layer by an etching method, and etching the insulating layer 82 using the etching mask.

Figure 53:
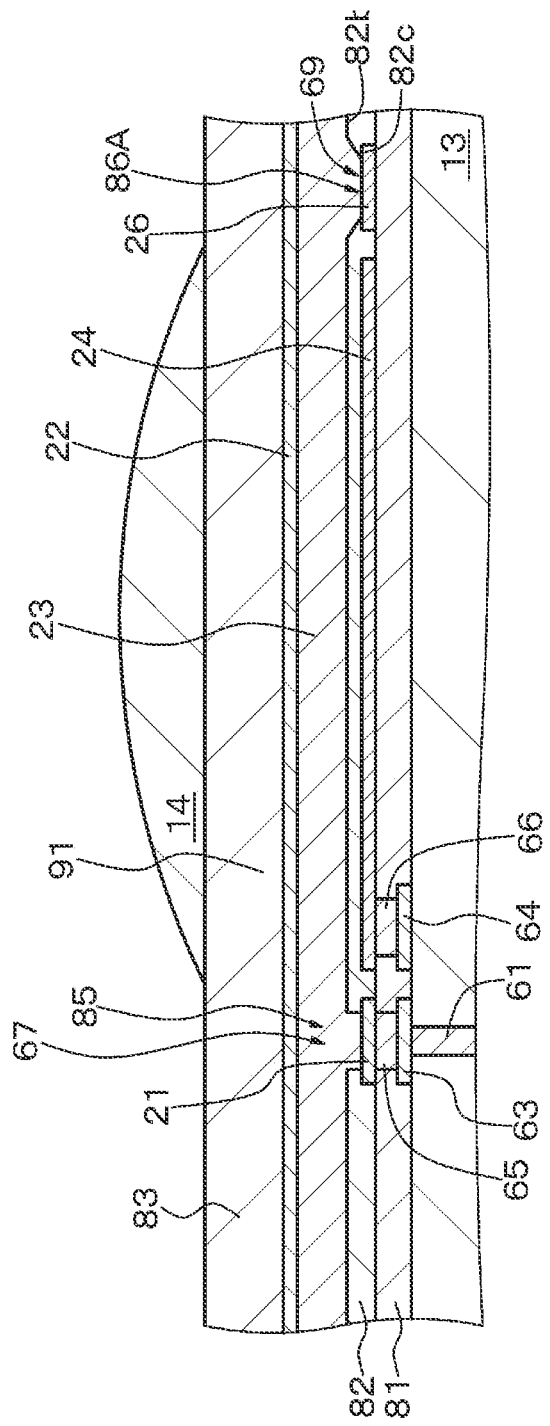
FIG. 53 is an enlarged schematic partial sectional view of a part or the like of a charge discharge electrode of still another modified example of the imaging element of Embodiment 8.

Alternatively, as for the charge discharge electrode 26 described in Embodiment 8, as shown in FIG. 53, the photoelectric conversion layer 23 may extend in the second opening 86A provided in the insulating layer 82 and may be connected to the charge discharge electrode 26, the edge of the top surface of the charge discharge electrode 26 may be covered with the insulating layer 82, and the charge discharge electrode 26 may be exposed on the bottom surface of the second opening 86A. When the surface of the insulating layer 82 in contact with the top surface of the charge discharge electrode 26 is defined as a third surface 82c and the surface of the insulating layer 82 in contact with a part of the photoelectric conversion layer 23 opposite to the charge storage electrode 24 is defined as a second surface 82*b*, the side surface of the second opening 86A may have an inclination that expands from the third surface 82*c* toward the second surface 82*b*.

Figure 54:
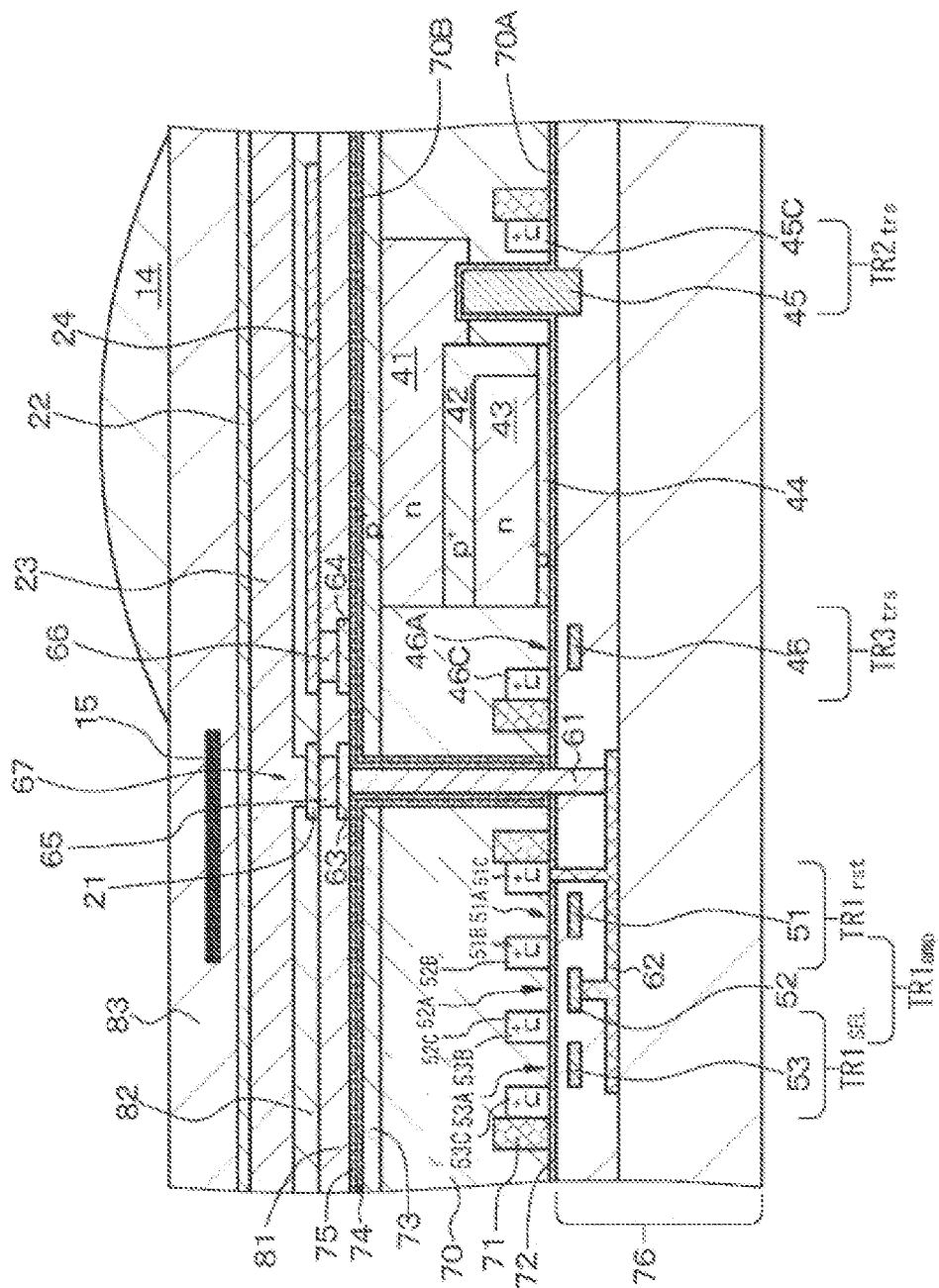
FIG. 54 is a schematic partial sectional view of still another modified example of the imaging element of Embodiment 1.

Furthermore, for example, as a modified example of the imaging element described in Embodiment 1 shown in FIG. 54, light may be incident from the side of the second electrode 22 and a light shielding layer 15 may be formed on the light incident side from the second electrode 22. Further, various wirings provided closer to the light incident side than the photoelectric conversion layer may also function as a light shielding layer.

Figure 55:
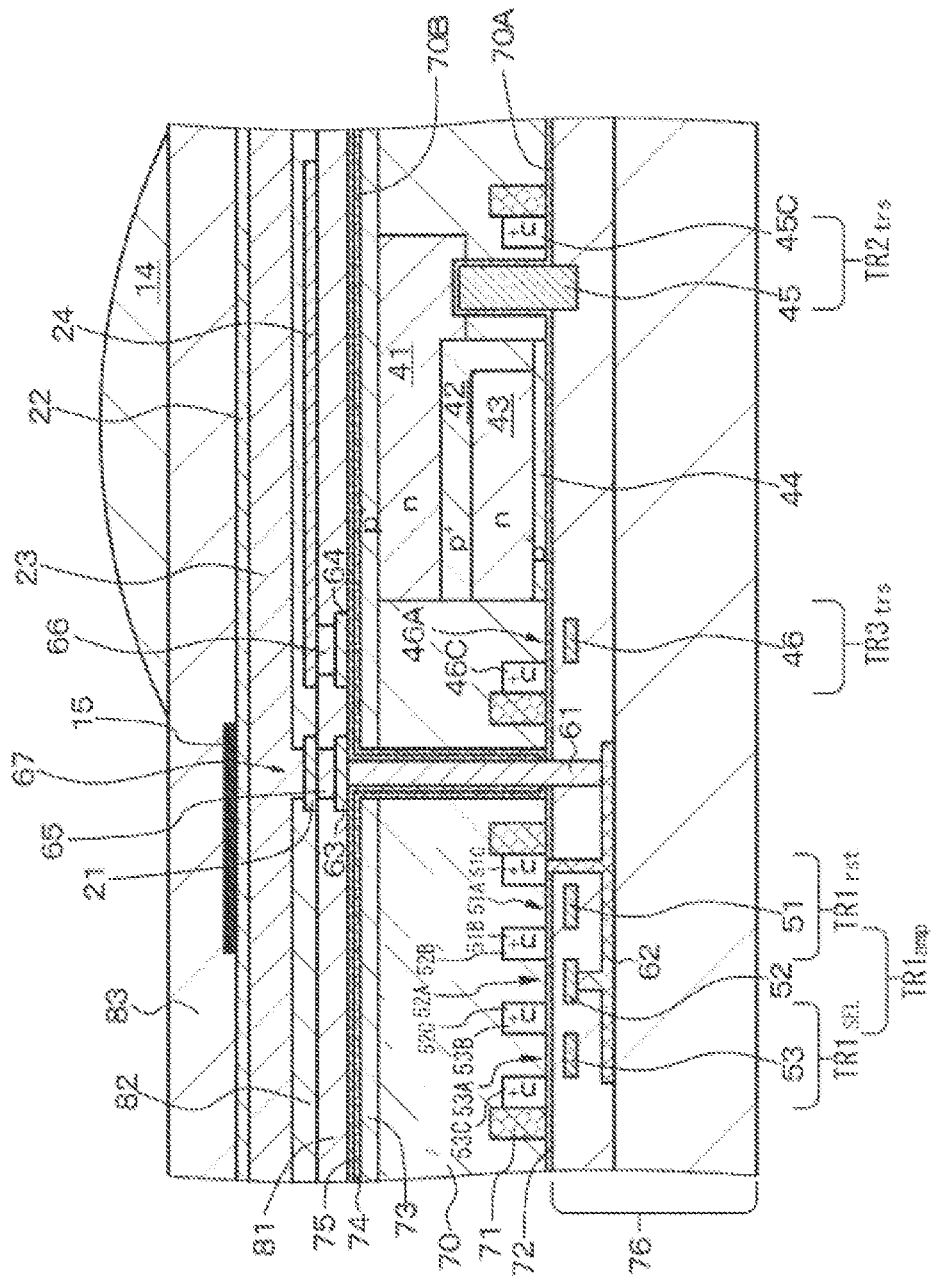
FIG. 55 is a schematic partial sectional view of still another modified example of the imaging element of Embodiment 1.
Figure 56:
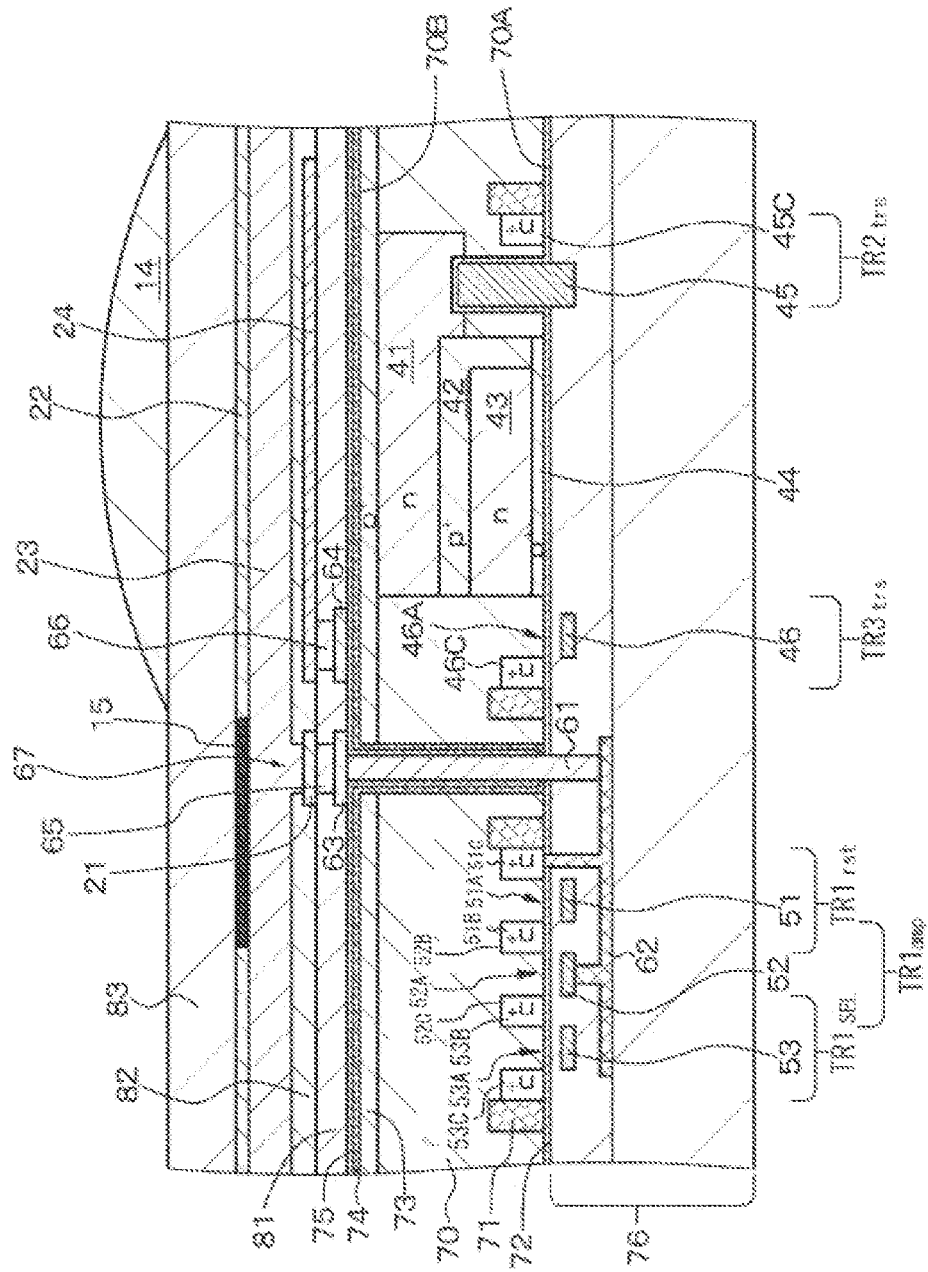
FIG. 56 is a schematic partial sectional view of still another modified example of the imaging element of Embodiment 1.

Further, in an example shown in FIG. 54, the light shielding layer 15 is formed above the second electrode 22, that is, the light shielding layer 15 is formed at the light incident side from the second electrode 22 and above the first electrode 21, but may be disposed on the light incident surface side of the second electrode 22 as shown in FIG. 55. Furthermore, in some cases, as shown in FIG. 56, the light shielding layer 15 may be formed on the second electrode 22.

Figure 57:
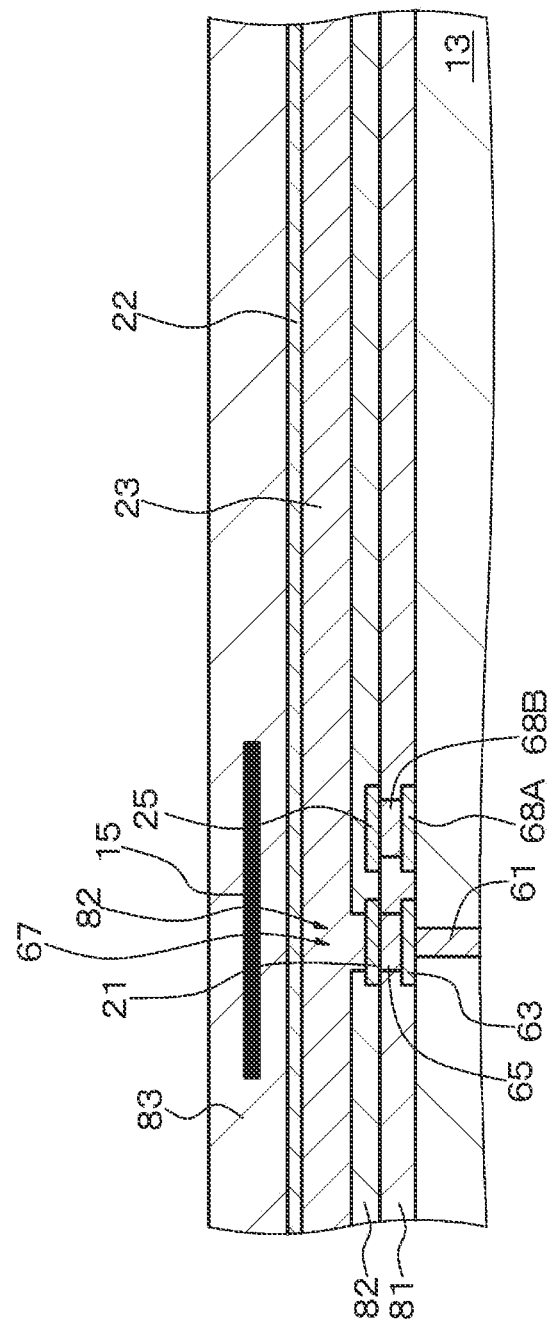
FIG. 57 is a schematic partial sectional view of another modified example of the imaging element of Embodiment 1.
Figure 58:
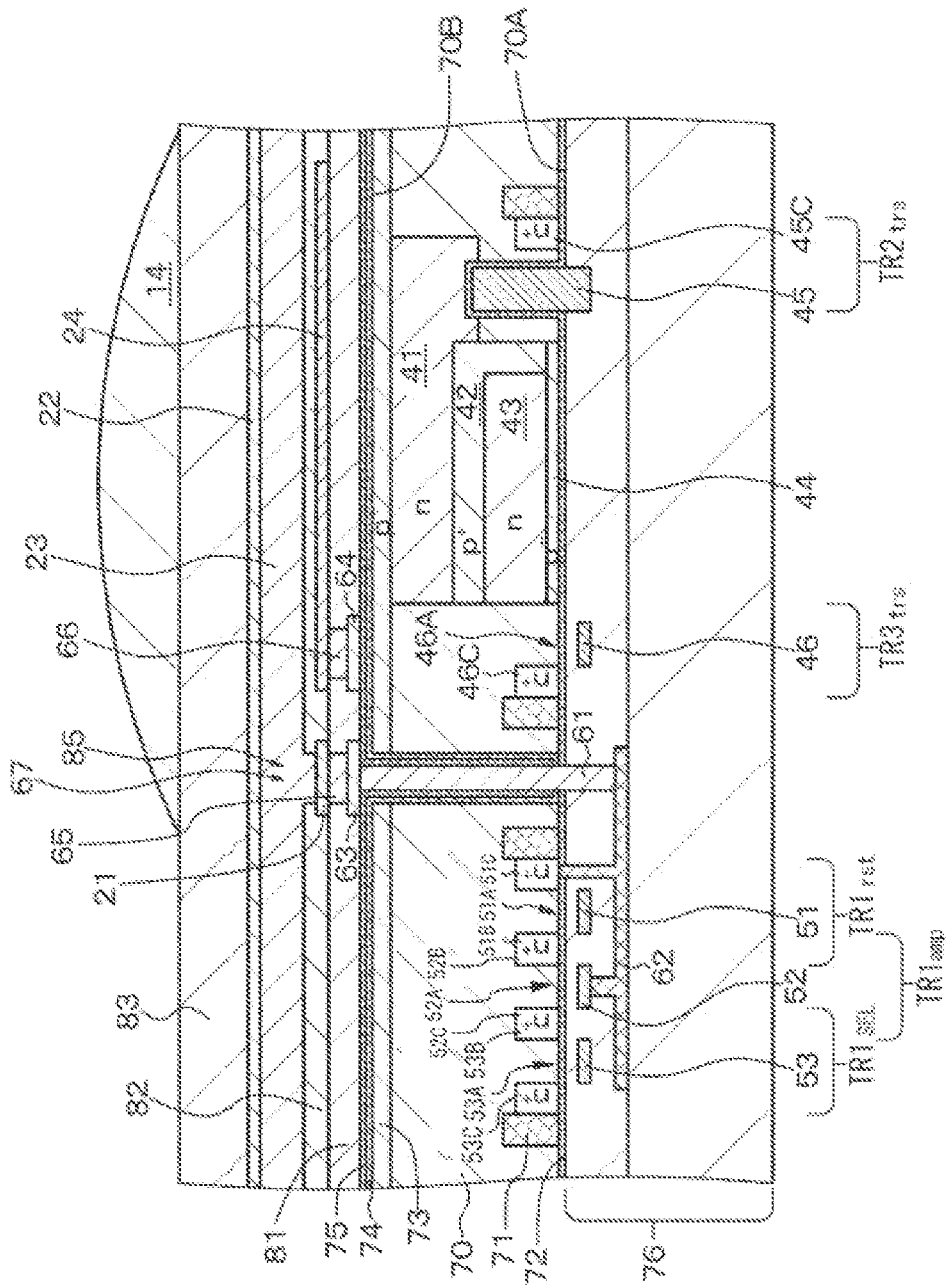
FIG. 58 is a schematic partial sectional view of still another modified example of the imaging element of Embodiment 1.

Alternatively, light may enter from the second electrode 22 side and light may not enter the first electrode 21. Specifically, as shown in FIG. 54, the light shielding layer 15 is formed on the light incident side from the second electrode 22 and above the first electrode 21. Alternatively, as shown in FIG. 58, an on-chip microlens 14 may be provided above the charge storage electrode 24 and the second electrode 22, and light incident on the on-chip microlens 14 may be focused on the charge storage electrode 24, and may not reach the first electrode 21. Further, as described in Embodiment 1, in a case where the transfer control electrode 25 is provided, light may not be incident on the first electrode 21 and the transfer control electrode 25. Specifically, as shown in FIG. 57, a structure in which the light shielding layer 15 is formed above the first electrode 21 and the transfer control electrode 25 may be realized. Alternatively, light incident on the on-chip microlens 14 may not arrive at the first electrode 21 or the first electrode 21 and the transfer control electrode 25.

When these configurations and structures are adopted, or the light shielding layer 15 is provided such that light enters only the photoelectric conversion layer 23 located above the charge storage electrode 24, or the on-chip microlens 14 is designed, a part of the photoelectric conversion layer 23 located above the first electrode 21 (or above the first electrode 21 and the transfer control electrode 25) does not contribute to photoelectric conversion, and thus all the pixels can be more reliably reset simultaneously, and a global shutter function can be realized more easily. That is, in a driving method of a solid-state imaging apparatus having a plurality of imaging elements having such configurations and structures, in all the imaging elements, the charge in the first electrode 21 is simultaneously discharged out of the system while charges are stored in the photoelectric conversion layer 23.

Thereafter, in all the imaging elements, the charge stored in the photoelectric conversion layer 23 is transferred to the first electrode 21 and the charge transferred to the first electrode 21 in each imaging element is read sequentially after completion of the transfer.

Each process is repeated.

In such a driving method of a solid-state imaging apparatus, each imaging element has a structure in which light incident from the second electrode side does not enter the first electrode, and in all the imaging elements, charges in the first electrode are simultaneously discharged to the outside of the system while charges are stored in the photoelectric conversion layer, and thus the reset of the first electrode can be reliably performed simultaneously in all the imaging elements. Further, thereafter, in all the imaging elements, the charges stored in the photoelectric conversion layer are simultaneously transferred to the first electrode, and after completion of the transfer, the charges transferred to the first electrode in each imaging element are sequentially read out. Therefore, a so-called global shutter function can be easily realized.

Figure 59:
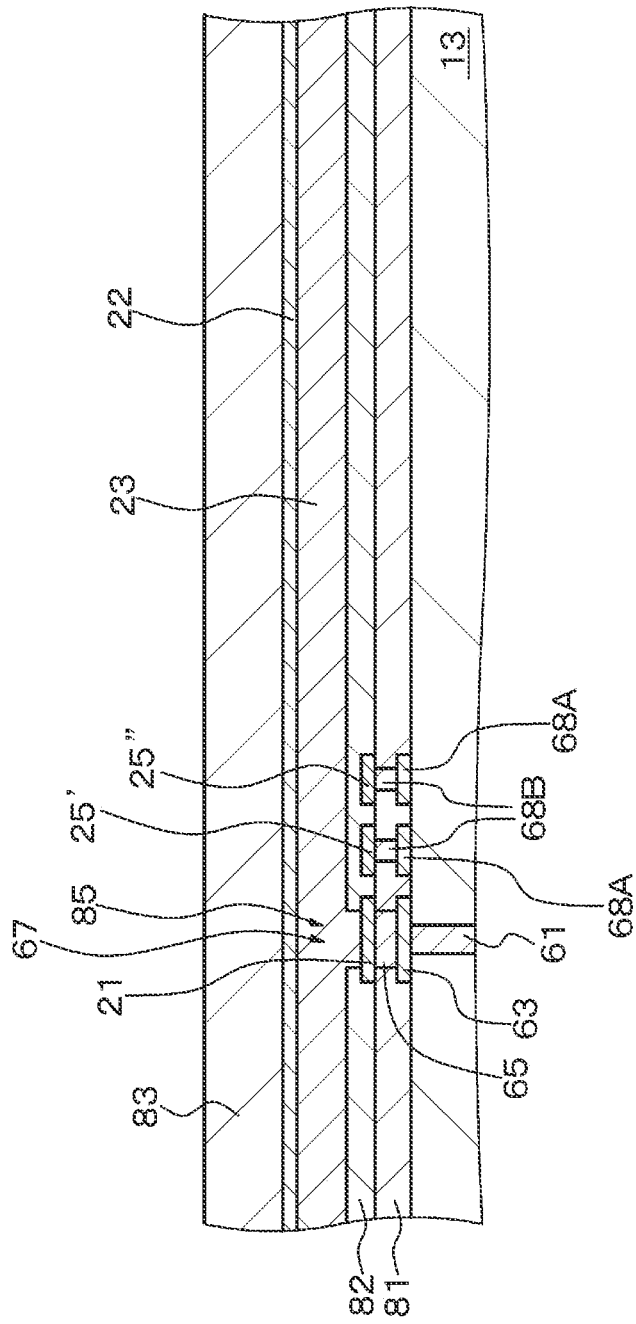
FIG. 59 is a schematic partial sectional view of still another modified example of the imaging element of Embodiment 1.

Furthermore, as a modified example of Embodiment 1, as shown in FIG. 59, a plurality of transfer control electrodes may be provided from a position closest to the first electrode 21 to the charge storage electrode 24. Further, an example in which two transfer control electrodes 25' and 25" are provided shown in FIG. 59. Further, the on-chip microlens 14 is provided above the charge storage electrode 24 and the second electrode 22. A structure in which light incident on the on-chip microlens 14 may be condensed on the charge storage electrode 24 and may not arrive at the first electrode 21 and the transfer control electrodes 25' and 25" may be adopted.

Figure 60:
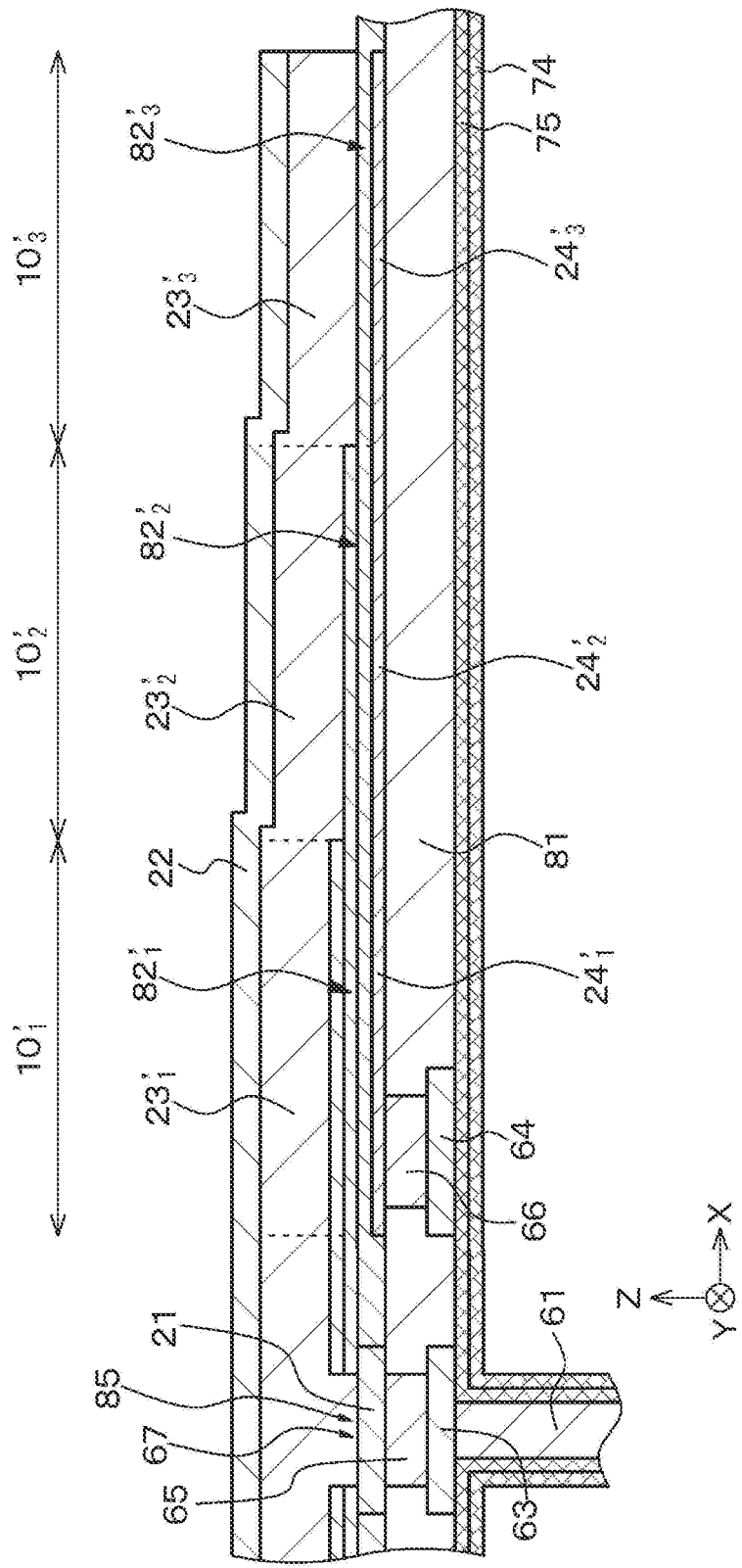
FIG. 60 is an enlarged schematic partial sectional view of a part in which a charge storage electrode, a photoelectric conversion layer, and a second electrode are stacked in the modified example of the imaging element of Embodiment 10.

In Embodiment 10 shown in FIGS. 38 and 39, the thickness of the insulating layer segments $82'_1$, $82'_2$, and $82'_3$ is gradually increased by gradually reducing the thicknesses of the charge storage electrode segments $24'_1$, $24'_2$, and $24'_3$. On the other hand, as shown in FIG. 60 which is an enlarged schematic partial sectional view of a part in which a charge storage electrode, a photoelectric conversion layer, and a second electrode are stacked in the modified example of Embodiment 10, the thicknesses of the charge storage electrode segments $24'_1$, $24'_2$, and $24'_3$ may be constant, and the thickness of the insulating layer segments $82'_1$, $82'_2$, and $82'_3$ may be gradually increased. Further, the thickness of photoelectric conversion layer segments $23'_1$, $23'_2$, and $23'_3$ is constant.

Figure 61:
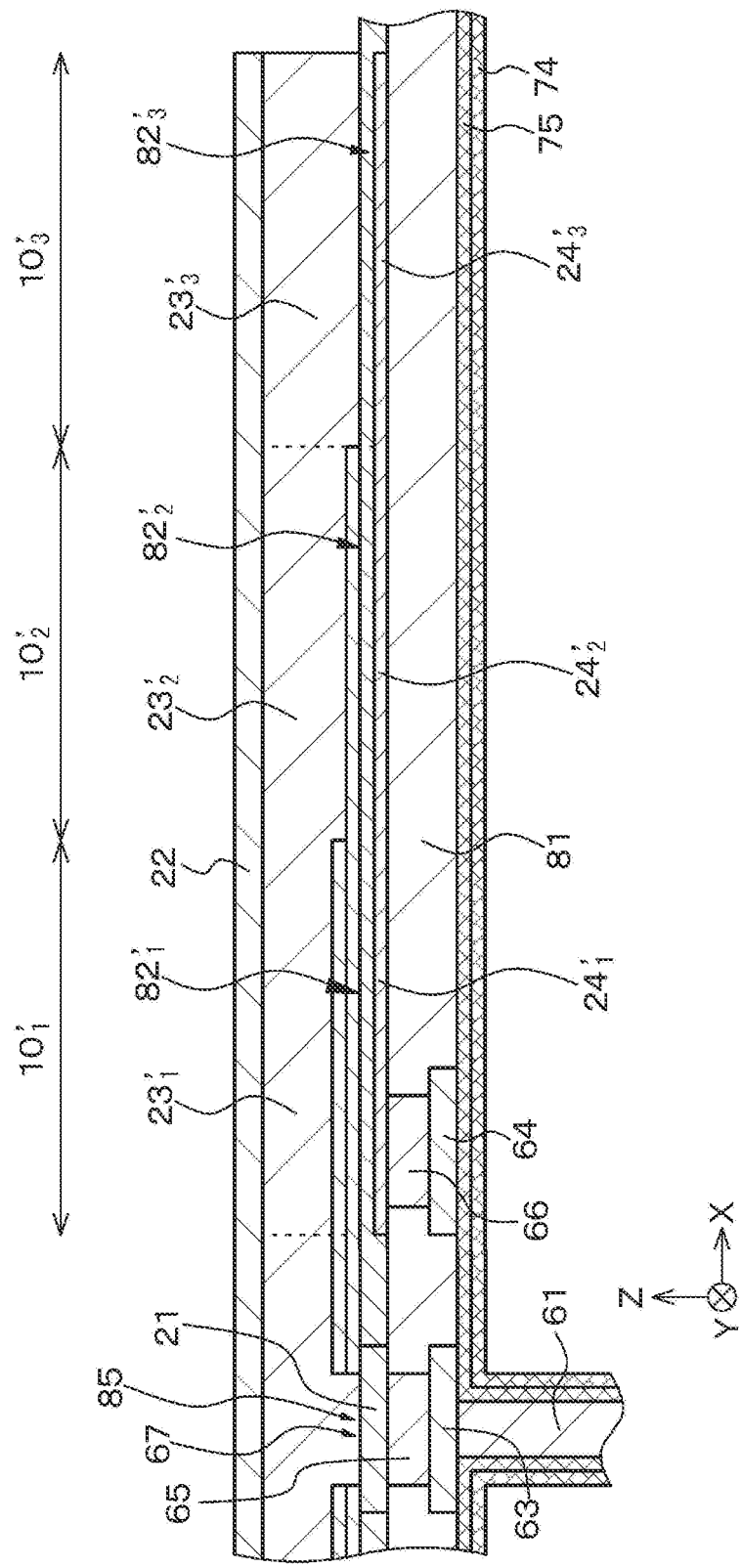
FIG. 61 is an enlarged schematic partial sectional view of a part in which a charge storage electrode, a photoelectric conversion layer, and a second electrode are stacked in the modified example of the imaging element of Embodiment 11.

Furthermore, in Embodiment 11 shown in FIG. 41, the thickness of the photoelectric conversion layer segment $23'_1$, $23'_2$, and $23'_3$ is gradually increased by gradually reducing the thickness of the charge storage electrode segment $24'_1$, $24'_2$, and $24'_3$. On the other hand, as shown in FIG. 61 which is an enlarged schematic partial sectional view of a part in which a charge storage electrode, a photoelectric conversion layer, and a second electrode are stacked in the modified example of Embodiment 11, the thicknesses of the charge storage electrode segments $24'_1$, $24'_2$, and $24'_3$ may be constant and the thickness of the insulating layer segments $82'_1$, $82'_2$, and $82'_3$ may be gradually reduced, whereby the thickness of the photoelectric conversion layer segment $23'_1$, $23'_2$, and $23'_3$ may be gradually increased.

Figure 62:
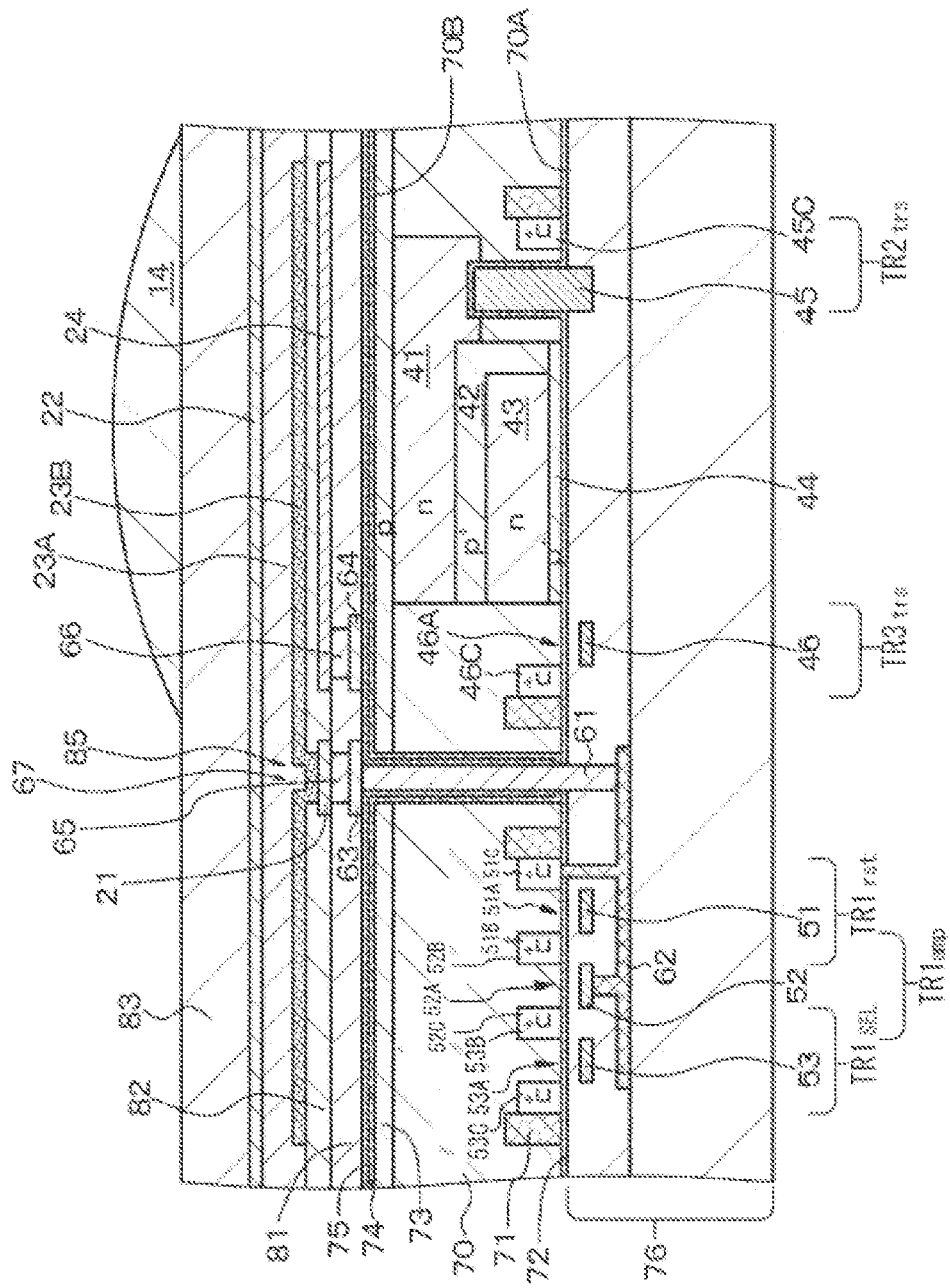
FIG. 62 is a schematic partial sectional view of still another modified example of the imaging element and stacked-type imaging element of Embodiment 1.

The photoelectric conversion layer is not limited to one-layer configuration. For example, as a modified example of the imaging element and stacked-type imaging element described in Embodiment 1 shown in FIG. 62, the photoelectric conversion layer 23 may have a stacked structure of a lower semiconductor layer 23B including, for example, IGZO and an upper photoelectric conversion layer 23A including a material forming a photoelectric conversion layer 23 described in Embodiment 1. When the lower semiconductor layer 23B is provided in this manner, recombination at the time of charge storage can be prevented, the transfer efficiency of the charge stored in the photoelectric conversion layer 23 to the first electrode 21 can be increased, and generation of dark current can be suppressed.

It is needless to say that various modified examples described above can also be applied to embodiments 2 to 15.

Figure 63B:
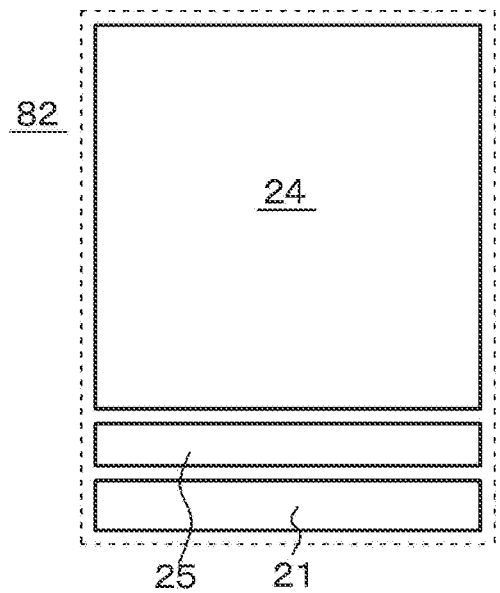

Furthermore, as shown in a schematic plan view of FIG. 63B, the transfer control electrode 25 may be disposed between the charge storage electrode 24 and the first electrode 21.

During the charge transfer period, the potential $V_{21}$ may be applied to the first electrode, the potential $V_{22}$ is applied to the charge storage electrode, and the potential $V_{13}$ may be applied to the transfer control electrode, from the drive circuit, and the charges stored in the photoelectric conversion layer may be read out to the control unit via the first electrode. Here, in a case where the potential of the first electrode is higher than the potential of the second electrode, $V_{12}>V_{13}$ and $V_{22} \leq V_{13} \leq V_{21}$ (preferably, $V_{22}<V_{13}<V_{21}$).

In a case where the potential of the first electrode is lower than the potential of the second electrode, $V_{12}<V_{13}$ and $V_{22} \geq V_{13} \geq V_{21}$ (preferably, $V_{22}>V_{13}>V_{21}$). That is, an embodiment in which the potential of the transfer control electrode 25 is fixed during the charge storage period, the reset operation, and the charge transfer period and a potential which is applied to the charge storage electrode 24 is moved vertically during the charge storage period and the charge transfer period may be adopted. Further, in a case where the potential of the first electrode is higher than the potential of the second electrode, it is desirable that $V_{12} \geq V_{11}$ (preferably $V_{12}=V_{11}$). In a case where the potential of the second electrode is higher than the potential of the first electrode, it is desirable that $V_{11} \leq V_{12}$ (preferably $V_{11}=V_{12}$).

Furthermore, a case in which an embodiment of the present disclosure is applied to a CMOS type solid-state imaging apparatus in which unit pixels for detecting signal charges corresponding to the amount of incident light as a physical quantity are arranged in a matrix was taken as an example in the embodiment, but the present disclosure is not limited to application to a CMOS type solid-state imaging apparatus, and also may be applied to a CCD type solid-state imaging apparatus. In the latter case, the signal charges are transferred in a vertical direction by a vertical transfer register of a CCD type structure, transferred in a horizontal direction by a horizontal transfer register, and amplified, and thereby pixel signals (image signals) are output. Furthermore, the present disclosure is not limited to a general column type solid-state imaging apparatus in which pixels are formed in a two-dimensional matrix and column signal processing circuits are arranged for each pixel column. Moreover, in some cases, a select transistor may be omitted.

Moreover, the imaging element according to the present disclosure is not limited to application to a solid-state imaging apparatus which detects the distribution of the amount of incident light of visible light and captures the distribution as an image, and is applicable to a solid-state imaging apparatus which captures the distribution of the amount of incident light of infrared rays, X-rays, or particles or the like as an image. Furthermore, it can be applied to a general solid-state imaging apparatus (physical quantity distribution detection device) such as a fingerprint detection sensor which detects distribution of other physical quantities such as pressure, electrostatic capacity, and the like and captures the distribution as an image in a broad sense.

Moreover, the present disclosure is not limited to the solid-state imaging apparatus which sequentially scans each unit pixel of an imaging area row by row and reads out a pixel signal from each unit pixel. It can also be applied to an XY address-type solid-state imaging apparatus which selects arbitrary pixels on a pixel unit basis and reads out pixel signals on a pixel unit basis from selected pixels. The solid-state imaging apparatus may be in the form of one chip or in a modular form having an imaging function and packaged together with an imaging area and a drive circuit or an optical system.

Furthermore, it is not only limited to application to a solid-state imaging apparatus, and can be applied to an imaging apparatus. Here, the imaging apparatus refers to an electronic device having an imaging function such as a camera system such as a digital still camera, video camera, or the like, or a mobile phone. The imaging apparatus may be in the form of a module mounted on an electronic device, that is, a camera module.

Figure 65:
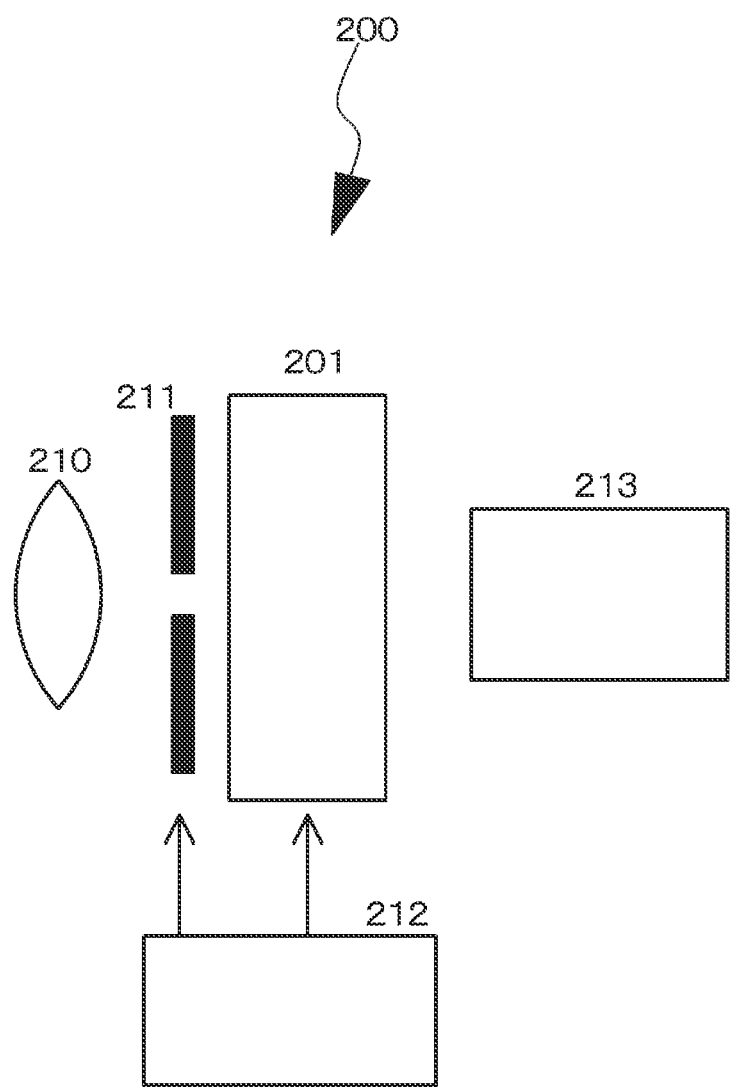
FIG. 65 is a conceptual diagram of an example in which a solid-state imaging apparatus including the imaging element or the like according to the present disclosure is used in an electronic device (camera).
Figure 66:
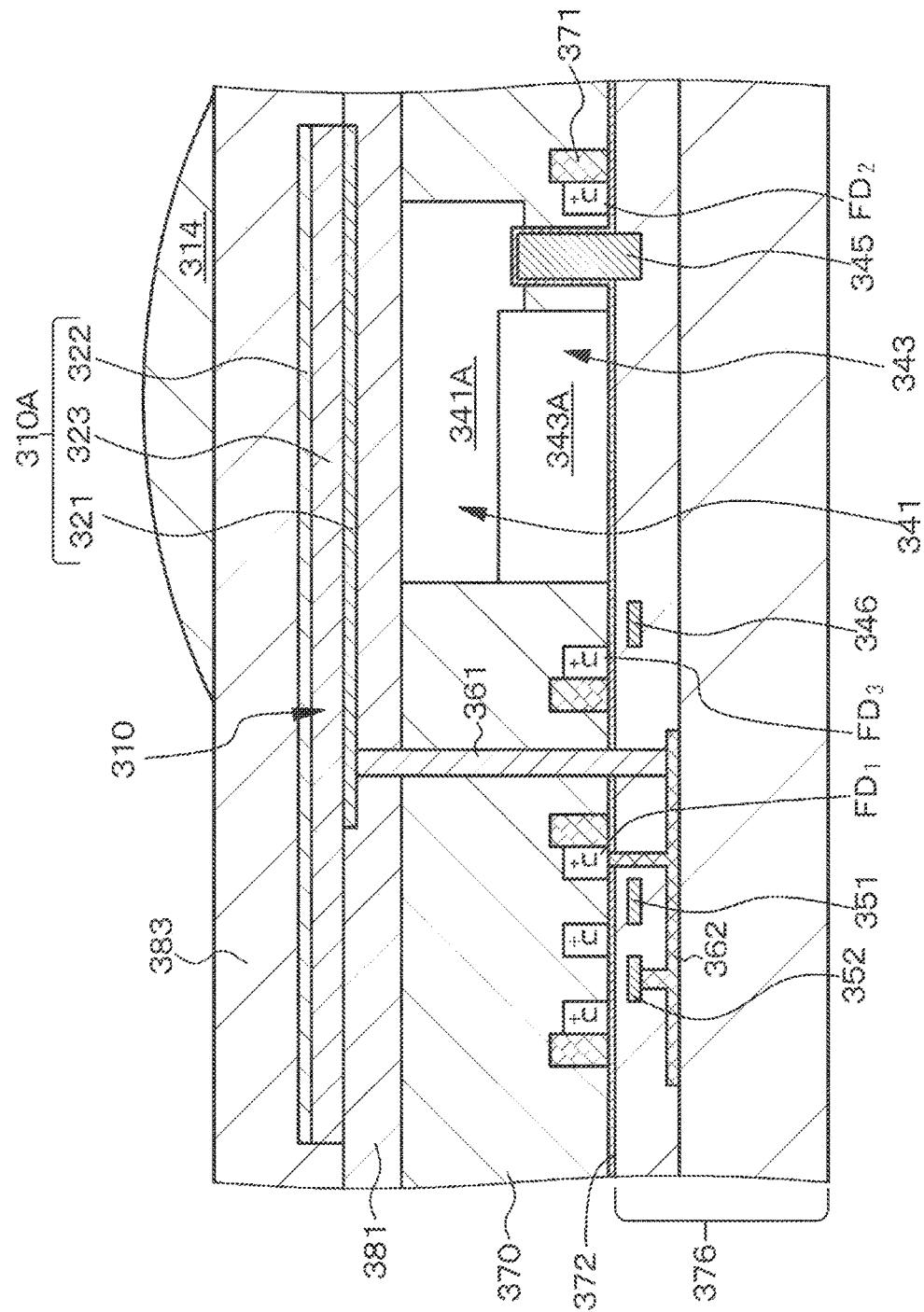
FIG. 66 is a conceptual diagram of a conventional stacked-type imaging element (stacked-type solid-state imaging apparatus).

FIG. 65 shows an example in which the solid-state imaging apparatus 201 including the imaging element according to the present disclosure is used in an electronic device (camera) 200 as a conceptual diagram. The electronic device 200 has the solid-state imaging apparatus 201, an optical lens 210, a shutter device 211, a drive circuit 212, and a signal processing circuit 213. The optical lens 210 forms an image of image light (incident light) from the object on an imaging surface of the solid-state imaging apparatus 201. As a result, a signal charges are stored for a certain period of time in the solid-state imaging apparatus 201. The shutter device 211 controls the light irradiation period and light blocking period with respect to the solid-state imaging apparatus 201. The drive circuit 212 supplies a drive signal for controlling the transfer operation or the like of the solid-state imaging apparatus 201 and the shutter operation of the shutter device 211. A signal of the solid-state imaging apparatus 201 is transferred by a drive signal (timing signal) supplied from the drive circuit 212. The signal processing circuit 213 performs various kinds of signal processing. A video signal on which signal processing has been performed is stored in a storage medium such as a memory or output to a monitor. In such an electronic device 200, it is possible to achieve miniaturization of pixel size and improvement of transfer efficiency in the solid-state imaging apparatus 201, and thus the electronic device 200 with improved pixel characteristics can be obtained. The electronic device 200 to which the solid-state imaging apparatus 201 can be applied is not only limited to a camera, and it is applicable to an imaging apparatus such as a camera module for a mobile device such as a digital still camera or a mobile phone. Additionally, the present disclosure may also be configured as below.

[A01]<<Imaging Element>>

An imaging element including:
- a photoelectric conversion unit formed by stacking a first electrode, a photoelectric conversion layer, and a second electrode,
- in which the photoelectric conversion unit further includes
- a charge storage electrode that has an opposite region opposite to the first electrode via an insulating layer, and
- a transfer control electrode that is opposite to the first electrode and the charge storage electrode via the insulating layer, and
- the photoelectric conversion layer is disposed above at least the charge storage electrode via the insulating layer.

[A02] The imaging element according to [A01], in which the photoelectric conversion layer is disposed above at least the charge storage electrode and the transfer control electrode via the insulating layer.

[A03] The imaging element according to [A01] or [A02], in which a planar shape of the charge storage electrode is a rectangle that has four corners including a first corner, a second corner, a third corner, and a fourth corner, and the first corner corresponds to the opposite region.

[A04] The imaging element according to [A03], in which the first corner has roundness.

[A05] The imaging element according to [A03], in which the first corner is chamfered.

[A06] The imaging element according to any one of [A01] to [A05],
in which the transfer control electrode is formed by two transfer control electrode segments, and
the two transfer control electrode segments and two sides of charge storage electrodes located on both sides of the opposite region are disposed adjacent via the insulating layer.

[A07] The imaging element according to [A06], in which, when the two sides of the charge storage electrodes located on both sides of the opposite region are set as a first side and a second side, a length of the first side is $L_1$, and a length of a second side is $L_2$, a distance between the first electrode and an end of the transfer control electrode segment along the first side is in the range of $0.02 \times L_1$ to $0.5 \times L_1$ and a distance between the first electrode and an end of the transfer control electrode segment along the second side is in the range of $0.02 \times L_2$ to $0.5 \times L_2$.

[A08] The imaging element according to any one of [A01] to [A05], in which the transfer control electrode surrounds the charge storage electrode in a frame form.

[A09] The imaging element according to [A01] or [A02],
in which a planar shape of the charge storage electrode is a rectangle,
the opposite region is located to border along one side of the charge storage electrode,
the transfer control electrode is formed by two transfer control electrode segments, a first transfer control electrode segment is adjacent to the opposite region and is opposite to the first electrode and a first region of the charge storage electrode bordering along one side of the charge storage electrode via the insulating layer, and
a second transfer control electrode segment is adjacent to the opposite region and is opposite to the first electrode and a second region of the charge storage electrode bordering along one side of the charge storage electrode via the insulating layer.

[A10] The imaging element according to any one of [A01] to [A09], further including:
a control unit provided on a semiconductor substrate and including a drive circuit,
in which the first electrode, the charge storage electrode, and the transfer control electrode are connected to the drive circuit,
during a charge storage period, a potential $V_{11}$ is applied from the drive circuit to the first electrode, a potential $V_{12}$ is applied from the drive circuit to the charge storage electrode, a potential $V_{13}$ is applied from the drive circuit to the transfer control electrode, and a charge is stored in the photoelectric conversion layer,
during a charge transfer period, a potential $V_{21}$ is applied from the drive circuit to the first electrode, a potential $V_{22}$ is applied from the drive circuit to the charge storage electrode, a potential $V_{23}$ or the potential $V_{13}$ is applied from the drive circuit to the transfer control electrode, the charge stored in the photoelectric conversion layer is read to the control unit via the first electrode,
here, in a case where a potential of the first electrode is higher than a potential of the second electrode, $V_{12} > V_{13}$ and $V_{22} \leq V_{23} \leq V_{21}$, or
$V_{12} > V_{13}$ and $V_{22} \leq V_{13} \leq V_{21}$, and
in a case where the potential of the first electrode is lower than the potential of the second electrode,
$V_{12} < V_{13}$ and $V_{22} \geq V_{23} \geq V_{21}$, or
$V_{12} < V_{13}$ and $V_{22} \geq V_{13} \geq V_{21}$.

[A11] An imaging element according to any one of [A01] to [A10], in which a photoelectric conversion layer has a stacked structure of a lower semiconductor layer and an upper photoelectric conversion layer from the charge storage electrode side.

[A12] The imaging element according to any one of [A01] to [A11], in which the insulating layer has a stacked structure of an insulating lower layer and the insulating upper layer.

[A13] The imaging element according to any one of [A01] to [A12] further including
the semiconductor substrate,
in which the photoelectric conversion unit is disposed above the semiconductor substrate.

[A14] The imaging element according to any one of [A01] to [A13], in which a first electrode extends in an opening provided in an insulating layer and is connected to a photoelectric conversion layer.

[A15] The imaging element according to any one of [A01] to [A14], in which a photoelectric conversion layer extends in an opening provided in an insulating layer and is connected to a first electrode.

[A16] The imaging element according to [A15]
in which an edge of the top surface of the first electrode is covered with an insulating layer,
the first electrode is exposed to the bottom surface of the opening, and
when a surface of the insulating layer in contact with the top surface of the first electrode is a first surface and a surface of the insulating layer in contact with the portion of the photoelectric conversion layer opposite to the charge storage electrode is a second surface, a side surface of the opening has an inclination that expands from the first surface toward the second surface.

[A17] The imaging element according to [A16], in which a side surface of the opening has an inclination that expands from the first surface toward the second surface, and the side surface is positioned on the charge storage electrode side.

[A18] <<Charge Discharge Electrode>>
The imaging element according to any one of [A01] to [A17], further including a charge discharge electrode which is connected to the photoelectric conversion layer and disposed to be spaced apart from the first electrode, the charge storage electrode, and the transfer control electrode.

[A19] The imaging element according to [A18], in which the charge discharge electrode is disposed to surround the first electrode, the charge storage electrode, and the transfer control electrode.

[A20] The imaging element according to [A18] or [A19],
in which the photoelectric conversion layer extends in the second opening provided in the insulating layer and is connected to the charge discharge electrode,
the edge of the top surface of the charge discharge electrode may be covered with the insulating layer, and
the charge discharge electrode may be exposed on the bottom surface of the second opening, and
when the surface of the insulating layer in contact with the top surface of the charge discharge electrode is defined as a third surface and the surface of the insulating layer in contact with a part of the photoelectric conversion layer opposite to the charge storage electrode is defined as a second surface, the side surface of the second opening may have an inclination that expands from the third surface toward the second surface.

[A21]<<Potential Control of First Electrode, the Charge Storage Electrode, and the Charge Discharge Electrode>>

The imaging element according to any one of [A18] to [A20], further including:

a control unit provided on a semiconductor substrate and including a drive circuit, in which the first electrode, the charge storage electrode, the charge discharge electrode, and the transfer control electrode are connected to the drive circuit, during a charge storage period, a potential $V_{11}$ is applied from the drive circuit to the first electrode, a potential $V_{12}$ is applied from the drive circuit to the charge storage electrode, a potential $V_{14}$ is applied from the drive circuit to the charge discharge electrode, and a charge is stored in the photoelectric conversion layer, during a charge transfer period, a potential $V_{21}$ is applied from the drive circuit to the first electrode, a potential $V_{22}$ is applied from the drive circuit to the charge storage electrode, a potential $V_{24}$ is applied from the drive circuit to the charge discharge electrode, and the charge stored in the photoelectric conversion layer is read to the control unit via the first electrode, here, in a case where a potential of the first electrode is higher than a potential of the second electrode, $V_{14} > V_{11}$ and $V_{24} < V_{21}$, and in a case where the potential of the first electrode is lower than the potential of the second electrode, $V_{14} < V_{11}$ and $V_{24} > V_{21}$.

[A22]<<Charge Storage Electrode Segment>>

The imaging element according to any one of [A01] to [A21], in which the charge storage electrode includes a plurality of charge storage electrode segments.

[A23] The imaging element according to [A22], in which in a case where the potential of the first electrode is higher than the potential of the second electrode, a potential which is applied to the charge storage electrode segment located closest to the first electrode is higher than a potential which is applied to the charge storage electrode segment located farthest from the first electrode during the charge transfer period, and in a case where the potential of the first electrode is lower than the potential of the second electrode, a potential which is applied to the charge storage electrode segment located closest to the first electrode is lower than a potential which is applied to the charge storage electrode segment located farthest from the first electrode during the charge transfer period.

[A24] The imaging element according to any one of [A01] to [A23], in which at least the floating diffusion layer and the amplification transistor included in the control unit are provided on the semiconductor substrate, and the first electrode is connected to a gate section of the amplification transistor and the floating diffusion layer.

[A25] The imaging element according to [A24], in which the reset transistor and the select transistor included in the control unit are further provided on the semiconductor substrate, the floating diffusion layer is connected to a source/drain region of one side of the reset transistor, and the source/drain region of one side of the amplification transistor is connected to a source/drain region of one side of the select transistor and a source/drain region of the other side of the select transistor is connected to a signal line.

[A26] The imaging element according to any one of [A01] to [A25], in which the size of the charge storage electrode may be larger than that of the first electrode.

[A27] The imaging element according to any one of [A01] to [A26], in which light can be incident from the second electrode side and a light shielding layer can be formed on the light incident side of the second electrode.

[A28] The imaging element according to any one of [A01] to [A26], in which light can be incident from the second electrode side and no light can be incident on the first electrode.

[A29] The imaging element according to [A28], in which a light shielding layer can be formed on a light incident side from the second electrode and above the first electrode.

[A30] The imaging element according to [A28], in which the on-chip microlens is provided above the charge storage electrode and the second electrode, and light incident on the on-chip microlens is condensed on the charge storage electrode.

[A31]<<Imaging Element: First Configuration>>

The imaging element according to any one of [A01] to [A30], in which the photoelectric conversion unit includes N (where N≥2) photoelectric conversion unit segments, the photoelectric conversion layer includes N photoelectric conversion layer segments, the insulating layer includes N insulating layer segments, the charge storage electrode includes N charge storage electrode segments, an $n^{th}$ (where n=1, 2, 3, . . . , N) photoelectric conversion unit segment includes an $n^{th}$ charge storage electrode segment, an $n^{th}$ insulating layer segment, and an $n^{th}$ photoelectric conversion layer segment, the photoelectric conversion unit segment of a larger value of n is located more away from the first electrode, and the thickness of the insulating layer segment gradually changes from the first photoelectric conversion unit segment to the $N^{th}$ photoelectric conversion unit segment.

[A32]<<Imaging Element: Second Configuration>>

The imaging element according to any one of [A01] to [A30], in which the photoelectric conversion unit includes N (where N≥2) photoelectric conversion unit segments, the photoelectric conversion layer includes N photoelectric conversion layer segments, the insulating layer includes N insulating layer segments, the charge storage electrode includes N charge storage electrode segments, an $n^{th}$ (where n=1, 2, 3, . . . , N) photoelectric conversion unit segment includes an $n^{th}$ charge storage electrode segment, an $n^{th}$ insulating layer segment, and an $n^{th}$ photoelectric conversion layer segment, the photoelectric conversion unit segment of a larger value of n is located more away from the first electrode, and the thickness of the photoelectric conversion layer segment gradually changes from the first photoelectric conversion unit segment to the $N^{th}$ photoelectric conversion unit segment.

[A33]<<Imaging Element: Third Configuration>>

The imaging element according to any one of [A01] to [A30], in which the photoelectric conversion unit includes N (where N≥2) photoelectric conversion unit segments, the photoelectric conversion layer includes N photoelectric conversion layer segments, the insulating layer includes N insulating layer segments, the charge storage electrode includes N charge storage electrode segments, an $n^{th}$ (where n=1, 2, 3, ..., N) photoelectric conversion unit segment includes an $n^{th}$ charge storage electrode segment, an $n^{th}$ insulating layer segment, and an $n^{th}$ photoelectric conversion layer segment, the photoelectric conversion unit segment of a larger value of n is located more away from the first electrode, and the materials of the insulating layer segments are different in the adjacent photoelectric conversion unit segments.

[A34]<<Imaging Element: Fourth Configuration>>

The imaging element according to any one of [A01] to [A30], in which the photoelectric conversion unit includes N (where N≥2) photoelectric conversion unit segments, the photoelectric conversion layer includes N photoelectric conversion layer segments, the insulating layer includes N insulating layer segments, the charge storage electrode includes N charge storage electrode segments disposed to be separated from each other, an $n^{th}$ (where n=1, 2, 3, ..., N) photoelectric conversion unit segment includes an $n^{th}$ charge storage electrode segment, an $n^{th}$ insulating layer segment, and an $n^{th}$ photoelectric conversion layer segment, the photoelectric conversion unit segment of a larger value of n is located more away from the first electrode, and the materials of the charge storage electrode segments are different in the adjacent photoelectric conversion unit segments.

[A35]<<Imaging Element: Fifth Configuration>>

The imaging element according to any one of [A01] to [A30], in which the photoelectric conversion unit includes N (where N≥2) photoelectric conversion unit segments, the photoelectric conversion layer includes N photoelectric conversion layer segments, the insulating layer includes N insulating layer segments, the charge storage electrode includes N charge storage electrode segments disposed to be separated from each other, an $n^{th}$ (where n=1, 2, 3, ..., N) photoelectric conversion unit segment includes an $n^{th}$ charge storage electrode segment, an $n^{th}$ insulating layer segment, and an $n^{th}$ photoelectric conversion layer segment, the photoelectric conversion unit segment of a larger value of n is located more away from the first electrode, and the area of the charge storage electrode segment gradually decreases from the first photoelectric conversion unit segment to the $N^{th}$ photoelectric conversion unit segment.

[A36]<<Imaging Element: Sixth Configuration>>

The imaging element according to any one of [A01] to [A30], in which a stacking direction of the charge storage electrode, the insulating layer, and the photoelectric conversion layer is defined as a Z direction and a direction away from the first electrode is defined as an X direction, a cross-sectional area of a stacked portion when the stacked portion in which the charge storage electrode, the insulating layer, and the photoelectric conversion layer are stacked is cut in a YZ virtual plane varies depending on a distance from the first electrode.

[B01]<<Stacked-Type Imaging Element>>

The stacked-type imaging element, including at least one of the imaging elements according to any one of [A01] to [A36].

[C01]<<Solid-state imaging apparatus: first aspect>>

A solid-state imaging apparatus including:

a plurality of imaging elements, in which each imaging element includes a photoelectric conversion unit formed by stacking a first electrode, a photoelectric conversion layer, and a second electrode, the photoelectric conversion unit further includes a charge storage electrode that has an opposite region opposite to the first electrode via an insulating layer, and a transfer control electrode opposite to the first electrode and the charge storage electrode via the insulating layer, and the photoelectric conversion layer is disposed above at least the charge storage electrode via the insulating layer.

[C02]<<Solid-State Imaging Apparatus: First Aspect>>

A solid-state imaging apparatus including: a plurality of imaging elements according to any one of [A01] to [A36].

[C03]<<Solid-State Imaging Apparatus: First Aspect>>

A solid-state imaging apparatus including a plurality of stacked-type imaging elements including at least one imaging element according to any one of [A01] to [A36].

[C04]<<Solid-State Imaging Apparatus: Second Aspect>>

A solid-state imaging apparatus including:

a plurality of imaging element blocks formed by a plurality of the imaging elements according to any one of [A01] to [A36], in which a first electrode is shared by the plurality of imaging elements forming the imaging element block.

[C05]<<Solid-State Imaging Apparatus: Second Aspect>>

A solid-state imaging apparatus including:

a plurality of imaging element blocks formed by a plurality of stacked-type imaging elements, in which each stacked-type imaging element includes at least one imaging element according to any one of [A01] to [A36], and a first electrode is shared by the plurality of imaging elements forming the imaging element block.

[C06] The solid-state imaging apparatus described in [C04] or [C05], in which the plurality of imaging elements is arrayed in a 2-dimensional matrix form, and the imaging element block is formed by 2×2 imaging elements.

[C07] The solid-state imaging apparatus described in [C04] or [C05], in which the plurality of imaging elements is arrayed in a 2-dimensional matrix form, and the imaging element block is formed by two diagonally adjacent imaging elements.

[C08] The solid-state imaging apparatus according to any one of [C01] to [C07], in which, in each imaging element, the transfer control electrode surrounds the charge storage electrode in a frame form, and the transfer control electrode is shared by the adjacent imaging elements.

[C09] The solid-state imaging apparatus described in any one of [C01] to [C08], in which one on-chip microlens can be disposed above one imaging element.

[C10] A solid-state imaging apparatus described in [C04] or [C05], in which the imaging element block can be formed by two imaging elements and one on-chip microlens can be disposed above the imaging element block.

[C11] The solid-state imaging apparatus according to any one of [C04] to [C10], in which one floating diffusion layer is provided for a plurality of imaging elements.

[D01]<<Method of Driving the Solid-State Imaging Apparatus>>

A method of driving the solid-state imaging apparatus including a plurality of imaging elements described in any one of [A01] to [A36], the method of driving the solid-state imaging apparatus by repeating the steps of:
  discharging charges in the first electrode out of the system while charges in the photoelectric conversion layer are stored simultaneously in all the imaging elements; and transferring the charges stored in the photoelectric conversion layers to the first electrode simultaneously in all the imaging elements and sequentially reading the charges transferred to the first electrode in each imaging element after completion of the transferring.

REFERENCE SIGNS LIST $10'_1$, $10'_2$, $10'_3$ Photoelectric conversion unit segment
13 Various imaging element constituent elements located below an interlayer insulating layer
14 On-chip microlens (OCL)
15 Light shielding layer
21 First electrode
22 Second electrode
23 Photoelectric conversion layer
23A Upper photoelectric conversion layer
23B Lower semiconductor layer
$23'_1$, $23'_2$, $23'_3$ Photoelectric conversion layer segment
24, $24''_1$, $24''_2$, $24''_3$ Charge storage electrode
24A, 24B, 24C, $24'_1$, $24'_2$, $24'_3$ Charge storage electrode segment
24a, 24b, 24c, 24d Corner of charge storage electrode
24a Opposite region
$24S_1$, $24S_2$, $24S_3$ Side of charge storage electrode
$24AR_1$ First region of charge storage electrode
$24AR_2$ Second region of charge storage electrode
25, 25', 25'' Transfer control electrode (charge transfer electrode)
$25SG_1$, $25SG_2$ Transfer control electrode segment
26 charge discharge electrode
31, 33, 41, 43 n-type semiconductor region
32, 34, 42, 44, 73 $p^+$ layer
35, 36, 45, 46 Gate section of transfer transistor
35C, 36C Region of semiconductor substrate
36A Transfer channel
51 Gate section of reset transistor $TR1_{rst}$
51A Channel forming region of reset transistor $TR1_{rst}$
51B, 51C Source/drain region of reset transistor $TR1_{rst}$
52 Gate section of amplification transistor $TR1_{amp}$
52A Channel forming region of amplification transistor $TR1_{amp}$
52B, 52C Source/drain region of amplification transistor $TR1_{amp}$
53 Gate section of select transistor $TR1_{sel}$
53A Channel forming region of select transistor $TR1_{sel}$
53B, 53C Source/drain region of select transistor $TR1_{sel}$
61 Contact hole portion
62 Wiring layer
63, 64, 68A Pad portion
65, 68B Connection hole
66, 67, 69 Connection portion
70 Semiconductor substrate
70A First surface side of the semiconductor substrate (front surface)
70B Second surface side of the semiconductor substrate (back surface)
71 Element separation region
72 Oxide film
74 $HfO_2$ film
75 Insulating material film
76, 81 Interlayer insulating layer
82 Insulating layer
$82'_1$, $82'_2$, $82'_3$ Insulating layer segment
82a First surface of insulating layer
82b Second surface of insulating layer
82c Third surface of insulating layer
83 Insulating layer
85, 85A, 85B, 85C Opening
86, 86A Second opening
100 Solid-state imaging apparatus
101 Stacked-type imaging element
111 Imaging region
112 Vertical drive circuit
113 Column signal processing circuit
114 Horizontal drive circuit
115 Output circuit
116 Drive control circuit
117 Signal line (data output line)
118 Horizontal signal line
200 Electronic device (camera)
201 Solid-state imaging apparatus
210 Optical lens
211 Shutter device
212 Drive circuit
213 Signal processing circuit
$FD_1$, $FD_2$, $FD_3$, 45C, 46C Floating diffusion layer
$TR1_{trs}$, $TR2_{trs}$, $TR3_{trs}$ Transfer transistor
$TR1_{rst}$, $TR2_{rst}$, $TR3_{rst}$ Reset transistor
$TR1_{amp}$, $TR2_{amp}$, $TR3_{amp}$ Amplification transistor
$TR1_{sel}$, $TR3_{sel}$, $TR3_{sel}$ Select transistor
$V_{DD}$ Power supply
$TG_1$, $TG_2$, $TG_3$ Transfer gate line
$RST_1$, $RST_2$, $RST_3$ Reset line
$SEL_1$, $SEL_2$, $SEL_3$ Select line
VSL, $VSL_1$, $VSL_2$, $VSL_3$ Signal line (data output line)
$V_{OA}$, $V_{OT}$, $V_{OU}$ Wiring

The invention claimed is:

1. A solid-state imaging apparatus, comprising:
a plurality of imaging element blocks, wherein
  each imaging element block of the plurality of imaging element blocks includes a plurality of imaging elements,
  each imaging element of the plurality of imaging elements includes a photoelectric conversion unit, wherein the photoelectric conversion unit includes:
    a first electrode, a photoelectric conversion layer, and a second electrode;
    a charge storage electrode that has a region, wherein the region is opposite to the first electrode via an insulating layer; and
    a transfer control electrode that is opposite to the first electrode and the charge storage electrode via the insulating layer, wherein the photoelectric conversion layer is above the charge storage electrode via the insulating layer, the first electrode is shared by the plurality of imaging elements in each imaging element block of the plurality of imaging element blocks, in each imaging element of the plurality of imaging elements, the transfer control electrode surrounds the charge storage electrode in a frame form, and the transfer control electrode is shared by adjacent imaging elements of the plurality of imaging elements.

2. The solid-state imaging apparatus according to claim 1, wherein the photoelectric conversion layer is above the charge storage electrode and the transfer control electrode via the insulating layer.

3. The solid-state imaging apparatus according to claim 1, wherein
a shape of the charge storage electrode is a rectangle,
the charge storage electrode includes a first corner, a second corner, a third corner, and a fourth corner, and
the first corner corresponds to the region.

4. The solid-state imaging apparatus according to claim 3, wherein the first corner has roundness.

5. The solid-state imaging apparatus according to claim 3, wherein the first corner is chamfered.

6. The solid-state imaging apparatus according to claim 1, wherein
the transfer control electrode includes two transfer control electrode segments,
the two transfer control electrode segments and two sides of each of a plurality of charge storage electrodes are on both sides of the region, and
the two transfer control electrode segments are adjacent to the two sides of each of the plurality of charge storage electrodes.

7. The solid-state imaging apparatus according to claim 6, wherein
the two sides of each of the plurality of charge storage electrodes are a first side and a second side,
a length of the first side is L1 and a length of a second side is L2,
a distance between the first electrode and an end of the transfer control electrode segment along the first side is in a range of 0.02×L1 to 0.5×L1, and
a distance between the first electrode and an end of the transfer control electrode segment along the second side is in a range of 0.02×L2 to 0.5×L2.

8. The solid-state imaging apparatus according to claim 1, wherein
a planar shape of the charge storage electrode is a rectangle,
the region is located to border along one side of the charge storage electrode,
the transfer control electrode includes two transfer control electrode segments, the two transfer control electrode segments include a first transfer control electrode segment and a second transfer control electrode segment,
the first transfer control electrode segment is adjacent to the region and is opposite to the first electrode and a first region of the charge storage electrode bordering along one side of the charge storage electrode via the insulating layer, and
the second transfer control electrode segment is adjacent to the region and is opposite to the first electrode and a second region of the charge storage electrode bordering along one side of the charge storage electrode via the insulating layer.

9. The solid-state imaging apparatus according to claim 1, wherein
the plurality of imaging elements is in a 2-dimensional matrix, and
each imaging element block of the plurality of imaging element blocks includes 2×2 imaging elements.

10. The solid-state imaging apparatus according to claim 1, wherein
the plurality of imaging elements is in a 2-dimensional matrix, and
each imaging element block of the plurality of imaging element blocks includes two diagonally adjacent imaging elements.

11. A solid-state imaging apparatus, comprising:
a plurality of imaging element blocks, wherein
each imaging element block of the plurality of imaging element blocks includes a plurality of stacked-type imaging elements,
each stacked-type imaging element of the plurality of stacked-type imaging elements includes at least one imaging element that includes a photoelectric conversion unit,
the photoelectric conversion unit includes:
a first electrode, a photoelectric conversion layer, and a second electrode;
a charge storage electrode that has a region, wherein the region is opposite to the first electrode via an insulating layer; and
a transfer control electrode that is opposite to the first electrode and the charge storage electrode via the insulating layer, wherein
the photoelectric conversion layer is above the charge storage electrode via the insulating layer,
the first electrode is shared by the plurality of stacked-type imaging elements in each imaging element block of the plurality of imaging element blocks,
in each imaging element of the plurality of imaging elements, the transfer control electrode surrounds the charge storage electrode in a frame form, and
the transfer control electrode is shared by adjacent imaging elements of the plurality of imaging elements.

* * * * *